(12) United States Patent
Sterling

(10) Patent No.: US 11,449,784 B2
(45) Date of Patent: Sep. 20, 2022

(54) METHOD FOR USE WITH SUPERCONDUCTING DEVICES

(71) Applicant: D-WAVE SYSTEMS INC., Burnaby (CA)

(72) Inventor: George E. G. Sterling, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 0 days.

(21) Appl. No.: 16/930,512

(22) Filed: Jul. 16, 2020

(65) Prior Publication Data

US 2021/0019646 A1    Jan. 21, 2021

Related U.S. Application Data

(63) Continuation of application No. 15/382,278, filed on Dec. 16, 2016, now Pat. No. 10,755,190.
(Continued)

(51) Int. Cl.
*H01F 7/06* (2006.01)
*G06N 10/00* (2022.01)
(Continued)

(52) U.S. Cl.
CPC ........... *G06N 10/00* (2019.01); *H01F 13/006* (2013.01); *H01F 41/048* (2013.01);
(Continued)

(58) Field of Classification Search
CPC .... H03H 3/00; H03H 7/425; H03H 2001/005; H01F 41/048; H01F 41/076;
(Continued)

(56) References Cited

U.S. PATENT DOCUMENTS

| | | |
|---|---|---|
| 3,200,368 A | 8/1965 | Stekly et al. |
| 3,582,851 A | 6/1971 | Meservey |

(Continued)

FOREIGN PATENT DOCUMENTS

| | | |
|---|---|---|
| EP | 0562708 A1 | 9/1993 |
| EP | 0424835 B1 | 8/1996 |

(Continued)

OTHER PUBLICATIONS

Milliken et al. "50 Ω characteristic impedance low-pass metal powder filters," Review of Scientific Instruments 78(2):024701, 2007, 5 pages.
(Continued)

*Primary Examiner* — Paul D Kim
(74) *Attorney, Agent, or Firm* — Cozen O'Connor

(57) ABSTRACT

In many cases after degaussing the field distribution in a magnetic material there may be regions within the magnetic material that have ordered domains that contribute a remnant field. There is the need to reduce or eliminate non-uniform fields within a volume of interest left after degaussing a magnetic shield. Degaussing coils surrounding a metal shield can be used to favorably order magnetic domains within the material to counteract the remnant fields left behind following imperfect degaussing. The remnant field value can be measured and a small current may be applied through the degaussing coils. After removing the current, the field can be measured again and a higher current may be applied again through the coils. Repeated applications of currents and field measurement will progressively order domains in the direction of the applied field, resulting in a reduction of the net field and lower field gradient across the volume of interest.

6 Claims, 35 Drawing Sheets

Related U.S. Application Data

(60) Provisional application No. 62/270,481, filed on Dec. 21, 2015.

(51) Int. Cl.

| | |
|---|---|
| H03H 3/00 | (2006.01) |
| H01F 41/04 | (2006.01) |
| H01F 13/00 | (2006.01) |
| H03H 7/42 | (2006.01) |
| H05K 1/02 | (2006.01) |
| H01F 41/076 | (2016.01) |
| H03H 1/00 | (2006.01) |
| H05K 1/16 | (2006.01) |
| H01L 39/14 | (2006.01) |
| H01L 39/02 | (2006.01) |

(52) U.S. Cl.
CPC ............ *H01F 41/076* (2016.01); *H03H 3/00* (2013.01); *H03H 7/425* (2013.01); *H05K 1/0233* (2013.01); *H01L 39/02* (2013.01); *H01L 39/14* (2013.01); *H03H 2001/005* (2013.01); *H05K 1/0245* (2013.01); *H05K 1/16* (2013.01); *H05K 2201/10287* (2013.01)

(58) Field of Classification Search
CPC ....... H01F 13/006; H01L 39/02; H01L 39/14; G06N 10/00; H05K 1/0233; H05K 1/0245; H05K 1/16; H05K 2201/10287
See application file for complete search history.

(56) References Cited

U.S. PATENT DOCUMENTS

| | | | |
|---|---|---|---|
| 3,644,987 A | 2/1972 | Scheffler et al. | |
| 3,667,033 A | 5/1972 | Davis | |
| 3,720,847 A | 3/1973 | Massar | |
| 3,807,041 A | 4/1974 | McDougall | |
| 4,409,579 A | 10/1983 | Clem | |
| 4,646,045 A | 2/1987 | Chari et al. | |
| 4,649,349 A | 3/1987 | Chiron et al. | |
| 4,755,755 A | 7/1988 | Carlson | |
| 4,942,379 A | 7/1990 | Ogawa et al. | |
| 4,963,789 A | 10/1990 | Buhler | |
| 5,066,891 A | 11/1991 | Harrold et al. | |
| 5,173,660 A | 12/1992 | Marsden | |
| 5,215,242 A | 6/1993 | Kosky et al. | |
| 5,280,241 A | 1/1994 | Ueda et al. | |
| 5,373,275 A | 12/1994 | Itoh et al. | |
| 5,466,885 A | 11/1995 | Irisawa | |
| 5,660,917 A | 8/1997 | Fujimori et al. | |
| 5,969,933 A | 10/1999 | Schultz et al. | |
| 6,069,430 A | 5/2000 | Tsunoda et al. | |
| 6,486,393 B1 | 11/2002 | Matsuba et al. | |
| 6,830,775 B1 | 12/2004 | Kawachi et al. | |
| 6,831,281 B2 | 12/2004 | Nakasuji | |
| 6,838,694 B2 | 1/2005 | Esteve et al. | |
| 6,853,185 B2 | 2/2005 | Tsukamoto et al. | |
| 7,335,909 B2 | 2/2008 | Amin et al. | |
| 7,533,068 B2 | 5/2009 | Maassen et al. | |
| 7,619,437 B2 | 11/2009 | Thom et al. | |
| 7,687,938 B2 | 3/2010 | Bunyk et al. | |
| 7,990,662 B2 | 8/2011 | Berkley et al. | |
| 8,008,991 B2 | 8/2011 | Tcaciuc et al. | |
| 8,190,548 B2 | 5/2012 | Choi | |
| 8,228,688 B2 | 7/2012 | Uchaykin et al. | |
| 8,195,598 B2 | 8/2012 | Rose et al. | |
| 8,247,799 B2 | 8/2012 | Bunyk et al. | |
| 8,279,022 B2 | 10/2012 | Thom et al. | |
| 8,346,325 B2 | 1/2013 | Thom et al. | |
| 8,355,765 B2 | 1/2013 | Uchaykin et al. | |
| 8,421,053 B2 | 4/2013 | Bunyk et al. | |
| 8,441,329 B2 | 5/2013 | Thom et al. | |
| 8,441,330 B2 | 5/2013 | Uchaykin | |
| 8,745,850 B2 | 6/2014 | Farinelli et al. | |
| 8,854,704 B2 | 10/2014 | Takahashi | |
| 9,192,085 B2 | 11/2015 | Chavez | |
| 9,231,181 B2 | 1/2016 | Thom et al. | |
| 9,465,401 B2 | 10/2016 | Uchaykin | |
| 9,913,414 B2 | 3/2018 | Sadleir | |
| 10,003,217 B2* | 6/2018 | Kuerschner | H02J 50/40 |
| 10,755,190 B2 | 8/2020 | Tcaciuc et al. | |
| 11,064,637 B2* | 7/2021 | Sterling | G01R 33/0358 |
| 2003/0218872 A1 | 11/2003 | Tsukada et al. | |
| 2004/0232912 A1 | 11/2004 | Tsukamoto et al. | |
| 2004/0234680 A1 | 11/2004 | Kawachi et al. | |
| 2006/0068993 A1 | 3/2006 | Egan | |
| 2006/0147154 A1 | 7/2006 | Thom et al. | |
| 2006/0225165 A1 | 10/2006 | Maassen et al. | |
| 2008/0176750 A1 | 7/2008 | Rose et al. | |
| 2008/0238531 A1 | 10/2008 | Harris | |
| 2009/0008632 A1 | 1/2009 | Bunyk et al. | |
| 2009/0102580 A1 | 4/2009 | Uchaykin | |
| 2009/0121215 A1 | 5/2009 | Choi | |
| 2009/0122508 A1 | 5/2009 | Uchaykin et al. | |
| 2009/0168286 A1 | 7/2009 | Berkley et al. | |
| 2011/0022820 A1 | 1/2011 | Bunyk et al. | |
| 2011/0237442 A1 | 9/2011 | Uchaykin | |

FOREIGN PATENT DOCUMENTS

| | | |
|---|---|---|
| JP | 62-105487 | 5/1987 |
| JP | 4276594 B2 | 3/2009 |
| JP | 5114796 B2 | 10/2012 |
| KR | 19990046591 A | 7/1999 |
| KR | 20030038109 A | 5/2003 |
| WO | 9609654 A1 | 3/1996 |
| WO | 02091491 A1 | 11/2002 |
| WO | 2009099972 A2 | 8/2009 |
| WO | 2009120638 A2 | 10/2009 |
| WO | 2010042735 A2 | 4/2010 |
| WO | 2013190263 A1 | 12/2013 |
| WO | 2016183213 A1 | 11/2016 |

OTHER PUBLICATIONS

Naaman et al., "On-Chip Josephson Junction Microwave Switch," Northrop Grumman Systems Corp., Baltimore, Maryland, USA, Dec. 7, 2015, 10 pages.
Altarev et al, "A magnetically shielded room with ultra low residual field and gradient," Review of Scientific Instruments 85, 075106 (2014).
Coonrod et al, "High Frequency Circuit Materials With Increased Thermal Conductivity," High Frequency Electronics, Nov. 2010.
F. Pobell, "Matter and Methods at Low Temperatures", Springer-Verlag, 2nd Edition, 1996.
Ganguli et al., "Improved thermal conductivity for chemically functionalized exfoliated graphite/epoxy composites," C A R B O N 4 6 (2 0 0 8) 8 0 6-8 1 7, Feb. 15, 2008.
Hidalgo-Tobon, "Theory of Gradient Coil Design Methods for Magnetic Resonance Imaging," Concepts in Magnetic Resonance Part A, vol. 36A(4) 223-242 (2010), Jun. 19, 2010.
Jorgenson, "Using Magnetic Shielding Materials," Electrical Design News (EDN), 83, 3, 8, p. 136-137, 1963.
Kornack et al, "A low-noise Ferrite magnetic shield," ArXiv: 0703115v2, Jul. 26, 2007.
Sancaktar et al., "Electrically Conductive Epoxy Adhesives," Polymers 2011, 3, 427-466; doi: 10.3390/polym3010427.
Schmidt, "Influence of the Kapitza resistance on the thermal conductivity of filled epoxies," Cryogenics, Jan. 1975.
Shapiro et al., "An Improved Thermal Conductivity Polyurethane Composite for a Space Borne 20KV Power Supply," IEEEAC paper #1433, Version 2, Updated Dec. 15, 2004, date retrieved Dec. 15, 2004.
Tsangaris et al., "Interfacial relaxation phenomena in particulate composites of epoxy resin with copper or iron particles," Materials Chemistry and Physics 44 (1996) 245-250.
Uchaikin et al, "Method to produce an uniform magnetic field in a dilution refrigerator," J. Phys.: Conf. Ser. 400 052038, 2012.

(56) References Cited

OTHER PUBLICATIONS

Yusoff et al., "Effect of Particle Dispersion on Thermal Conductivity of Copper Powder Filled Epoxy Composites," International Conference on Advancements of Materials and Nanotechnology 2007.
Gubser, D. U, et al., "Shielding of longitudinal magnetic fields with thin, closely spaced, concentric cylinders of high permeability material", Rev. Sci. Instrum., vol. 50, No. 6, Jun. 1979, 7 pages.
Y, Yaschuk et al., "12 Magnetic Shielding", Optical Magnetometry, Cambridge: Cambridge University Press, May 2013, pp. 132-155.

\* cited by examiner

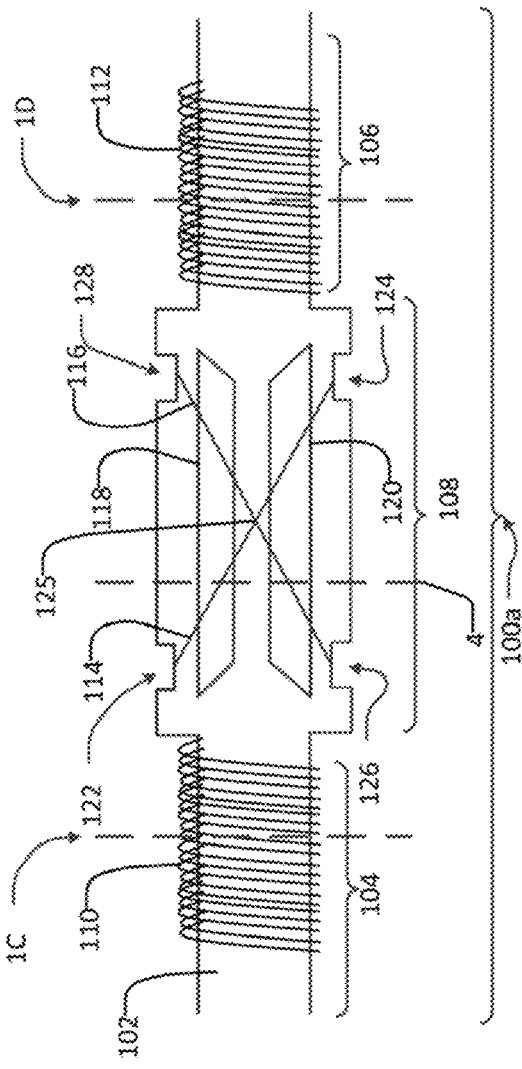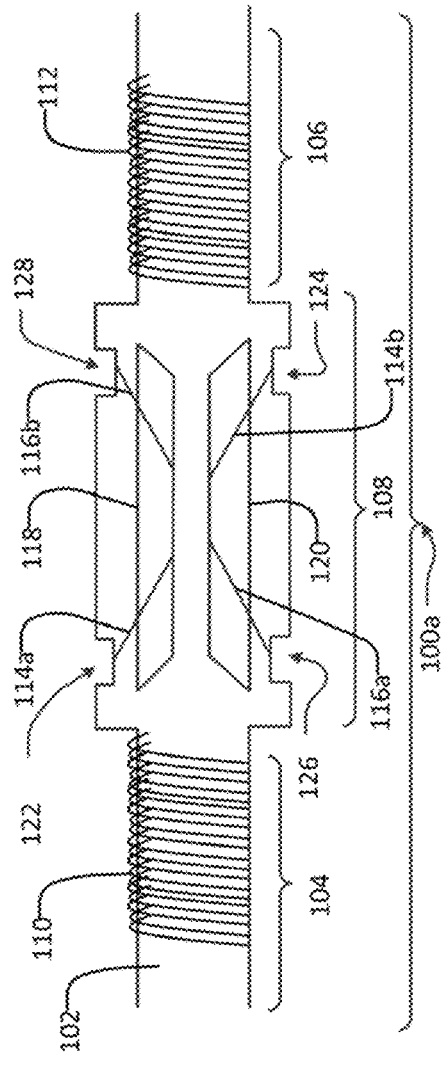

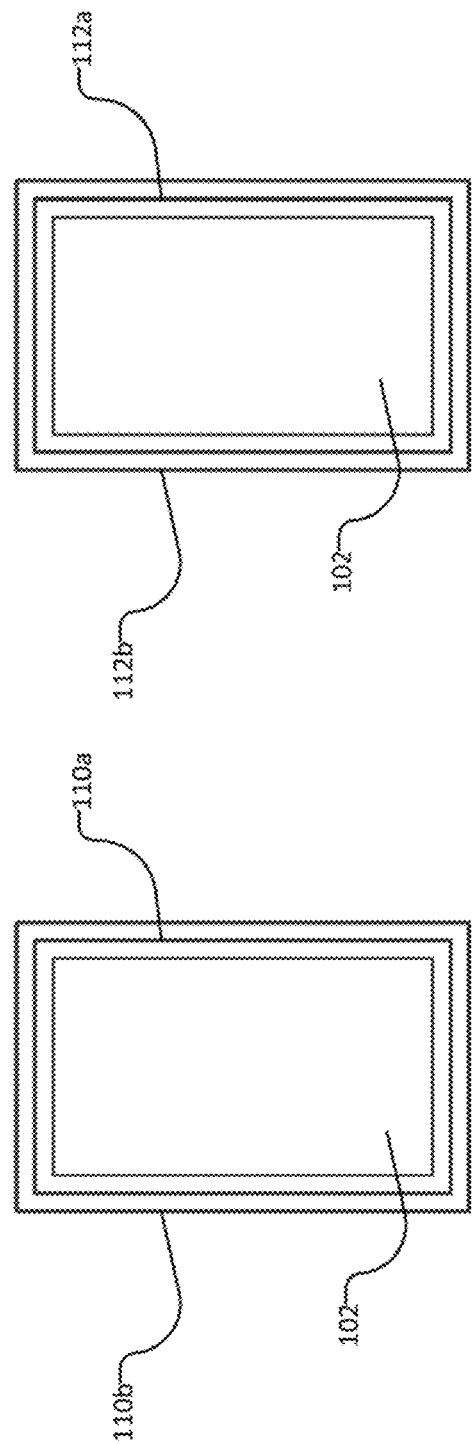

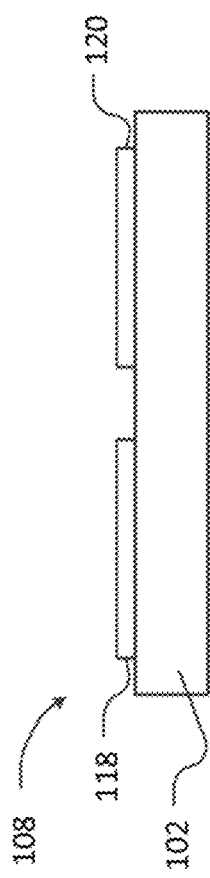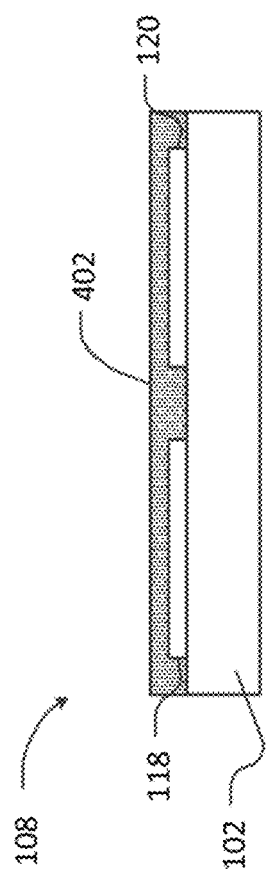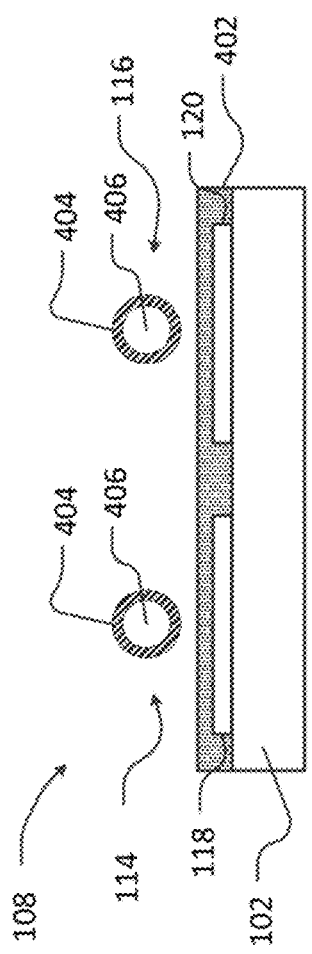

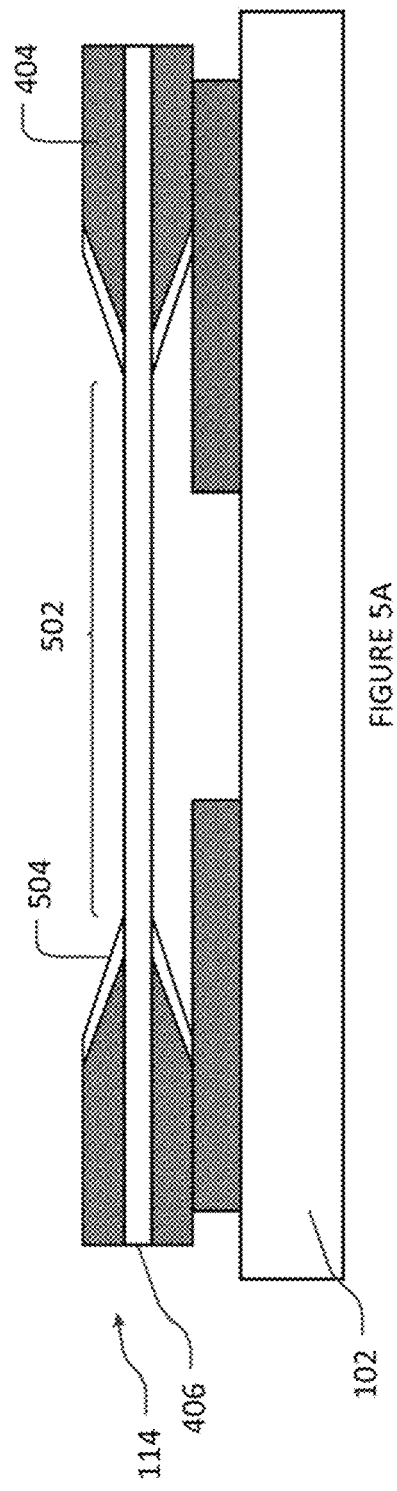
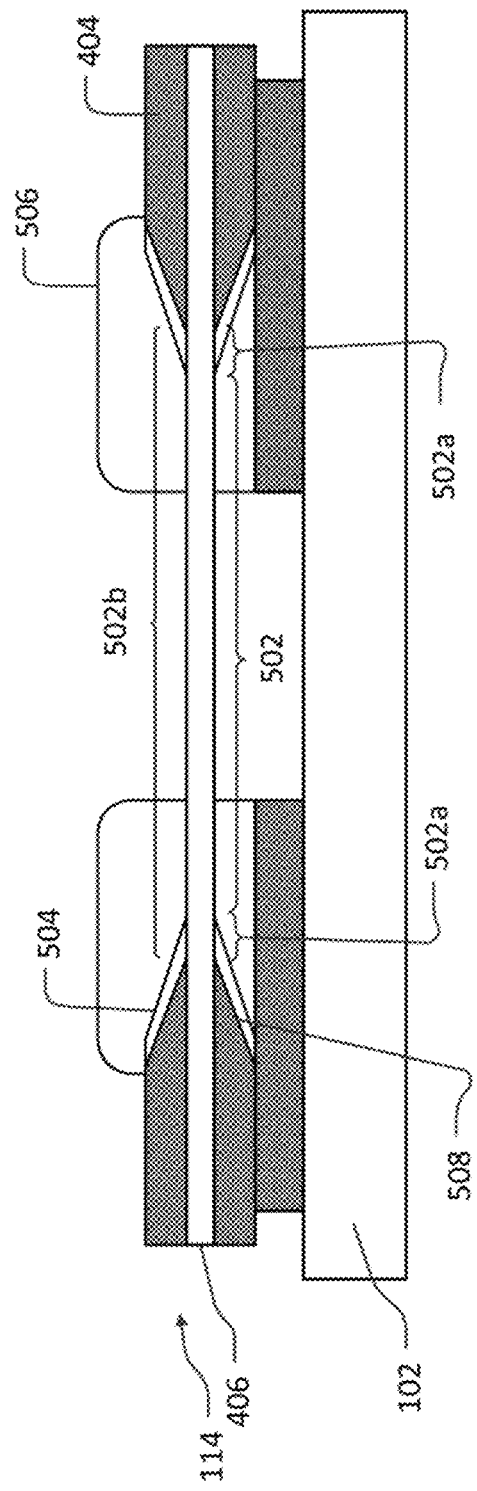

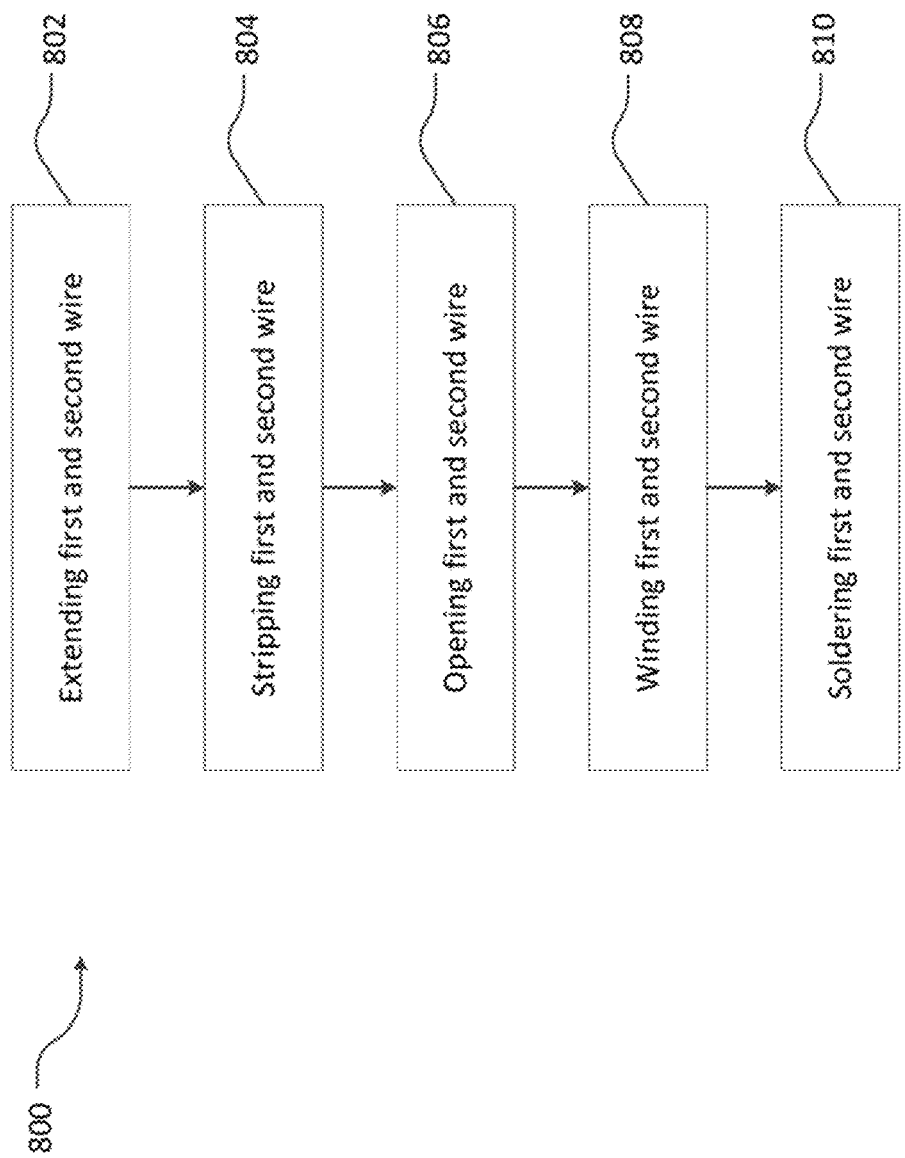

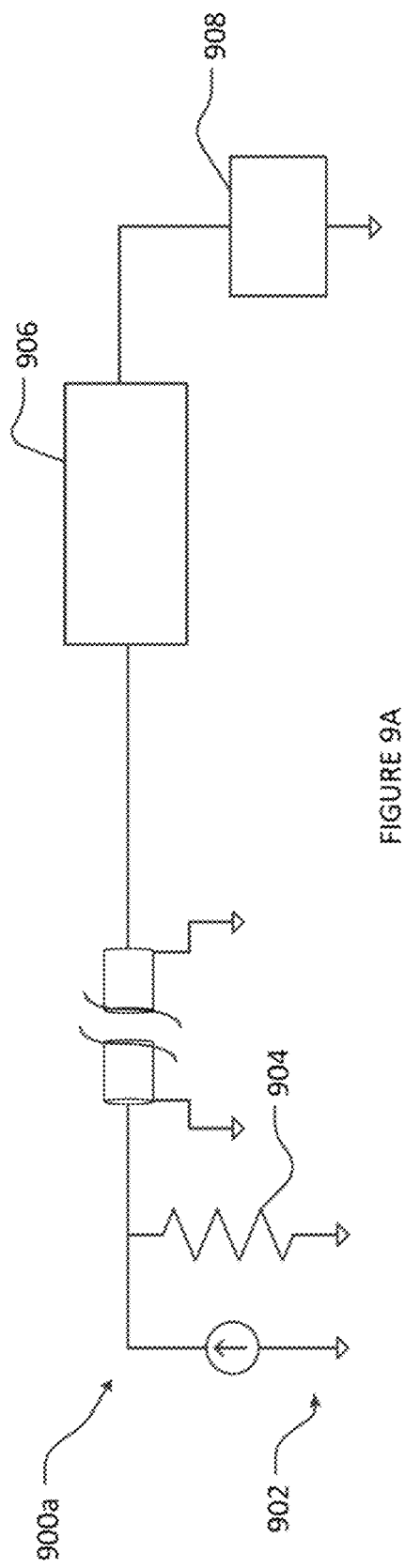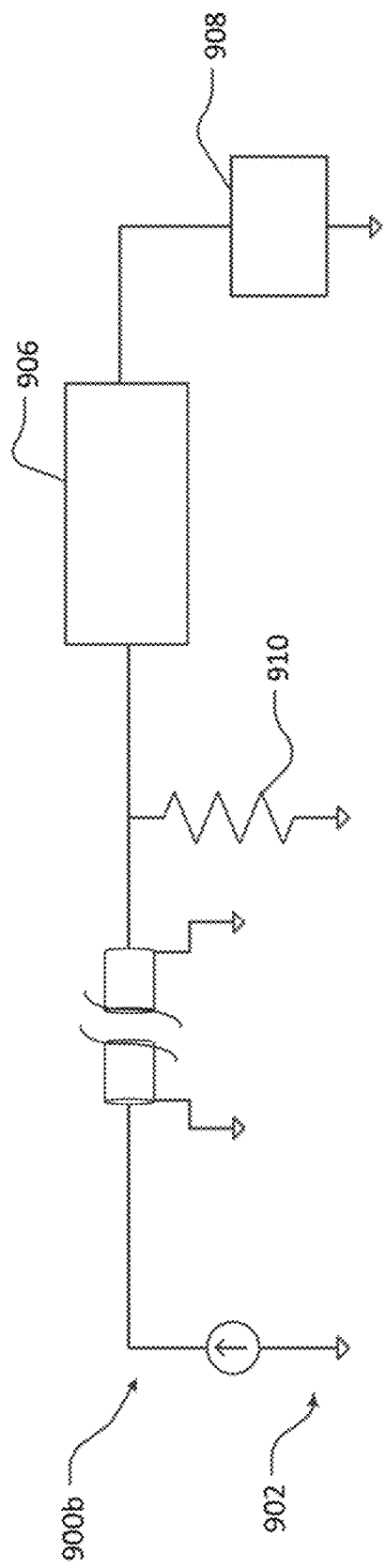

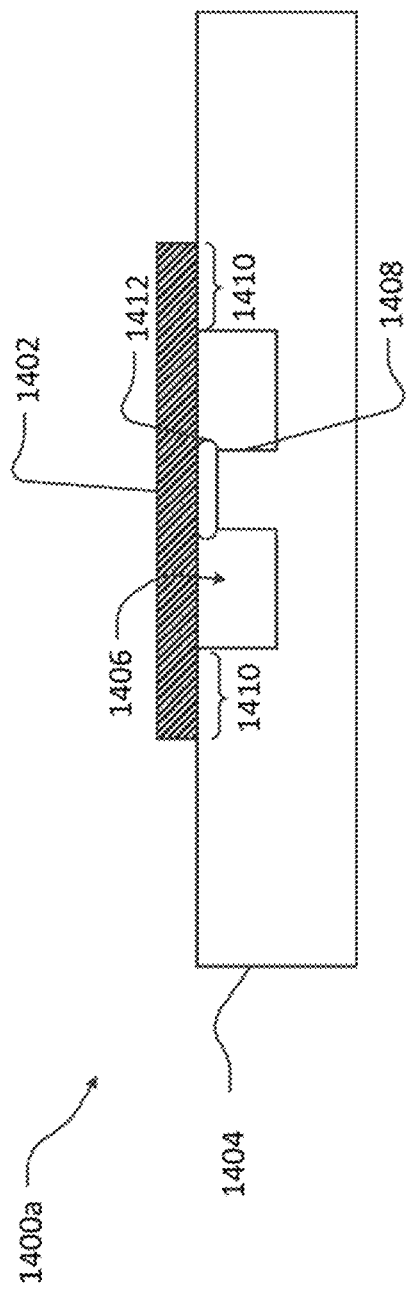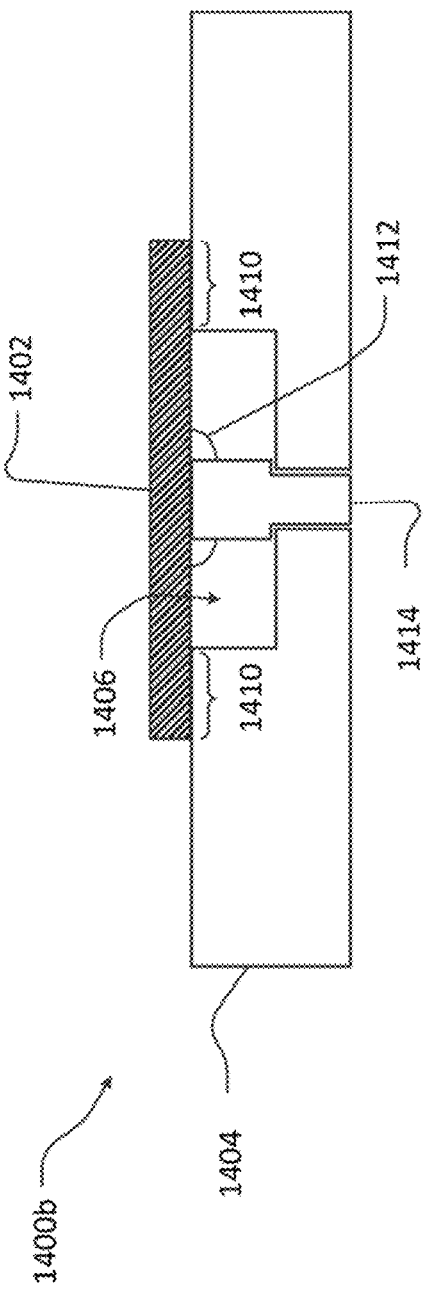

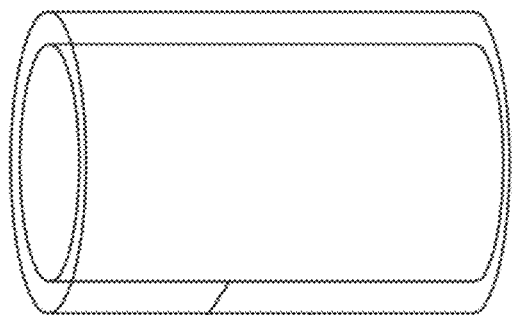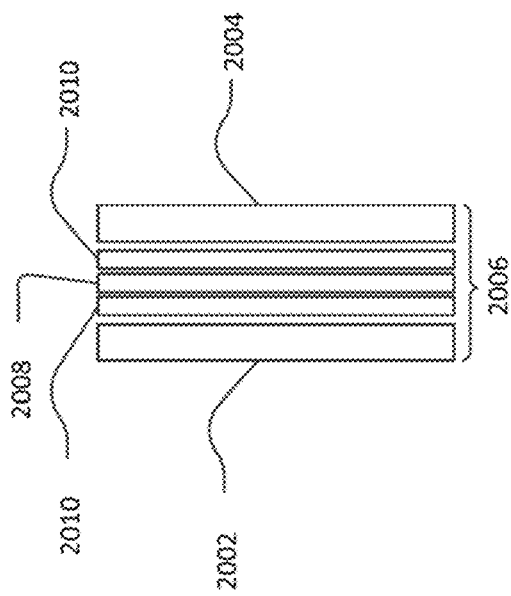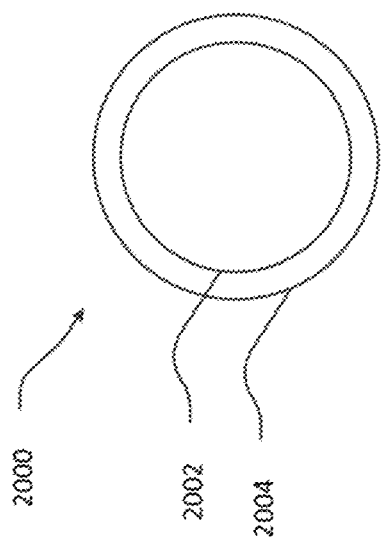
FIGURE 20B
FIGURE 20C
FIGURE 20A

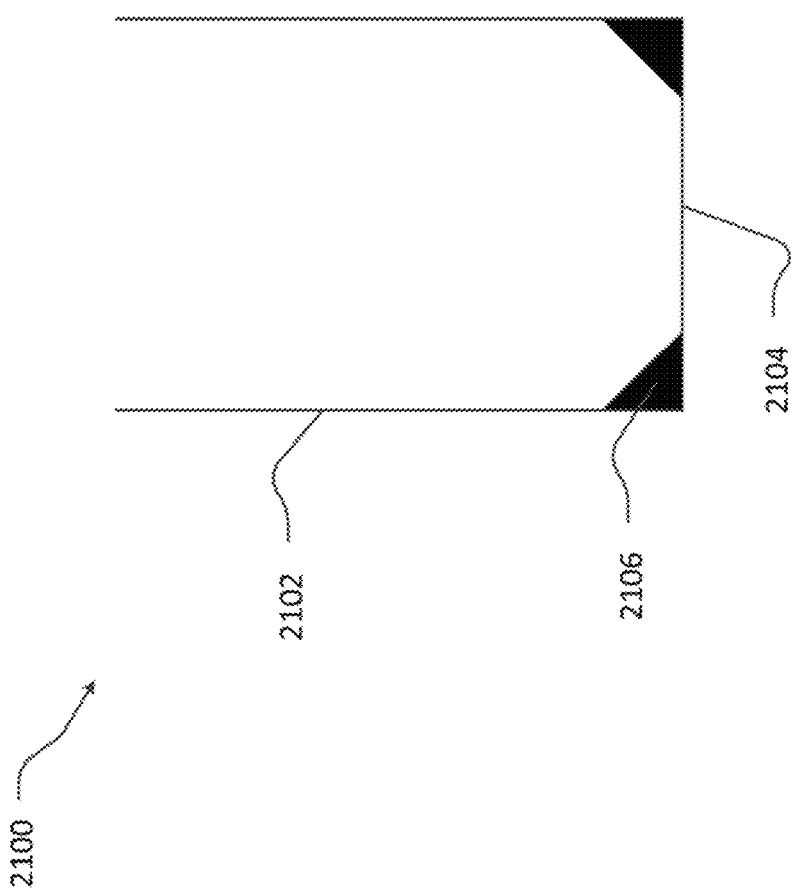

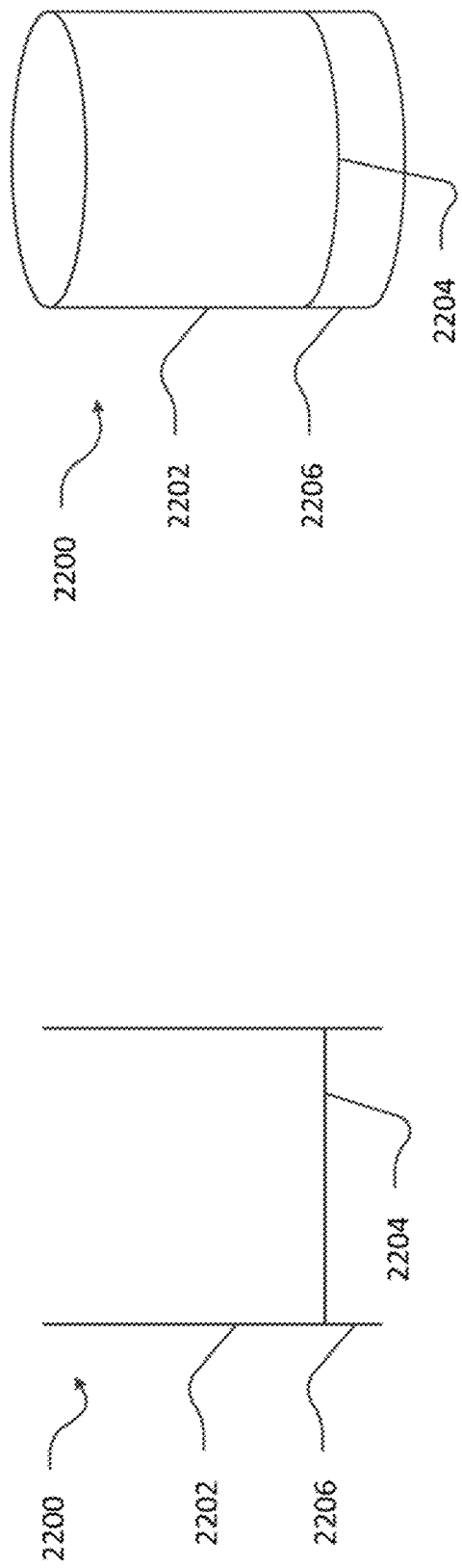
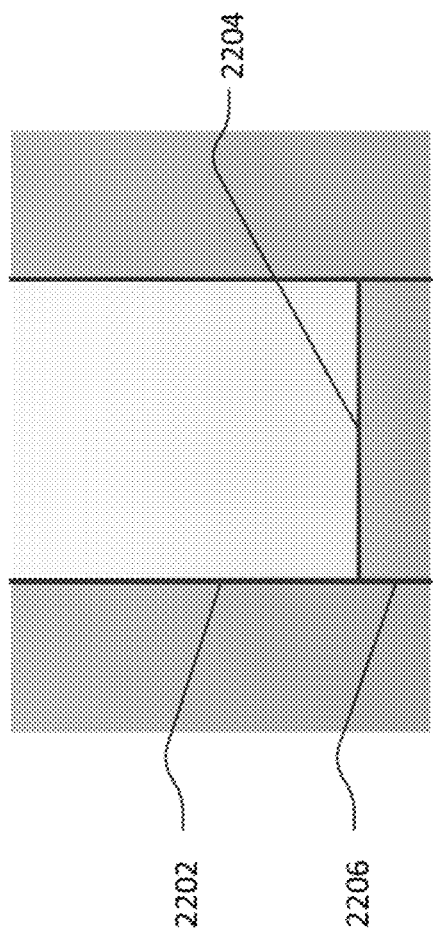

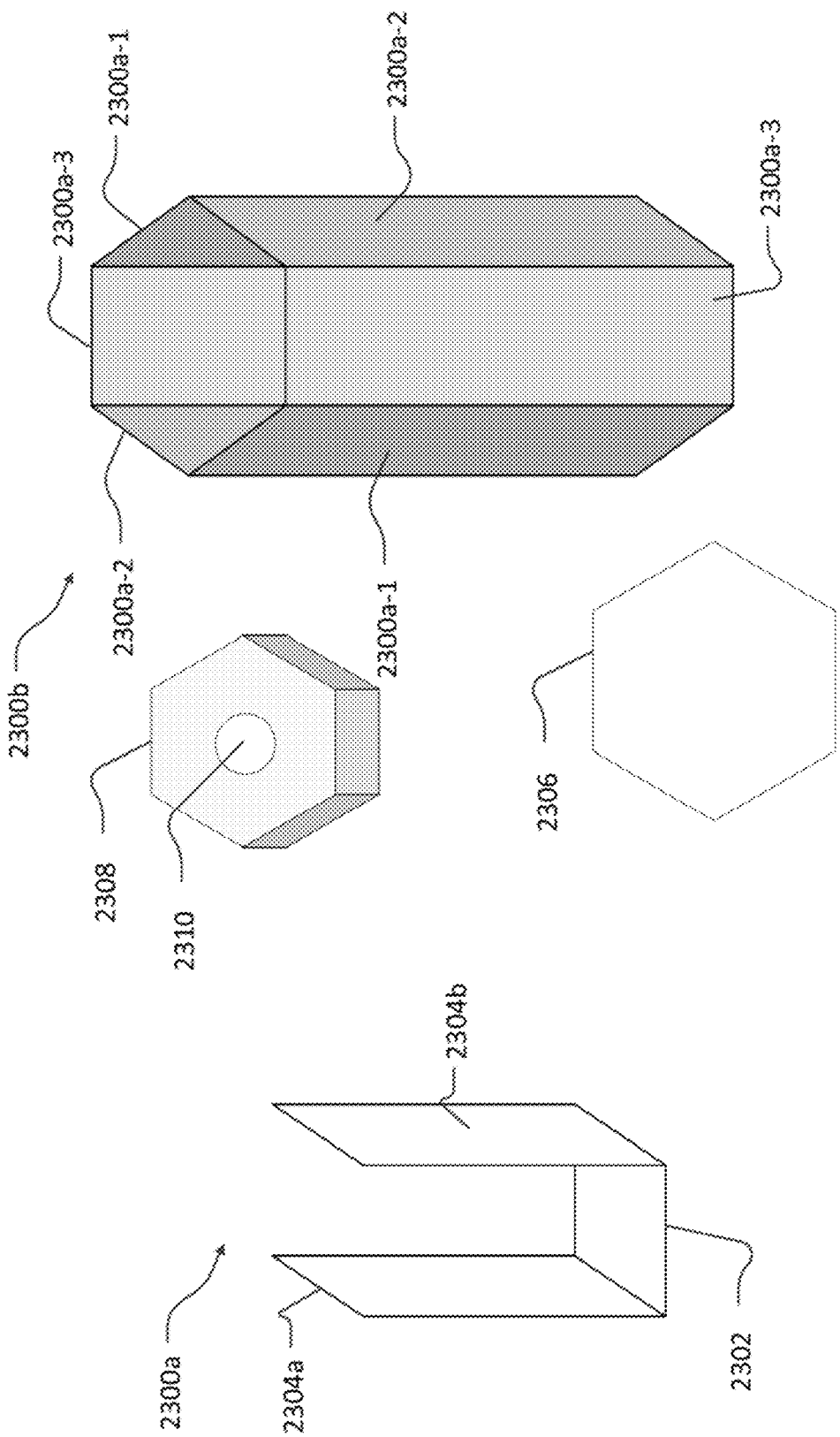

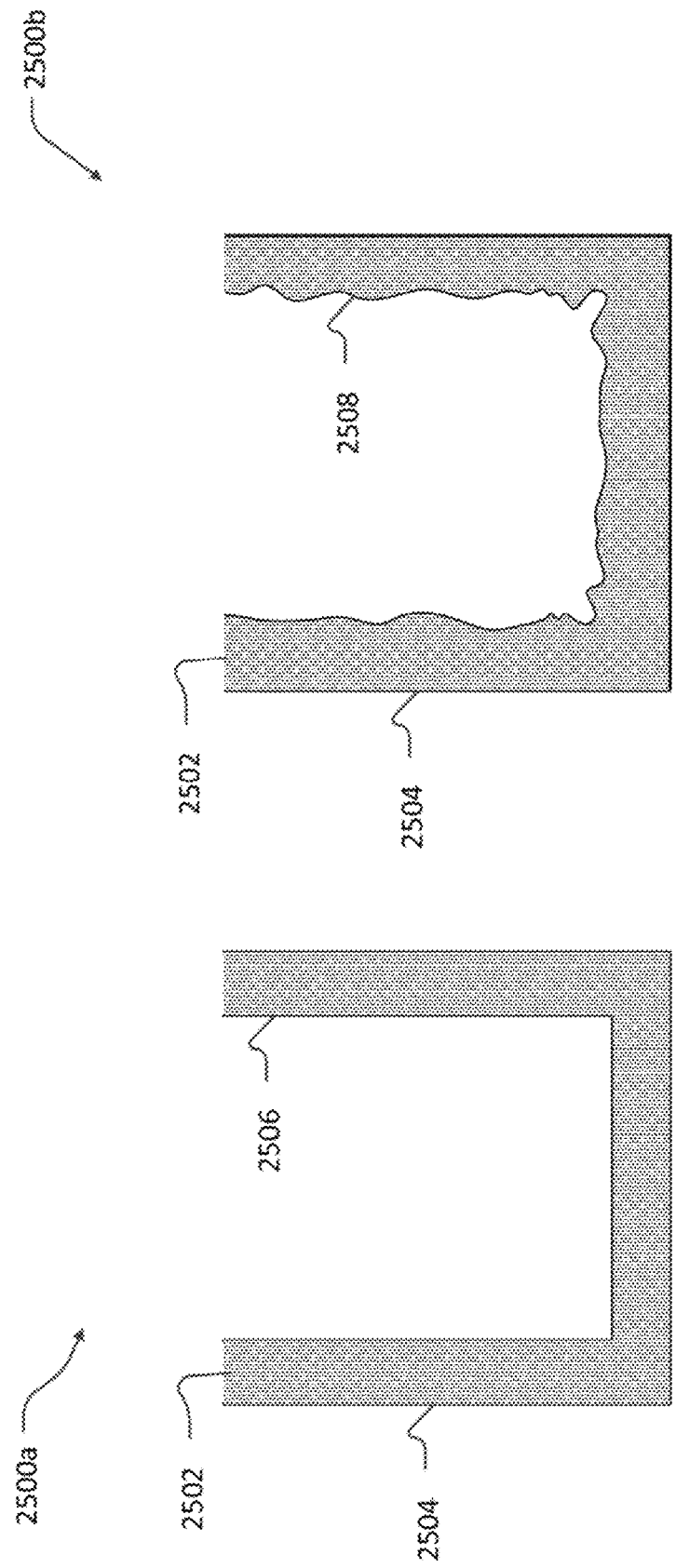

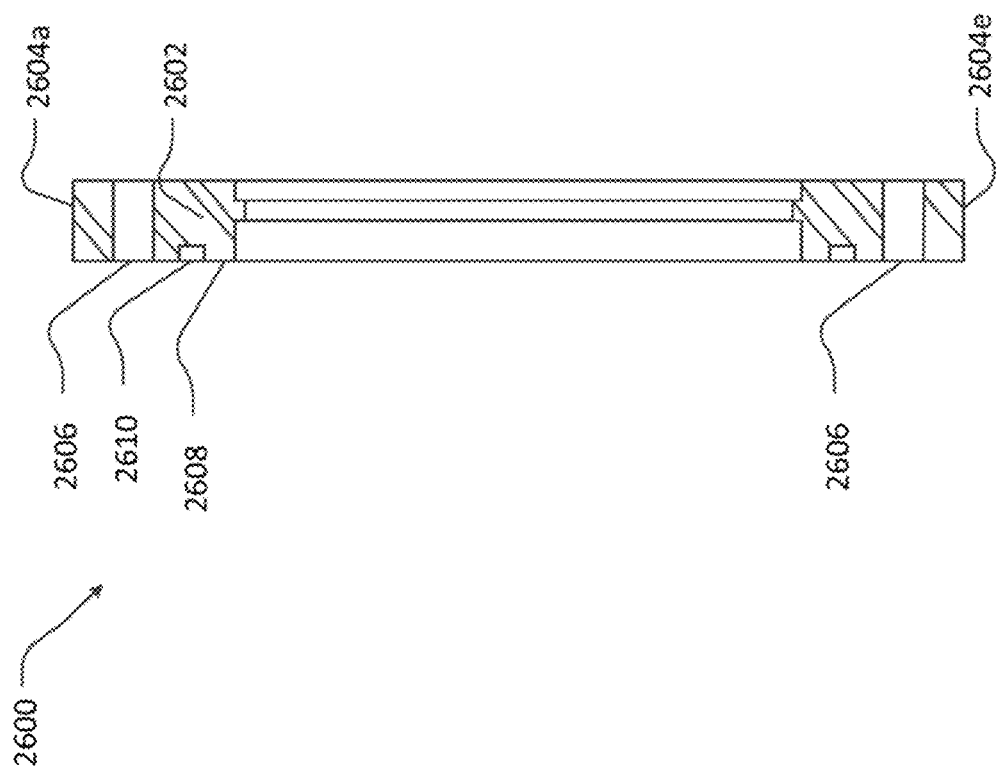

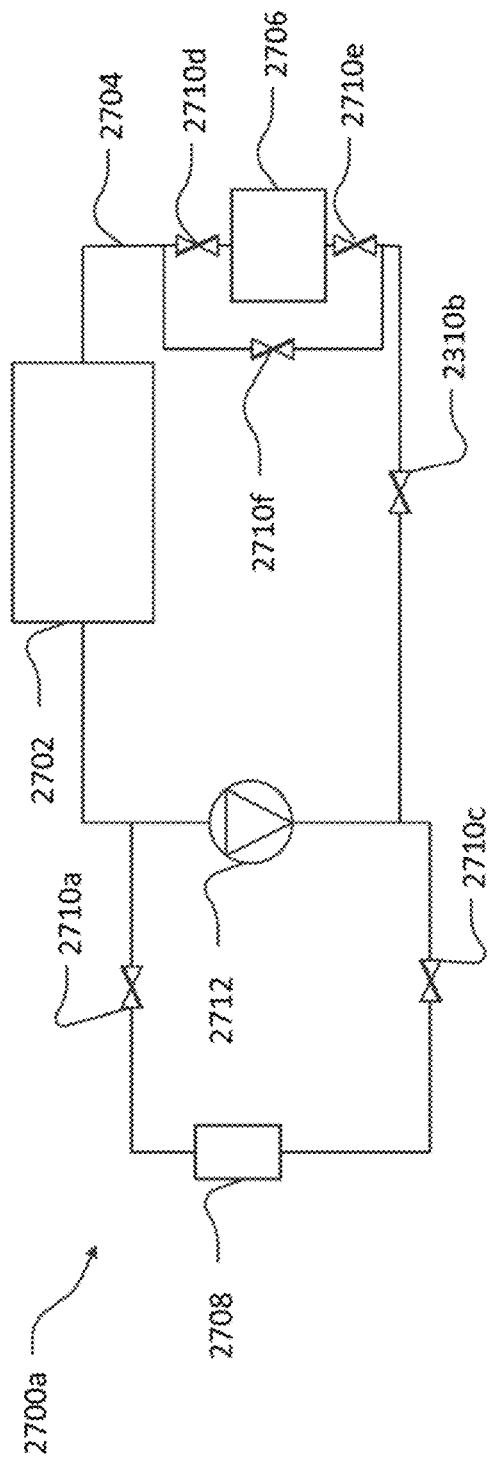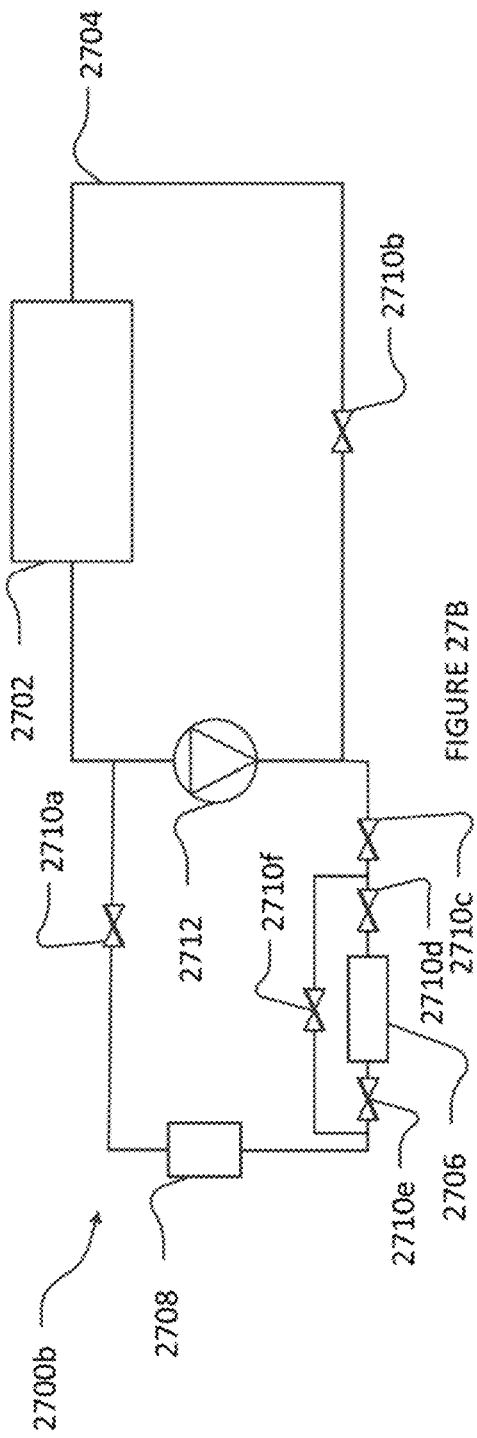
FIGURE 27A
FIGURE 27B

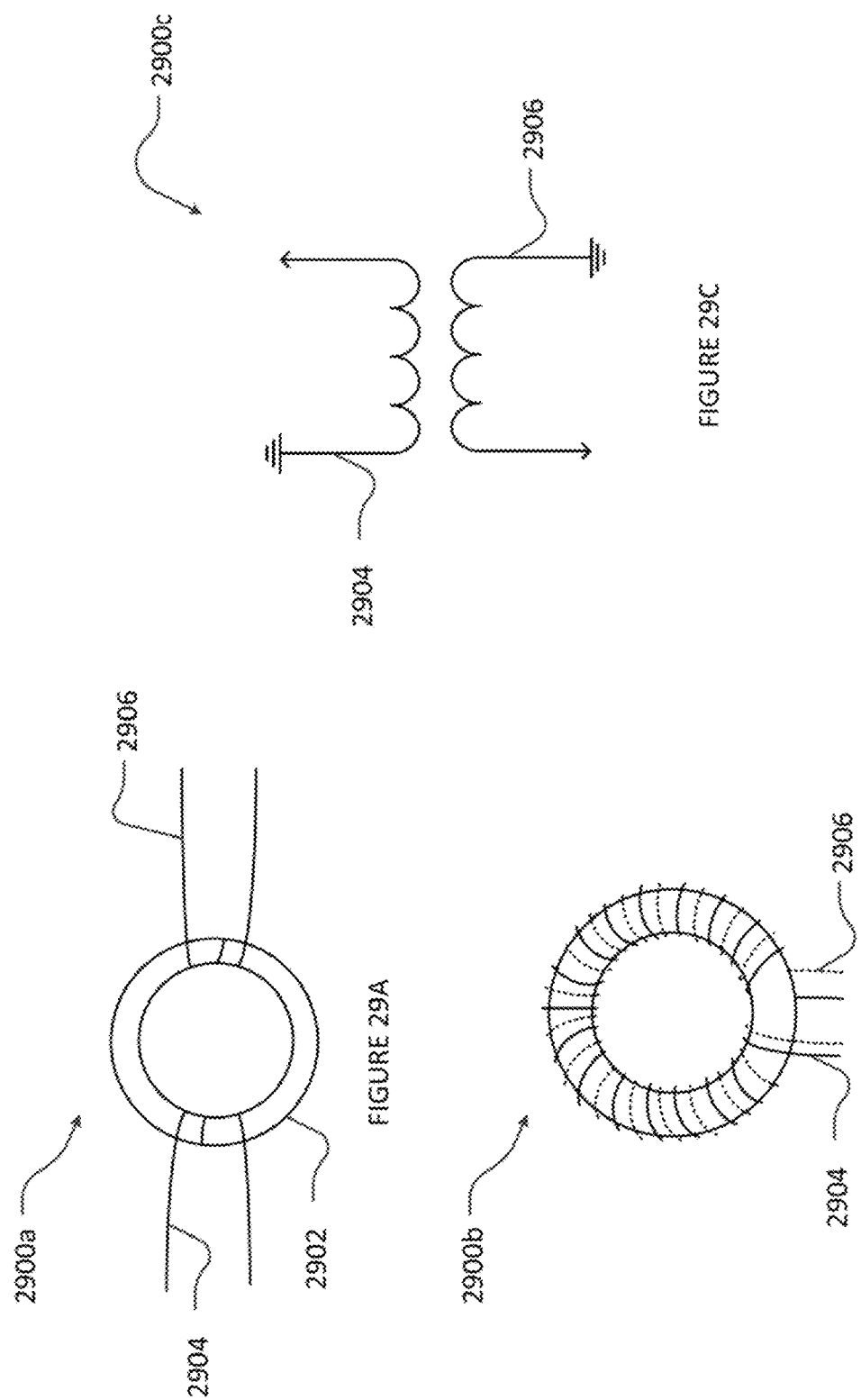

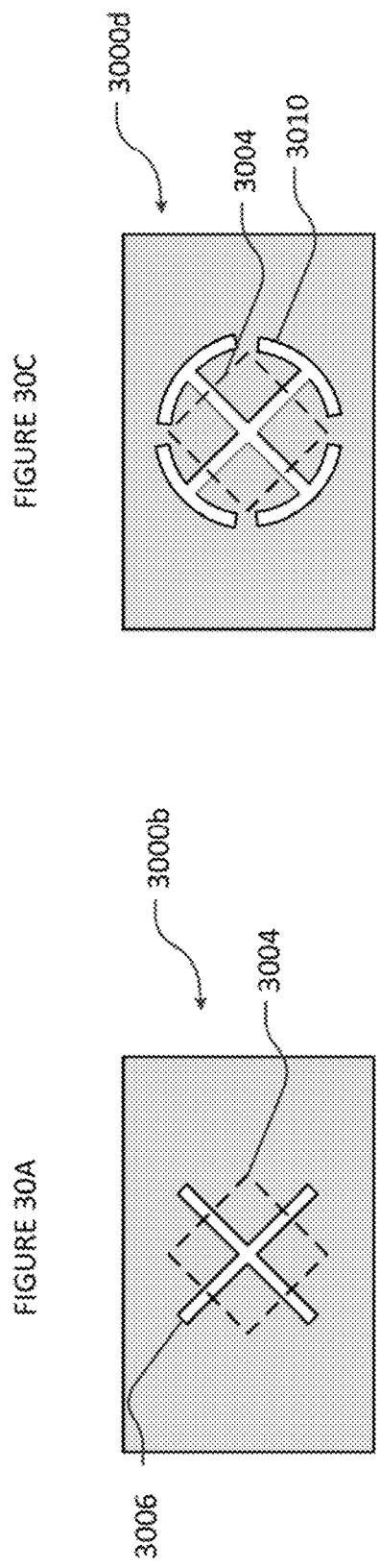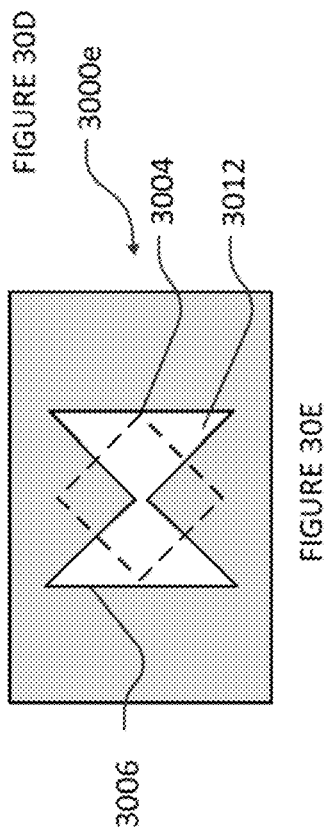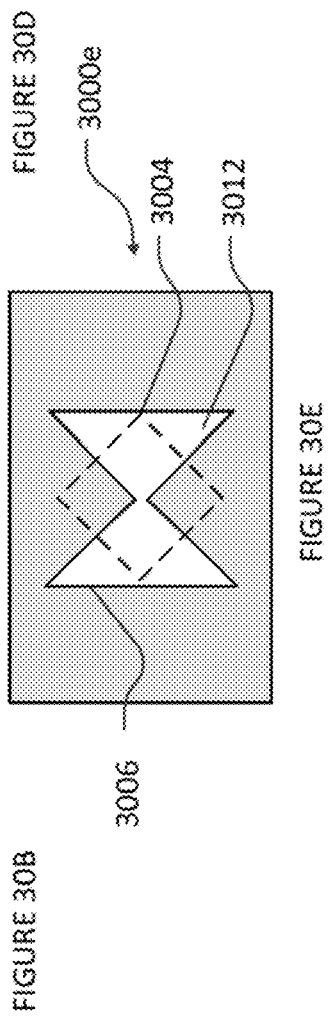

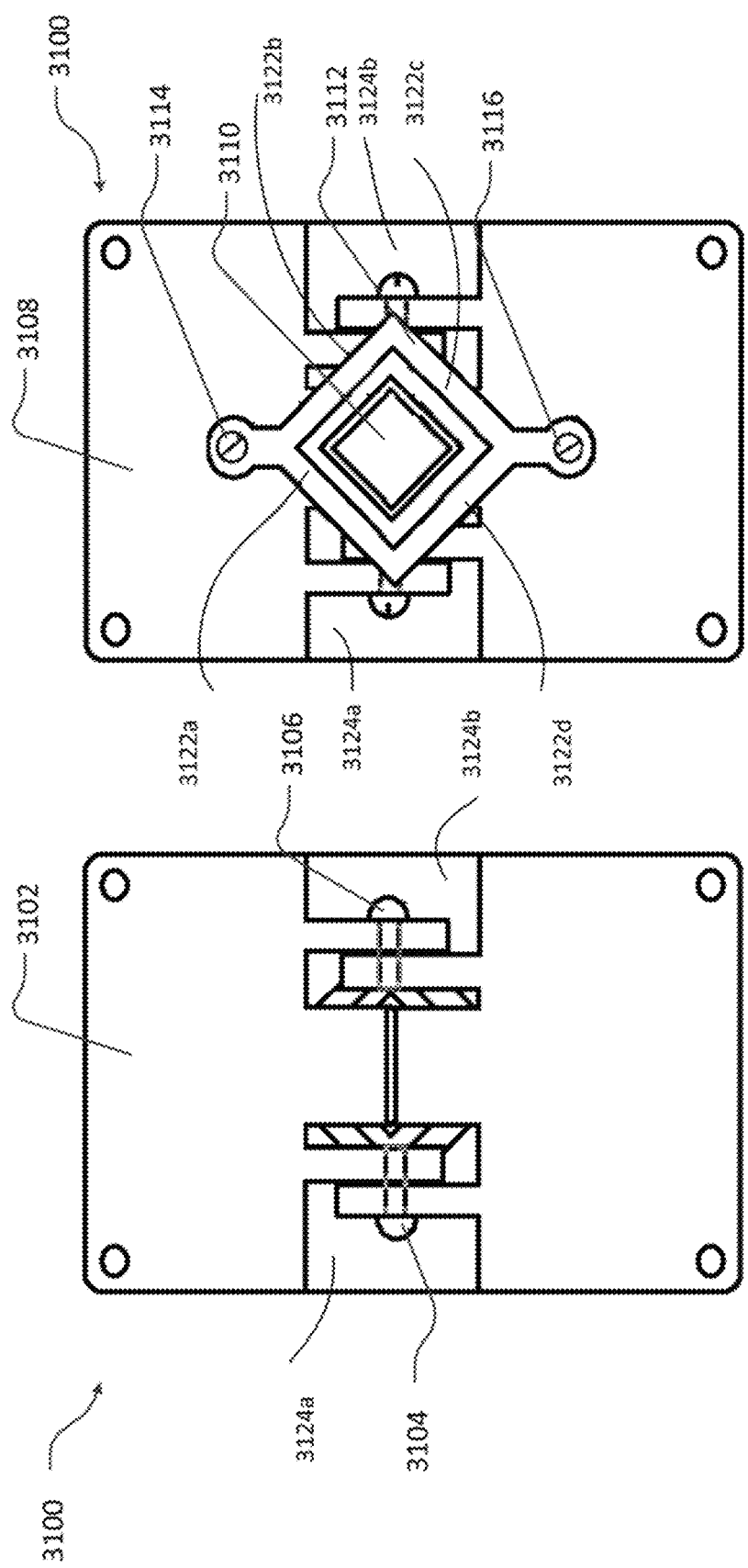

METHOD FOR USE WITH SUPERCONDUCTING DEVICES

BACKGROUND

Field

This disclosure generally relates to systems and articles for use with superconducting devices, and particularly relates to electrical filters, I/O systems, magnetic shielding and cryogenic systems for use with superconducting-based computing systems.

Superconducting Qubits

There are many different hardware and software approaches under consideration for use in quantum computers. One hardware approach employs integrated circuits formed of superconducting material, such as aluminum and/or niobium, to define superconducting qubits. Superconducting qubits can be separated into several categories depending on the physical property used to encode information. For example, superconducting qubits may be separated into charge, flux and phase devices. Charge devices store and manipulate information in the charge states of the device; flux devices store and manipulate information in a variable related to the magnetic flux through some part of the device; and phase devices store and manipulate information in a variable related to the difference in superconducting phase between two regions of the phase device.

Quantum Processor

A computer processor (i.e., hardware circuitry) may take the form of a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in U.S. Pat. Nos. 7,533,068, 8,195,596, 8,190,548, and 8,421,053.

When operating highly sensitive electronics such as superconducting qubits, coupling devices and/or readout devices, it is highly desirable to eliminate or at least reduce any noise which would otherwise adversely affect the operation of such electronics. For example, it is highly desirable to eliminate or reduce noise when operating a quantum processor that includes a number of qubits and coupling devices.

When operating superconducting components in refrigerated environments, it is highly desirable to maintain all various components at suitably low temperatures such that those components operate as superconductors or have superconducting characteristics. For example, it is highly desirable to maintain the qubits and coupling devices of a quantum processor at superconducting temperatures. It may also be highly desirable to maintain the local bias devices and/or read out devices of a quantum processor at superconducting temperatures. Also for example, it is highly desirable to maintain signal paths in an input/output (I/O) system for the superconducting quantum processor at or around superconducting temperatures. Further, it may be desirable to provide a structure that allows easy placement and removal of a superconducting processor from a refrigerated environment. Such may allow simplification of testing, analysis, and/or repair.

Maintaining superconducting temperatures may be difficult since many materials that are capable of superconducting do not provide good thermally conductive paths. Such may be particularly difficult with I/O systems since I/O systems typically interface with non-refrigerated environments. Such difficulties are compounded where the structure is also to provide for the easy placement and removal of a superconducting processor. The various embodiments discussed herein address these problems.

Superconducting Processor

A device sample may take the form of a superconducting processor, where the superconducting processor may not be a quantum processor in the traditional sense. For instance, some embodiments of a superconducting processor may not focus on quantum effects such as quantum tunneling, superposition, and entanglement, but may rather operate by emphasizing different principles, such as for example the principles that govern the operation of classical computer processors. However, there may still be certain advantages to the implementation of such superconducting processors. Due to their natural physical properties, superconducting processors in general may be capable of higher switching speeds and shorter computation times than non-superconducting processors, and therefore it may be more practical to solve certain problems on superconducting processors.

Refrigeration

Temperature is a property that can have a significant impact on the state and evolution of a physical system. For instance, environments of extreme heat can cause even the strongest and most solid materials to melt away or disperse as gas. Likewise, a system that is cooled to cryogenic temperatures may enter into a regime, condition or state where physical properties and behavior differ substantially from what is observed at room temperature. In many technologies, it can be advantageous to operate in this cryogenic regime, condition or state and harness the physical behaviors that are realized in the realm of cold. The various embodiments of the systems, methods and apparatus described herein may be used to provide and maintain the cryogenic environments necessary to take advantage of the physics at cold temperatures. According to the present state of the art, a superconducting material may generally only act as a superconductor if it is cooled below a critical temperature that is characteristic of the specific material in question. For this reason, those of skill in the art will appreciate that a computer system that implements superconducting processors may implicitly include a refrigeration system for cooling the superconducting materials in the system.

Throughout this specification and the appended claims, the term "cryogenic" is used to refer to the temperature range of 0K to about 93K. A variety of technologies may be implemented to produce an environment with cryogenic temperature, though a commonly used device that is known in the art is the helium-3-helium-4 dilution refrigerator, known as a dilution refrigerator. Dilution refrigerators can even be used to achieve extreme cryogenic temperatures below 50 mK. In the operation of a typical dilution refrigerator, the apparatus itself requires a background temperature of about 4K. In order to provide this background cooling, the apparatus may be, e.g., immersed in an evaporating bath of liquid helium-4 ($^4$He) or, e.g., coupled to another type of refrigeration device, such as a pulse-tube cryocooler. The dilution refrigerator apparatus may comprise a series of heat exchangers and chambers that allow the temperature to be lowered further to a point where a mixture of helium-3 ($^3$He) and $^4$He separates into two distinct phases. The first phase is mostly $^3$He, known as the concentrated phase, and in the second phase is mostly $^4$He with some $^3$He, known as the dilute phase. The dilution refrigerator apparatus allows some of the $^3$He to move from the concentrated phase into the dilute phase in an endothermic process analogous to evaporation, providing cooling and allowing a temperature of around 10 mK to be achieved. The $^3$He is drawn out of the dilute phase mixture through a counter-flow heat exchanger, cooled, returned to the concentrated phase portion of the mixture via the counter-flow heat exchanger to define a helium circuit. Even though the dilute phase is $^4$He rich, the $^3$He is preferentially drawn from the dilute phase because $^3$He has a higher partial pressure than $^4$He.

In most dilution refrigerator designs, mechanical pumps and compressors, and an external gas-handling system, are used to circulate $^3$He such that the $^3$He is warmed from the lowest temperature in the refrigerator up above cryogenic temperatures and towards room temperature before the $^3$He is returned to the low temperature. The pumps and compressors used are large, expensive, noisy, in need of periodic maintenance, and they inevitably add contaminants, such as air (i.e., nitrogen, oxygen, carbon dioxide, argon, etc.) to the helium. These contaminants typically have higher freezing points than the helium and so may solidify in the helium fluid channels, creating blockages. Such blockages may plug fine capillaries in the dilution refrigerator, causing problems with reliability. Plugging often requires a complete warm-up of a dilution refrigerator in order to remove the contaminants and restore the fridge to normal operations. The procedure of warming and subsequently cooling back down to operating temperatures can take several days. Filters and cold traps can be used to reduce the frequency of plugging by removing contaminants from the helium, but existing filters and traps used in the art are of limited effectiveness. Thus, plugging due to contaminants remains a serious technical challenge in cryogenic refrigeration technology affecting refrigerator performance, and there remains a need in the art for improved systems and methods for contaminant filtering and/or trapping in cryogenic refrigeration systems.

Electrical Signal Filtering

During transmission, an electrical signal typically comprises a plurality of components each transmitting at a different frequency. The "filtering" of an electrical signal typically involves the selective removal of certain frequencies from the electrical signal during transmission. Such filtering may be accomplished "passively" or "actively." A passive electrical filter is one that operates without additional power input; that is, the filtering is accomplished by the natural characteristics of the materials or devices through which the electrical signal is transmitted. Passive filters include filters that implement lumped elements such as inductors and capacitors, collectively referred to as lumped element filters (LEFs).

Simple, passive lumped element filters include low-pass and high-pass filters. A low-pass filter is one that substantially filters out higher frequencies and substantially allows lower frequencies to pass through. Conversely, a high-pass filter is one that substantially filters out lower frequencies and substantially allows higher frequencies to pass through. The concepts of low-pass and high-pass filters may be combined to produce "band-pass" filters, which effectively transmit a given range of frequencies and filter out frequencies that fall outside (above and below) of that range. Similarly, "band-stop" filters may be implemented which effectively transmit most frequencies and filter out frequencies that fall inside a given range.

Single-Ended Signaling vs. Differential Signaling

Single-ended signaling is a term used to describe a simple wiring approach whereby a varying voltage that represents a signal is transmitted using a single wire. This single-ended signal is typically referenced to an absolute reference voltage provided by a positive or negative ground or another signal somewhere in the system. For a system that necessitates the transmission of multiple signals (each on a separate signal path), the main advantage of single-ended signaling is that the number of wires required to transmit multiple signals is simply equal to the number of signals plus one for a common ground. However, single-ended signaling can be highly susceptible to noise that is picked up (during transmission) by the signal wire and/or the ground path, as well as noise that results from fluctuations in the ground voltage level throughout the system. In single-ended signaling, the signal that is ultimately received and utilized by a receiving circuit is equal to the difference between the signal voltage and the ground or reference voltage at the receiving circuit. Thus, any fluctuations in the signal and/or reference voltage that occur between sending and receiving the signal can result in a discrepancy between the signal that enters the signal wire and the signal that is received by the receiving circuit.

Differential signaling is a term used to describe a wiring approach whereby a data signal is transmitted using two complementary electrical signals propagated through two separate wires. A first wire carries a varying voltage (and/or current) that represents the data signal and a second wire carries a complementary signal that may be equal and opposite to the data signal. The complementary signal in the second wire is typically used as the particular reference voltage for each differential signal, as opposed to an absolute reference voltage throughout the system. In single-ended signaling, a single ground is typically used as a common signal return path. In differential signaling, a single ground may also be provided as a common return path for both the first wire and the second wire, although because the two signals are substantially equal and opposite they may cancel each other out in the return path.

Differential signaling has the advantage that it is less susceptible to noise that is picked up during signal transmission and it does not rely on a constant absolute reference voltage. In differential signaling, the signal that is ultimately received and utilized by a receiving circuit is equal to the difference between the data signal voltage (and/or current) carried by the first wire and the complementary signal voltage (and/or current) carried by the second wire. There is no absolute ground reference voltage. Thus, if the first wire and the second wire are maintained in close physical proximity throughout the signal transmission, any noise coupled to the data signal is likely also to couple to the reference signal and therefore any such noise may be canceled out in the receiving circuit. Furthermore, because the data signal and the complementary signal are, typically, roughly equal in magnitude but opposite in sign, the signal that is ultimately received and utilized by the receiving circuit may be approximately twice the magnitude of the data signal alone. These effects can help to allow differential signaling to realize a higher signal-to-noise ratio than single-ended signaling. The main disadvantage of differential signaling is that it uses approximately twice as many wires as single-ended signaling. However, in some applications this disadvantage is more than compensated by the improved signal-to-noise ratio of differential signaling.

One component of differential filters are two pairs of inductors which effectively form one pair of equal inductors with large gains in used wire length. The length of the wires is proportional to the signal attenuation, so that longer wires produce higher attenuation of signals. The wires are cladded with resistive material to provide significantly increased attenuation in high frequency regions.

As previously discussed in U.S. Pat. No. 9,231,181, differential filters placed in cylindrical enclosures, tubes used as common ground, and every inductor in an inner-outer pair has a stray capacitance to the wall of the enclosure, so that the stray capacitance of the top and bottom inductors are different. The inner inductor will have significantly lower stray capacitance before it is shielded from the wall of the enclosure by the outer inductor, causing an increased ripple in pass-band filtering, thus decreasing the effectiveness of the filter. To attenuate this effect, pairs of inductors are cut and reconnected so that they are each made of one inner coil and one identical outer coil, as discussed in U.S. Pat. No. 9,231,181. However, it is desirable to create superconductive connections at the area of cutting and soldering, even if the wires are clad in high resistivity material.

Integrated Circuit Fabrication

Superconducting integrated circuits are often fabricated with tools that are traditionally used to fabricate semiconductor chips or integrated circuits. Due to issues unique to superconducting circuits, not all semiconductor processes and techniques are necessarily transferable to superconductor chip manufacture. Transforming semiconductor processes and techniques for use in superconductor chip and circuit fabrication often requires changes and fine adjustments. Such changes and adjustments typically are not obvious and may require a great deal of experimentation.

Any impurities within superconducting chips may result in noise which can compromise or degrade the functionality of the individual devices, such as superconducting qubits, and of the superconducting chip as a whole. Since noise is a serious concern to the operation of quantum computers, measures should be taken to reduce dielectric noise wherever possible.

Etching

Etching removes layers of, for example, substrates, dielectric layers, oxide layers, electrically insulating layers and/or metal layers according to desired patterns delineated by photoresists or other masking techniques. Two exemplary etching techniques are wet chemical etching and dry chemical etching.

Wet chemical etching or "wet etching" is typically accomplished by submerging a wafer in a corrosive bath such as an acid bath. In general, etching solutions are housed in polypropylene, temperature-controlled baths. The baths are usually equipped with either a ring-type plenum exhaust ventilation or a slotted exhaust at the rear of the etch station. Vertical laminar-flow hoods are typically used to supply uniformly-filtered, particulate-free air to the top surface of the etch baths.

Dry chemical etching or "dry etching" is commonly employed due to its ability to better control the etching process and reduce contamination levels. Dry etching effectively etches desired layers through the use of gases, either by chemical reaction such as using a chemically reactive gas or through physical bombardment, such as plasma etching, using, for example, argon atoms.

Plasma etching systems have been developed that can effectively etch, for example, silicon, silicon dioxide, silicon nitride, aluminum, tantalum, tantalum compounds, chromium, tungsten, gold, and many other materials. Two types of plasma etching reactor systems are in common use—the barrel reactor system and the parallel plate reactor system. Both reactor types operate on the same principles and vary primarily in configuration only. The typical reactor consists of a vacuum reactor chamber made usually of aluminum, glass, or quartz. A radiofrequency or microwave energy source (referred to collectively as RF energy source) is used to activate fluorine-based or chlorine-based gases which act as etchants. Wafers are loaded into the chamber, a pump evacuates the chamber, and the reagent gas is introduced. The RF energy ionizes the gas and forms the etching plasma, which reacts with the wafers to form volatile products which are pumped away.

Physical etching processes employ physical bombardment. For instance, argon gas atoms may be used to physically bombard a layer to be etched, and a vacuum pump system is used to remove dislocated material. Sputter etching is one physical technique involving ion impact and energy transfer. The wafer to be etched is attached to a negative electrode, or "target," in a glow-discharge circuit. Positive argon ions bombard the wafer surface, resulting in the dislocation of the surface atoms. Power is provided by an RF energy source. Ion beam etching and milling are physical etching processes which use a beam of low-energy ions to dislodge material. The ion beam is extracted from an ionized gas (e.g., argon or argon/oxygen) or plasma, created by an electrical discharge.

Reactive ion etching (RIE) is a combination of chemical and physical etching. During RIE, a wafer is placed in a chamber with an atmosphere of chemically reactive gas (e.g., $CF_4$, $CCl_4$, $CHF_3$, and many other gases) at a low pressure. An electrical discharge creates an ion plasma with an energy of a few hundred electron volts. The ions strike the wafer surface vertically, where they react to form volatile species that are removed by the low pressure in-line vacuum system.

Shielding and Noise

Magnetic fields produced by external sources may cause unwanted interactions with devices in the integrated circuit. Accordingly, there may be a need for a superconducting shield proximate to devices populating the integrated circuit to reduce the strength of interference such as magnetic and electrical fields.

Superconducting shielding incorporated into an integrated circuit can be used to protect superconducting quantum interference device (SQUID) packages from DC and AC noise, such as magnetic and electrical fields, that would otherwise interfere with operation of the integrated circuit. Regions of the integrated circuit can be unshielded to allow for communication between magnetic and electrical fields external to the SQUID package. An example of this approach is discussed in U.S. Pat. No. 5,173,660.

Superconducting shielding layers may be used in single flux quantum (SFQ) or rapid single flux quantum (RSFQ) technology to separate devices from DC power lines that could otherwise undesirably bias the devices. The devices populate the integrated circuit but are separated from the DC power lines by placing a ground plane between the devices and the DC power line.

In SFQ circuits, ground planes and shielding layers are terminologies used interchangeably. A ground plane in SFQ integrated circuit is a layer of metal that appears to most signals within the circuit as an infinite ground potential. The ground plane helps to reduce noise within the integrated circuit but may be used to ensure that all components within the SFQ integrated circuits have a common potential to compare voltage signals. Contacts can be used between wiring layers and a ground plane throughout SFQ circuitry.

Supercurrent flowing in superconducting wires has an associated magnetic field in the same manner as electrons flowing in normal metal wires. Magnetic fields can couple inductively to superconducting wires, inducing currents to flow. Quantum information processing with superconducting integrated circuits necessarily involves supercurrents moving in wires, and hence associated magnetic fields.

The quantum properties of quantum devices are very sensitive to noise, and stray magnetic fields in superconducting quantum devices can negatively impact the quantum information processing properties of such circuits. Superconducting ground planes have been used in the art to reduce cross-talk between control lines and devices. However, such approaches have only been used in superconducting integrated circuits for classical processing and sensor applications, which are relatively robust against in-circuit noise and operate at significantly higher temperatures as compared with superconducting quantum processing integrated circuits.

In superconducting quantum processing integrated circuits, it is desirable to substantially attenuate and control unwanted cross-talk between devices, otherwise quantum information processing at commercial scales may not be possible. The present methods, systems and apparatus provide techniques for attenuating cross-talk in superconducting quantum processing integrated circuits between quantum devices in order to support the desired quantum effects and controllably couple quantum devices in a manner that permits exchange of coherent quantum information.

BRIEF SUMMARY

A method of fabricating an electrical filter for use with differential signals may be summarized as including: winding a first length of wire about a first region of a dielectric substrate, to form a first inner coil of wire, wherein the first length of wire includes a first wire core and a first resistive cladding; winding the first length of wire about a second region of the dielectric substrate, to form a second inner coil of wire, wherein the first and the second regions of the dielectric substrate are separated by a switching region of the dielectric substrate; winding a second length of wire around the first inner coil of wire, to form a first outer coil of wire, wherein the second length of wire includes a second wire core and a second resistive cladding; winding the second length of wire around the second inner coil of wire, to form a second outer coil of wire; exposing a portion of the first and the second wire core in the switching region by removing a first portion of the first and the second resistive cladding, respectively, and tapering a second portion of the first and the second resistive cladding on each side of the first portion of the first and the second wire cladding, respectively; soldering the first and the second lengths of wire to each of a first and a second conductive trace in the switching region to form a solder joint, wherein the solder joint overlies the exposed portion of the first and the second wire core, and overlies the tapered portion of the first and the second cladding, and wherein the solder joint electrically couples the first and the second wire cores to the first and the second conductive traces, and mechanically couples the first and the second lengths of wire to the switching region; and cutting each of the first and the second lengths of wire between the first and the second conductive trace, to form a first conductive signal path including the first inner coil of wire and the second outer coil of wire, and a second conductive signal path including the first outer coil of wire and the second inner coil of wire.

Winding a first length of wire about a first region of a dielectric substrate may include winding a first length of continuous superconductive wire about a first region of a dielectric substrate, the first length of continuous superconductive wire including a core material that is superconducting below a first critical temperature, and wherein winding a second length of wire about a first region of the dielectric substrate may include winding a second length of continuous superconductive wire about a first region of the dielectric substrate, the second length of continuous superconductive wire including a core material that is superconducting below a second critical temperature. Exposing a portion of the first and the second wire core in the switching region by removing a first portion of the first and the second resistive cladding, respectively, and tapering a second portion of the first and the second resistive cladding on each side of the first portion of the first and the second wire resistive cladding, respectively, may include applying an etchant to a portion of the first and the second lengths of wire. The method may further include: heating the switching region to cause the etchant to corrode the first and the second resistive claddings. The method may further include: applying a protective mask to the first and the second conductive traces to protect the first and the second conductive traces from the etchant, wherein soldering the first and the second lengths of wire to each of a first and a second conductive trace in the switching region to form a solder joint may include removing the protective mask from the first and the second conductive traces. Applying an etchant to a portion of the first and the second lengths of wire may include applying ferric chloride to a portion of the first and the second lengths of wire. Winding a first length of wire about a first or a second region of a dielectric substrate, to form a first or a second inner coil of wire, respectively, may include winding a first number of turns in the first length of wire, and winding a second length of continuous wire about a first or a second region of a dielectric substrate, to form a first or a second outer coil of wire, respectively, may include winding a second number of turns in the second length of wire, wherein the second number of turns may be less than or equal to the first number of turns. Winding a first length of wire about a first region of a dielectric substrate, to form a first inner coil of wire may include winding a first length of wire in a first direction about the dielectric substrate, and winding a second length of wire about a first region of a dielectric substrate, to form a first outer coil of wire may include winding a second length of wire in a second direction about the dielectric substrate, wherein the first direction may be the same as the second direction. Winding a first and a second length of wire may include winding a first and a second length of wire each with respective niobium-titanium wire cores, and copper-nickel claddings.

An apparatus to thermally couple a superconductive device to a metal carrier may be summarized as including: a through-hole at least approximately centrally located in the metal carrier, wherein the underside of the superconductive device is positioned on the upper surface of the metal carrier to overlie the though-hole; a first clamp applied to the top side of the superconductive device; a vacuum pump, wherein the vacuum pump applies a vacuum to the underside of the superconductive device from the lower surface of the metal carrier via the through-hole.

The apparatus may further include: a printed circuit board positioned to overlie the metal carrier, the printed circuit board including a cavity to host the superconductive device; and a second clamp applied to the printed circuit board and surrounding the superconductive device. The first clamp may include a clamp selected from the group consisting of a gold-plated copper clamp, a sapphire clamp, a parylene clamp or a silicon clamp, and the second clamp may include a gold-plated copper clamp. The second clamp may include a corner spring clamp attached via a groove to the printed circuit board. The metal carrier may include a gold-plated copper plate.

A method of wirebonding a superconductive device to a printed circuit board and thermally coupling the superconductive device to a metal carrier may be summarized as including: placing the superconductive device to overlie the metal carrier, wherein the underside of the superconductive device overlies a through-hole at least approximately centrally located in the metal carrier; applying a vacuum via the through-hole to the underside of the superconductive device; wirebonding the superconductive device to a printed circuit board while the superconductive device is held in place by the vacuum; applying a pressure clamp on the upper side of the superconductive device; and removing the vacuum.

The method may further include: clamping the superconductive device with a lateral clamp wherein the lateral clamp is integrated with the printed circuit board. Placing the superconductive device to overlie the metal carrier may include placing a superconductive quantum processor to overlie the metal carrier.

A composite magnetic shield for use at superconductive temperatures may be summarized as including: at least one inner layer having a magnetic permeability of 100,000 or more; and at least one outer layer having a magnetic saturation field greater than 1.2 T, wherein the outer layer lies outside the inner layer, and the outer layer is separated from the inner layer by an intermediate layer including a dielectric.

The at least one inner layer may include ferromagnetic film, and the at least one outer layer may include ferromagnetic film. The intermediate layer may include a trilayer, the trilayer may include: a first layer including a dielectric; a second layer including a non-magnetic conductive material, the second layer overlying the first layer; and a third layer including a dielectric, the third layer overlying the second layer. The first layer may include an epoxy dielectric, the second layer may include a non-magnetic metal selected from the group consisting of copper foil or aluminum foil, and the third layer may include an epoxy trilayer.

A hybrid flange for use with a vacuum system to interface with ISO-K flange and an ISO-F type flange may be summarized as including: a hollow cylindrical body having a face at one end and a lateral surface; at least one protrusion extending outwards from the lateral surface, each protrusion including at least one bolt hole to affix the ISO-F type flange; an annular groove in the face sized and dimensioned to accommodate at least one claw clamp of the ISO-K type flange.

A magnetic shielding system may be summarized as including: a ferromagnetic shield including a body and a flat base; and a ferromagnetic skirt extending from the body below the flat base.

The ferromagnetic skirt may be integrated with the body. The ferromagnetic shield may include a ferromagnetic shield including a cylindrical body.

An apparatus to dissipate heat from a superconducting processor including a first substrate may be summarized as including: a metal carrier including an upper metal surface, the upper metal surface interrupted by a recess having a first height, the length and width of the recess each less than the length and width of the superconducting processor; a post that extends upwards from a base of the recess and that has a second height; and a layer of adhesive placed on top of the post, wherein the first height is greater than or equal to the second height.

The superconducting processor may include a superconducting quantum processor. The metal carrier may include a non-superconducting metal and the post may include a non-superconducting metal. The non-superconducting metal may be copper. The post may include a material selected from the group consisting of brass or aluminum. The metal carrier may include a material with a first Integral Thermal Expansion coefficient and the post may include a material with a second Integral Thermal Expansion coefficient wherein the second Integral Thermal Expansion coefficient may be greater than or equal to the first Integral Thermal Expansion coefficient. The metal carrier may include a material with a first Integral Thermal Expansion coefficient and the first substrate may include a material with a second Integral Thermal Expansion coefficient wherein the first Integral Thermal Expansion coefficient may be lower than or equal to the second Integral Thermal Expansion coefficient. The apparatus may further include: a ring, placed around an upper end of the post, a lower side of the ring situated above the base of the recess, and an upper side of the ring extending above the post. The ring may include a plastic material or a metal material. The apparatus may further include: a recess in the post, the recess extending longitudinally from an upper end of the post to the base of the metal carrier.

A cryogenic refrigeration system may be summarized as including: a primary helium circuit including: a dilution refrigerator; at least one hydrogen getter coupled in series with the dilution refrigerator; and a pump coupled in series with the hydrogen getter, and operable to pump helium in the helium circuit; and a secondary helium circuit, in parallel with the primary helium circuit, including: a helium tank to supply helium to the primary and the secondary helium circuits; wherein the secondary helium circuit has a circuit leg including the pump in common with the primary helium circuit.

The hydrogen getter may operate at a cryogenic temperature. The cryogenic refrigeration system may further include: at least one valve in the primary helium circuit coupled in series with the hydrogen getter, and operable to control the flow of helium in the primary circuit; and at least one valve in the secondary helium circuit coupled in series with the helium tank, and operable to control the flow of helium in the secondary circuit. The cryogenic refrigeration system may further include: a second hydrogen getter in parallel with the at least one hydrogen getter; and at least one valve coupled in series with the second hydrogen getter and operable to control the flow of helium to the second hydrogen getter.

A cryogenic refrigeration system may be summarized as including: a primary helium circuit including: a dilution refrigerator; and a pump coupled in series with the dilution refrigerator, and operable to pump helium in the helium circuit; and a secondary helium circuit, in parallel with the primary helium circuit, including: at least one hydrogen getter; and a helium tank to supply helium to the primary and the secondary helium circuits, coupled in series with the at least one hydrogen getter; wherein the secondary helium circuit has a circuit leg including the pump in common with the primary helium circuit.

The hydrogen getter may operate at cryogenic temperature. The cryogenic refrigeration system may further include: at least one valve coupled in series with the hydrogen getter, and operable to control the flow of helium in the primary circuit; and at least one valve coupled in series with the helium tank, and operable to control the flow of helium in the secondary circuit. The cryogenic system may further include: a second hydrogen getter in parallel with the at least one hydrogen getter; and at least one valve coupled in series with the second hydrogen getter and operable to control the flow of helium to the second hydrogen getter.

An apparatus may be summarized as including: an outer tubular shield having a perimeter wall which forms a first cavity, the first cavity having at least a respective lateral dimension, the perimeter wall of the outer tubular shield including a first plurality of layers of a nanocrystalline material, the outer tubular shield having a first end and a second end, the second end opposed to the first end along a length of the outer tubular shield; and an inner tubular shield having a perimeter wall which forms a second cavity, the second cavity having at least a respective lateral dimension, the perimeter wall of the inner tubular shield including a second plurality of layers of a nanocrystalline material, the inner tubular shield having a first end and a second end, the second end opposed to the first end along a length of the inner tubular shield, and the inner tubular shield sized and dimensioned to be received in the first cavity of the outer tubular shield.

The apparatus may further include: a processor received within the second cavity of the inner tubular shield. The nanocrystalline material may be a nanocrystalline amorphous Iron-based material. The nanocrystalline material may be an nanocrystalline amorphous Iron-based material laminated in a polyethylene terephthalate (PET). The nanocrystalline material may be a tape including an nanocrystalline amorphous Iron-based material laminated in a polyethylene terephthalate (PET). The tape may have a thickness of approximately 15 micrometers to 20 micrometers. The first plurality of layers of nanocrystalline material may include from 10 to 30 layers and the second plurality of layers of nanocrystalline material may include from 10 to 30 layers. The first plurality of layers of nanocrystalline material may include at least 25 layers. The second plurality of layers of nanocrystalline material may include less than 25 layers. The second plurality of layers of nanocrystalline material may include 20 layers. Successive ones of the layers of nanocrystalline material may be adhered to one another. Successive ones of the layers of nanocrystalline material may be adhered to one another via an epoxy. Successive ones of the layers of nanocrystalline material may be adhered to one another with an adhesive loaded with a copper powder. The first plurality of the layers of nanocrystalline material may include at least 25 layers. The apparatus may further include: at least one end cap sized and dimensioned to be removably secured to the outer tubular shield proximate at least one of the first or the second ends of the outer tubular shield. An end cap may include a through-hole that provides access to the first cavity from an exterior of the outer tubular shield. The end cap may have an annular recess that surrounds the through-hole and which may be open to an exterior of the outer tubular shield when the end cap is secured thereto. The apparatus may further include: at third plurality of layers of a nanocrystalline material overlapping the end cap and the outer tubular shield at the first or the second ends. The apparatus may further include: a plurality of layers of a copper tape wrapped around an outer perimeter of the outer tubular shield. The outer tubular shield may be cylindrical and may have a circular cross section taken perpendicular to the length of the outer tubular shield, and the inner tubular shield may be cylindrical and may have a circular cross section taken perpendicular to the length of the outer tubular shield. The outer tubular shield may further include a frame formed of two U-shaped pieces and a rectangular shaped piece, and the outer tubular shield may have a rectangular cross section taken perpendicular to the length of the outer tubular shield. The U-shaped pieces may each be from a single strip or a single piece of a laminate strip, with a first bend and a second bend each of which extend laterally across a longitudinal axis of the strip. The rectangular shaped piece may be copper. The outer tubular shield may further include a frame formed of three U-shaped pieces and a hexagonal shaped piece, and the outer tubular shield may have a hexagonal cross section taken perpendicular to the length of the outer tubular shield. The hexagonal shaped piece may be copper. The outer tubular shield may further include a frame formed of four or more U-shaped pieces and a base piece, and the outer tubular shield may have a non-circular cross section taken perpendicular to the length of the outer tubular shield. The base piece may be copper. The apparatus may further include: at least one degaussing wire wrapped about a portion of the outer tubular shield, the degaussing wire electrically coupled to receive a periodic waveform of gradually decreasing amplitude to reduce a residual magnetism in the outer tubular shield.

An apparatus may be summarized as including: a first tubular shield including a first plurality of distinct U-shaped pieces of a nanocrystalline material that form a perimeter wall which forms a first cavity, the first cavity having at least a respective lateral dimension, the first tubular shield having a first end and a second end, the second end opposed to the first end along a length of the first tubular shield, the second end closed; and a first end cap including a second plurality of distinct U-shaped pieces of a nanocrystalline material, the first end cap sized and dimensioned to be removably secured to the first tubular shield proximate the first end of the first tubular shield.

The first plurality of distinct U-shaped pieces of a nanocrystalline material may each include a plurality of layers of a nanocrystalline amorphous iron-based material. The first plurality of distinct U-shaped pieces of a nanocrystalline material may each include a laminate of a plurality of layers of a nanocrystalline amorphous iron-based material in a polyethylene terephthalate (PET). The first plurality of distinct U-shaped pieces of a nanocrystalline material may each include a laminate of a plurality of layers of a nanocrystalline amorphous iron-based material in a polyethylene terephthalate (PET) loaded with a copper powder. The first plurality of distinct U-shaped pieces of a nanocrystalline material may each include a laminate of a plurality of layers of a tape including a nanocrystalline amorphous Iron-based material in a polyethylene terephthalate (PET). The U-shaped pieces may each be from a single strip or a single piece of a laminate strip, with a first bend and a second bend each of which may extend laterally across a longitudinal axis of the strip. The apparatus may further include: a copper base, about which the first plurality of distinct U-shaped pieces of a nanocrystalline material may be arranged to form the first tubular shield. The second plurality of distinct U-shaped pieces of a nanocrystalline material may each include a laminate of a plurality of layers of a tape including a nanocrystalline amorphous Iron-based material in a polyethylene terephthalate (PET). The apparatus may further include: a second tubular shield including a third plurality of distinct U-shaped pieces of a nanocrystalline material that may form a perimeter wall which forms a second cavity, the second cavity having at least a respective lateral dimension, the second tubular shield having a first end and a second end, the second end opposed to the first end along a length of the second tubular shield, the second end closed, the second tubular shield positioned in the first cavity of the first tubular shield. The apparatus may further include: a copper base, about which the first plurality of distinct U-shaped pieces of a nanocrystalline material may be arranged to form the first tubular shield. The apparatus may further include: a processor received within the second cavity of the second tubular shield. The apparatus may further include: at least one degaussing wire wrapped about a portion of the first tubular shield, the degaussing wire electrically coupled to receive a periodic waveform of gradually decreasing amplitude to reduce a residual magnetism in the first tubular shield.

A method of forming an apparatus may be summarized as including: arranging a first plurality of distinct U-shaped pieces of a nanocrystalline material to form at least a perimeter wall of a first tubular shield having a first cavity, the first cavity having at least a respective lateral dimension, the first tubular shield having a first end and a second end, the second end opposed to the first end along a length of the first tubular shield, the second end closed; and arranging a second plurality of distinct U-shaped pieces of a nanocrystalline material to form at least a perimeter wall of a first end cap, the first end cap sized and dimensioned to be removably secured to the first tubular shield proximate the first end of the first tubular shield.

The method may further include: arranging a third plurality of distinct U-shaped pieces of a nanocrystalline material to form at least a perimeter wall of a second tubular shield having a second cavity, the second cavity having at least a respective lateral dimension, the second tubular shield having a first end and a second end, the second end opposed to the first end along a length of the second tubular shield, the second end closed, the second tubular shield sized and dimensioned to be removably received in the first cavity of the first tubular shield. The method may further include: inserting a processor in the second cavity of the second tubular shield; inserting the second tubular shield in the first cavity of the first tubular shield; and securing the first end cap to the first end of the first tubular shield.

An apparatus may be summarized as including: a chamber having at least one wall that defines an interior and that separates the interior of the chamber from an exterior environment, a temperature in the interior selectively reducible to cryogenic temperatures while a temperature in the exterior environment is higher than the temperature in the interior of the chamber; a processor located in the interior of the chamber; a set of electronics located in the exterior environment; and at least one active switch that selectively communicatively couples the set of electronics to the processor during at least one of programming portion of an operational cycle or readout portion of the operational cycle and that communicatively decouples the set of electronics to the processor during a calculation portion of the operational cycle.

The at least one active switch may include materials that superconduct at cryogenic temperatures. The at least one active switch may be operable at microwave frequencies. The at least one active switch may be a gallium arsenide (GaAs) switch. The at least one active switch may be a cryotron. The at least one active switch may be a high speed, low loss switch. The set of electronics may include an input/output circuit. The processor may be one of an analog processor or a digital processor. The processor may be a quantum processor.

A method of operation in an apparatus may be summarized as including: lowering a temperature in an interior of a chamber having at least one wall that defines the interior and that separates the interior of the chamber from an exterior environment, to cryogenic temperatures while a temperature in the exterior environment is higher than the temperature in the interior of the chamber; operating at least one active switch to selectively communicatively couple a set of electronics located in the exterior environment to a processor located in the interior of the chamber during at least one of programming portion of an operational cycle or readout portion of the operational cycle; and operating the at least one active switch to selectively communicatively decouple the set of electronics to the processor during a calculation portion of the operational cycle.

The method may further include: programming the processor located in the interior of the chamber during the programming portion of the operational cycle. The method may further include: reading out at least one characteristic of the processor located in the interior of the chamber during the readout portion of the operational cycle. The method may further include: performing a calculation on a problem by the processor located in the interior of the chamber during the calculation portion of the operational cycle.

An apparatus may be summarized as including: a toroidal core; a first winding on the toroidal core, the first winding communicatively coupled to a processor maintained at a first temperature; and a second winding on the toroidal core, the second winding communicatively coupled to a set electronics maintained at a second temperature, the second temperature higher than the first temperature.

The toroidal core may be a ferrite toroidal core. The toroidal core may be an amorphous metal core. The toroidal core and the first and the second windings are electrically coupled to a noise insulating transformer that reduces or eliminates high frequency noise in a GHz range at non-galvanic connections between electronics at or above a temperature of 15° C. and processors operating at or below 0° C. The toroidal core and the first and the second windings for a noise insulating transformer that reduces or eliminates high frequency noise in a GHz range at non-galvanic connections between electronics at or above a temperature of 15° C. and processors operating at or below a cryogenic temperature, where the noise insulating transformer may be at a low or a cryogenic temperature. The apparatus may further include: a high conductive shielding wall between first winding and the second winding. The apparatus may further include: a tubular filter having a cavity, the toroidal core with the first and the second windings received in the cavity of the tubular filter. The apparatus may further include: a metal power-epoxy mixture that envelopes at least a portion of the toroidal core with the first and the second windings. The apparatus may further include: an absorptive layer that at least partially envelopes the toroidal core. The apparatus may further include: an absorptive layer that at least partially envelopes the toroidal core. The absorptive layer may be a CuNi layer.

An apparatus may be summarized as including: a first shield that provides magnetic shielding to an environment; at least one electrically conductive coil located about the first shield; a current source operable to provide a direct current; a control circuit that selectively controls a flow of the direct current from the current source to the at least one electrically conductive coil, and which in operation: causes a degaussing field to be applied to the first shield; determines an initial measurement of a magnetic field in at least one location in the magnetically shielded environment, the initial measurement representative of the magnetic field in at least one location in the magnetically shielded environment following application of the degaussing field to the first shield; after determination of the initial measurement of the magnetic field in at least one location in the magnetically shielded environment, iteratively from i=1 until at least one exit condition is reached, causes a direct current of an $i^{th}$ amperage to pass through the at least one electrically conductive coil during an $i^{th}$ period of time, where the $i^{th}$ amperage is greater than a previous amperage, if any; after the direct current of the $i^{th}$ amperage passes through the at least one electrically conductive coil during the $i^{th}$ period of time, determine an $i^{th}$ measurement of the magnetic field in at least one location in the magnetically shielded environment, the $i^{th}$ measurement representative of the magnetic field in at least one location in the magnetically shielded environment following application of the direct current of the $i^{th}$ amperage and before application of the direct current of an $i^{th}+1$ amperage, if any; and determine whether the magnetic field in the at least one location in the magnetically shielded environment has reached a minimum, wherein at least one exit condition corresponds to the determination that the magnetic field in the at least one location in the magnetically shielded environment has reached the minimum.

To determine whether the magnetic field in the at least one location in the magnetically shielded environment has reached a minimum the control circuit may determine whether a most current one of the measurements of the magnetic field in at least one location in the magnetically shielded environment is larger than a previous one of the measurements of the magnetic field in at least one location in the magnetically shielded environment. The shield may be a mu-metal shield. The shield may include a nickel-iron soft magnetic alloy with a very high permeability. The control circuit in operation may control the current source to selectively provide the direct current through the at least one electrically conductive coil. The control circuit in operation may selectively operate a switch to electrically couple the current source to the at least one electrically conductive coil to pass the direct current through the at least one electrically conductive coil. The apparatus may further include: a second shield, the first shield enclosed within the second shield. The control circuit may cause the degaussing field to be applied to the first shield via the at least one electrically conductive coil. The apparatus may further include: during each iteration, determine whether a maximum number of iterations has been reached, wherein at least one exit condition corresponds to the determination that the maximum number of iterations has been reached.

A method may be summarized as including: causing a degaussing field to be applied to a first shield that provides magnetic shielding to an environment; determining an initial measurement of a magnetic field in at least one location in the magnetically shielded environment by a control circuit, the initial measurement representative of the magnetic field in at least one location in the magnetically shielded environment following application of the degaussing field to the first shield; after determining the initial measurement of the magnetic field in at least one location in the magnetically shielded environment, iteratively from i=1 until at least one exit condition is reached, causing a direct current of an $i^{th}$ amperage to pass through at least one electrically conductive coil located about the first shield during an $i^{th}$ period of time, where the $i^{th}$ amperage is greater than a previous amperage, if any; after the direct current of the $i^{th}$ amperage passes through the at least one electrically conductive coil during the $i^{th}$ period of time, determining an $i^{th}$ measurement of the magnetic field in at least one location in the magnetically shielded environment, the $i^{th}$ measurement representative of the magnetic field in at least one location in the magnetically shielded environment following application of the direct current of the $i^{th}$ amperage and before application of the direct current of an $i^{th}+1$ amperage, if any; and determining whether the magnetic field in the at least one location in the magnetically shielded environment has reached a minimum, wherein at least one exit condition corresponds to the determination that the magnetic field in the at least one location in the magnetically shielded environment has reached the minimum.

Determining whether the magnetic field in the at least one location in the magnetically shielded environment has reached a minimum may include determining whether a most current one of the measurements of the magnetic field in at least one location in the magnetically shielded environment is larger than a previous one of the measurements of the magnetic field in at least one location in the magnetically shielded environment. Causing a direct current to pass through the at least one electrically conductive coil may include controlling operation of a current source. Causing a direct current to pass through the at least one electrically conductive coil may include controlling a switch to electrically couple a current source to the at least one electrically conductive coil. Causing a degaussing field to be applied to a first shield that provides magnetic shielding to an environment may include causing the degaussing field to be applied to the first shield via the at least one electrically conductive coil. The method may further include: during each iteration, determining whether a maximum number of iterations has been reached, wherein at least one exit condition corresponds to the determination that the maximum number of iterations has been reached.

An apparatus may be summarized as including: an outer shield having a perimeter that at least partially encompasses an environment, the outer shield including a material that provides magnetic shielding to the environment that is at least partially encompassed by the perimeter of the outer shield; a thermalization path located within the environment that is at least partially encompassed by the perimeter of the outer shield and spaced inwardly from the perimeter of the outer shield to form a cavity therebetween; and an unsintered high permeability powder received in the cavity, wherein the unsintered high permeability powder remains unsintered during use of the apparatus.

The thermalization path may include a copper shell. The thermalization path may include a copper shell without right angle transitions. The thermalization path may include a copper shell cast or worked without right angle transitions. The unsintered high permeability powder may be lightly packed. The unsintered high permeability powder may include a ferrite powder. The unsintered high permeability powder may include at least one of MnZn powder or NiZn powder. The unsintered high permeability powder may include amorphous cobalt powder. The unsintered high permeability powder may include any one or more of: MnZn powder, NiZn powder and amorphous cobalt powder. The unsintered high permeability powder may have a first composition at a first time, and may have a second composition at a second time, the second composition replacing the first composition between the first time and the second time. The outer shield may include a first tubular shell including a nanocrystalline material that forms a perimeter wall which forms a first cavity that at least partially encompasses the environment, the first cavity having at least a respective lateral dimension, the first tubular shell having a first end and a second end, the second end opposed to the first end along a length of the first tubular shell, the second end closed. The outer shield may include a first tubular shell including a first plurality of distinct U-shaped pieces of a nanocrystalline material that form a perimeter wall which forms a first cavity that at least partially encompasses the environment, the first cavity having at least a respective lateral dimension, the first tubular shell having a first end and a second end, the second end opposed to the first end along a length of the first tubular shell, the second end closed. The apparatus may further include: a first end cap including a second plurality of distinct U-shaped pieces of a nanocrystalline material, the first end cap sized and dimensioned to be removably secured to the first tubular shell proximate the first end of the first tubular shell. The first plurality of distinct U-shaped pieces of a nanocrystalline material may each include a plurality of layers of a nanocrystalline amorphous iron-based material. The first plurality of distinct U-shaped pieces of a nanocrystalline material may each include a laminate of a plurality of layers of a nanocrystalline amorphous iron-based material in a polyethylene terephthalate (PET). The first plurality of distinct U-shaped pieces of a nanocrystalline material may each include a laminate of a plurality of layers of a nanocrystalline amorphous iron-based material in a polyethylene terephthalate (PET) loaded with a copper powder. The first plurality of distinct U-shaped pieces of a nanocrystalline material may each include a laminate of a plurality of layers of a tape including a nanocrystalline amorphous iron-based material in a polyethylene terephthalate (PET). The U-shaped pieces may each be from a single strip or a single piece of a laminate strip, with a first bend and a second bend each of which may extend laterally across a longitudinal axis of the strip. The apparatus may further include: a copper base, about which the first plurality of distinct U-shaped pieces of a nanocrystalline material may be arranged to form the first tubular shell.

A method to magnetically shield components may be summarized as including: forming an outer shield having a perimeter that at least partially encompasses an environment, the outer shield including a material that provides magnetic shielding to the environment that is at least partially encompassed by the perimeter of the outer shield; providing a thermalization path located within the environment that is at least partially encompassed by the perimeter of the outer shield and spaced inwardly from the perimeter of the outer shield to form a cavity therebetween; and depositing an unsintered high permeability powder in the cavity, wherein the unsintered high permeability powder remains unsintered during use.

Providing a thermalization path located within the environment that is at least partially encompassed by the perimeter of the outer shield may include locating a copper shell in the environment. Providing a thermalization path located within the environment that is at least partially encompassed by the perimeter of the outer shield may include locating a copper shell without right angle transitions in the environment. The method may further include: at least one of casting or working the copper shell without right angle transitions. The method may further include: lightly packing the deposited unsintered high permeability powder. Depositing an unsintered high permeability powder in the cavity may include depositing a ferrite powder in the cavity. Depositing an unsintered high permeability powder in the cavity may include depositing at least one of MnZn powder or NiZn powder in the cavity. Depositing an unsintered high permeability powder in the cavity may include depositing an amorphous cobalt powder in the cavity. Depositing an unsintered high permeability powder in the cavity may include depositing any one or more of: MnZn powder, NiZn powder and amorphous cobalt powder in the cavity. Depositing the unsintered high permeability powder in the cavity may include depositing a first composition of unsintered high permeability powder in the cavity at a first time before a first use, and may further include: removing the first composition of unsintered high permeability powder from the cavity at a second time after the first use; and depositing a second composition of unsintered high permeability powder in the cavity at a third time, after removing the first composition of unsintered high permeability powder from the cavity, the second composition of unsintered high permeability powder different than the first composition of unsintered high permeability powder. Forming an outer shield may include forming a first tubular shell including a nanocrystalline material that forms a perimeter wall which forms a first cavity that at least partially encompasses the environment, the first cavity having at least a respective lateral dimension, the first tubular shell having a first end and a second end, the second end opposed to the first end along a length of the first tubular shell, the second end closed. Forming an outer shield may include forming a first tubular shell including a first plurality of distinct U-shaped pieces of a nanocrystalline material that form a perimeter wall which forms a first cavity that at least partially encompasses the environment, the first cavity having at least a respective lateral dimension, the first tubular shell having a first end and a second end, the second end opposed to the first end along a length of the first tubular shell, the second end closed. The method may further include: forming a first end cap including a second plurality of distinct U-shaped pieces of a nanocrystalline material, the first end cap sized and dimensioned to be removably secured to the first tubular shell proximate the first end of the first tubular shell. The first plurality of distinct U-shaped pieces of a nanocrystalline material may each include a plurality of layers of a nanocrystalline amorphous iron-based material. The first plurality of distinct U-shaped pieces of a nanocrystalline material may each include a laminate of a plurality of layers of a nanocrystalline amorphous iron-based material in a polyethylene terephthalate (PET). The first plurality of distinct U-shaped pieces of a nanocrystalline material may each include a laminate of a plurality of layers of a nanocrystalline amorphous iron-based material in a polyethylene terephthalate (PET) loaded with a copper powder. The first plurality of distinct U-shaped pieces of a nanocrystalline material may each include a laminate of a plurality of layers of a tape including a nanocrystalline amorphous iron-based material in a polyethylene terephthalate (PET). The U-shaped pieces may each be from a single strip or a single piece of a laminate strip, with a first bend and a second bend each of which may extend laterally across a longitudinal axis of the strip. Forming an outer shield may further include arranging the first plurality of distinct U-shaped pieces of nanocrystalline material about a copper base and extending outwardly therefrom to form the first tubular shell.

An apparatus may be summarized as including: a thermally conductive substrate having a mounting area to mount a processor chip to the thermally conductive substrate, a first elongated slot that passes through the mounting area, and a second elongated slot that passes through the mounting area and which intersects the first elongated slot.

The thermally conductive substrate may have a total thickness, and the first and second elongated slots may each extend completely through the total thickness of the substrate. The second elongated slot may extend at a right angle with respect to the first elongated slot. The second elongated slot may extend at least at one of an acute or an obtuse angle with respect to the first elongated slot. The first and the second elongated slots may form a saltire cross. The apparatus may further include: the processor chip mounted to the thermally conductive substrate, wherein the first and the second elongated slots extend beyond an outer perimeter of an area occupied by the processor chip. The first and the second elongated slots may extend beyond the outer perimeter of the area occupied by the processor chip by at least 2 millimeters. The apparatus may further include: the processor chip, wherein the processor chip is rectangular having a two principal axes and a thickness, and the processor chip is mounted to the thermally conductive substrate with each of the principal axis aligned with a respective one of the elongated slots. The apparatus may further include: the processor chip, wherein the processor chip is rectangular having a two principal axes and a thickness, and the processor chip is mounted to the thermally conductive substrate with each of the principal axis at a non-zero and non-right angle with respective to a respective one of the elongated slots. The thermally conductive substrate may include a number of arcuate slots that substantially isolate the mounting area from a remainder of the substrate. The arcuate slots may cumulatively extend over 90% of a total perimeter of the mounting area covered by the processor chip when the processor chip is mounted to the thermally conductive substrate in the mounting area. The apparatus may further include: the processor chip, wherein the processor chip is rectangular having a two principal axes and a thickness, and the processor chip is mounted to the thermally conductive substrate with each of the principal axis aligned with a respective one of the elongated slots. The apparatus may further include: the processor chip, wherein the processor chip is rectangular having a two principal axes and a thickness, and the processor chip is mounted to the thermally conductive substrate with each of the principal axis at a non-zero and non-right angle with respective to a respective one of the elongated slots. The first elongated slot may be straight and intersect a first pair of the arcuate slots, the arcuate slots of the first pair of arcuate slots diametrically opposed to one another across the mounting area, and the second elongated slot may be straight and intersect a second pair of the arcuate slots, the arcuate slots of the second pair of arcuate slots diametrically opposed to one another across the mounting area. The arcuate slots may include a first, a second, a third and a fourth arcuate slot, and the first and the second elongated slots along with the first, the second, the third and the fourth arcuate slots form a Korsun cross pattern. The processor chip may be a quantum processor chip and an outer perimeter of the Korsun (aka Corsun) cross pattern may circumscribe the quantum processor chip when the quantum processor chip is mounted to the thermally conductive substrate. The thermally conductive substrate may include a copper block.

An apparatus may be summarized as including: a thermally conductive substrate having an upper surface and a bottom surface and a recess extending from the upper surface through the bottom surface; a crystal wafer mounted in the recess of the thermally conductive substrate; and a superconductive processor chip mounted thereon crystal wafer.

The crystal wafer may be one of a silicon crystal wafer or a sapphire crystal wafer. The substrate may include a copper block. The recess may have a circular profile with a first radius. The crystal wafer may have a circular profile with a second radius, the second radius larger than the first radius. There may be a gap between an entire perimeter of the quantum processor chip and an entire inner perimeter of the recess.

An apparatus may be summarized as including: a circuit board having a mounting area; a processor chip positioned in the mounting area and supported by the circuit board; a clamp that encompasses the processor chip and which physically retains the processor chip to the circuit board; and a set of fasteners that fasten the clamp to the circuit board, at least some of the fasteners adjustable to selectively adjust a force applied thereby and selectively adjust a thermal current flow in a pair of planes spaced from one another across a major plan of the processor chip.

The set of fasteners may include a first pair of fasteners and a second pair of fasteners, the fasteners of the first pair of fasteners diametrically opposed to one another across the mounting area, and the fasteners of the second pair of fasteners diametrically opposed to one another across the mounting area. A line that passes through the fasteners of the second pair of fasteners may be perpendicular to a line that passes through the fasteners of the first pair of fasteners. The first pair of fasteners may be adjustable to selectively adjust a force applied in a first plane of the circuit board. The second pair of fasteners may be adjustable to selectively adjust a force applied in a second plane of the circuit board, wherein the second plane may be opposite the first plane across a thickness of the processor. Adjustment of the first pair of fasteners may selectively adjust a thermal current within the first plane of the circuit board. Adjustment of the second pair of fasteners may selectively adjust a thermal current within the second plane of the circuit board. The clamp may include a first pair of arms and a second pair of arms, the arms of the first pair of arms diametrically opposed to one another across the mounting area, and the arms of the second pair of arms diametrically opposed to one another across the mounting area. The arms of the first pair of arms may be parallel to one another and the arms of the second pair of arms may be parallel to one another. The clamp may have two pairs of opposed arms and four vertices arranged in a parallelogram shape, and may have four holes, a first pair of the holes which reside on a first line that extends between a first pair of the vertices, and a second pair of the holes which reside on a second line that extends between a second pair of the vertices, and each of the holes sized and dimensioned to receive a respective one of the fasteners. The circuit board may include a first slot and a second slot, the first slot which follows a first crenulated path and the second slot which follows a second crenulated path. The circuit board may include a first pair of overlapping portions which form the first slot and which each has a passage therein, and a second pair of overlapping portions which form the second slot which each has a passage therein, and wherein a first one of the fasteners passes through the passages of the first pair of overlapping portions, and a second one of the fasteners passes through the passages of the second pair of overlapping portions. The fasteners of the set of fasteners may each be one of a bolt or a screw. The circuit board may include a plurality of contacts positioned about the mounting area, and may further include: a plurality of wire bonds communicatively coupling processor chip to respective ones of the contacts of circuit board. The processor chip may be a quantum processor.

A method to adjust thermal currents proximate a processor mounted to a circuit board via a clamp with a set of adjustable fasteners may be summarized as including: measuring a resistance through a substrate on which a processor is mounted via a clamp and a plurality of fasteners; initially adjusting a respective amount of force applied via each fastener of the plurality of fasteners to the substrate via the clamp; measuring the resistance through the substrate at the initially adjusted amounts of force; reducing the force applied by a first one of the fasteners; measuring the resistance through the substrate as the force applied by the first one of the fasteners is reduced; retightening the first one of the fasteners; reducing the force applied by a second one of the fasteners after retightening the first one of the fasteners, the second one of the fasteners diametrically opposed across the processor from the first one of the fasteners; measuring the resistance through the substrate as the force applied by the second one of the fasteners is reduced; retightening the second one of the fasteners; reducing the force applied by a third one of the fasteners after retightening the second one of the fasteners; measuring the resistance through the substrate as the force applied by the third one of the fasteners is reduced; retightening the third one of the fasteners; reducing the force applied by a fourth one of the fasteners after retightening the third one of the fasteners, the fourth one of the fasteners diametrically opposed across the processor from the third one of the fasteners; measuring the resistance across the substrate as the force applied by the fourth one of the fasteners is reduced; adjusting the torque on the first and the second ones of the fasteners so that going to a zero torque on either the first and the second ones of the fasteners alone would reduce resistance by twenty-five percent (25%); and adjusting the torque on the third and the fourth ones of the fasteners so that going to a zero torque on either the third or the fourth ones of the fasteners alone would reduce resistance by fifty percent (50%).

The method may further include: retightening the fourth one of the fasteners before adjusting the torque on the first and the second ones of the fasteners so that going to a zero torque on either the first and the second ones of the fasteners alone would reduce resistance by twenty-five percent (25%). Measuring the resistance across the substrate may include measuring a resistance across a thickness of the substrate from a top major face to bottom major face. Measuring the resistance across the substrate may include performing a 4-wire measurement. Initially adjusting a respective amount of force applied via each fastener of the plurality of fasteners to the substrate via the clamp may include initially increasing a torque of each of the plurality of fasteners to a defined amount of torque. Reducing an amount of force applied may include decreasing a torque of a respective one of the fasteners. Adjusting the torque on the first and the second ones of the fasteners so that going to a zero torque on either the first and the second ones of the fasteners alone would reduce resistance by twenty-five percent (25%) may balance a thermal current on a left side of the processor versus a thermal current on a right side of the processor, the right side opposed across a centerline of a width of the processor from the left side. Adjusting the torque on the third and the fourth ones of the fasteners so that going to a zero torque on either the third or the fourth ones of the fasteners alone would reduce resistance by fifty percent (50%) may balance thermal current above a first major face of the processor versus a thermal current below a second major face of the processor, the second major face opposed to the first major face across a thickness of the processor.

An apparatus may be summarized as including: a metal carrier having a first surface; and a metal flock that extends from the first surface of the metal carrier; a processor secured to the metal carrier and in contact with the metal flock.

The metal flock may be secured to the first surface of the metal carrier via an adhesive. The metal flock and the metal carrier may be an integral single piece of metal. The processor may bear a layer of gold on a surface thereof that is in contact with the metal flock. The apparatus may further include: a clamp that clamps the processor to the metal carrier with the metal flock therebetween.

BRIEF DESCRIPTION OF THE SEVERAL VIEWS OF THE DRAWINGS

In the figures, identical reference numbers identify similar elements or acts. The sizes and relative positions of elements in the figures are not necessarily drawn to scale. For example, the shapes of various elements and angles are not necessarily drawn to scale, and some of these elements are arbitrarily enlarged and positioned to improve legibility. Further, the particular shapes of the elements as drawn are not necessarily intended to convey any information regarding the actual shape of the particular elements and have been solely selected for ease of recognition in the figures. Furthermore, while the figures may show specific layouts, one skilled in the art will appreciate that variations in design, layout, and fabrication are possible and the shown layouts are not to be construed as limiting the geometry of the present systems, devices, and methods.

FIG. 1A is a plan view illustrating a segment of an electrical filter, according, illustrated at an intermediate point during fabrication, the segment of an electrical filter which can be incorporated into an electrical filter structure, for instance a tubular filter structure.

FIG. 1B is a plan view illustrating the segment of an electrical filter of FIG. 1A after fabrication of the segment is complete.

FIG. 1C is a cross-sectional view through the segment of an electrical filter of FIG. 1A at a first region, along section line 1C.

FIG. 1D is a cross-sectional view through the segment of an electrical filter of FIG. 1A at a second region of a printed circuit board, along section line 1D.

FIG. 4A is a cross-sectional view along section line 4 of the switching region of the segment of an electrical filter of FIG. 1A showing a relative position of a PCB and a number of conductive traces.

FIG. 4B is a cross-sectional view along section line 4 of the switching region of the segment of an electrical filter of FIG. 1A showing the relative position of the PCB, the conductive traces and a protective mask used during fabrication of the electrical filter.

FIG. 4C is a cross-sectional view along section line 4 of the switching region of the segment of an electrical filter of FIG. 1A showing the relative position of the PCB, a wire, the conductive traces and the protective mask.

FIG. 5A is a sectional diagram of a wire showing the effect of etching wire cladding to expose a superconductive wire core.

FIG. 5B is a sectional diagram of a wire showing the effect of soldering (e.g., solder joint) the wire of FIG. 5A and further etching the wire cladding to expose an additional portion of superconductive wire core.

FIG. 8 is a flow diagram showing a method of electrically coupling wires in an input/output region in a segment of an electrical filter for use with differential signals.

FIG. 9A is a schematic diagram of a source terminated circuit including an electrical filter at a first temperature and a superconductive device at a second temperature.

FIG. 9B is a schematic diagram of a source terminated circuit including an electrical filter at a first temperature and a superconductive device at a second temperature with a mismatched transmission line and a matched filter circuit.

FIG. 14A is a cross-sectional view of a thermalization structure showing a post fabricated from a same material as that of the metal carrier.

FIG. 14B is a cross-sectional view of a thermalization structure showing the post fabricated from different material than that of the metal carrier.

FIG. 20A is a plan view of an embodiment of a magnetic shield showing an inner layer and an outer layer.

FIG. 20B is an isometric view of an embodiment of a cylindrical magnetic shield showing an inner layer and an outer layer.

FIG. 20C is a cross-sectional view of an embodiment of cylindrical magnetic shield showing a trilayer between the inner layer and the outer layer.

FIG. 21 is a cross-sectional view of an embodiment of a cylindrical ferromagnetic shield showing the sealing cornerpiece.

FIG. 22A is a cross-sectional view of an embodiment of a cylindrical magnetic shield showing a shielding skirt.

FIG. 22B is an isometric view of a cylindrical magnetic shield of FIG. 22A showing a shielding skirt.

FIG. 22C is a plan view an effect of reducing magnetic field inside a magnetic shield from FIG. 22A.

FIG. 23A is a schematic design of a component that can be used to fabricated a magnetic shield.

FIG. 23B is a schematic design of a prism shield for reducing weak joints and providing a uniform thickness of ferromagnetic material.

FIG. 25A is a cross-sectional view of a magnetic shield with a hybrid powder.

FIG. 25B is a cross-sectional view of a magnetic shield with a hybrid powder contained in a pliable shell.

FIG. 26C is a cross-sectional view of a hybrid flange to be used with ISO-K and ISO-F type flange.

FIG. 27A is a schematic diagram of a dilution refrigeration system with a hydrogen getter in continuous operation.

FIG. 27B is a schematic diagram of a dilution refrigeration system with a hydrogen getter in single use operation.

FIG. 29A is a schematic diagram of a noise insulating transformer with a toroidal core for use to reduce or eliminate noise at non-galvanic connections between room-temperature electronics and processors operating at low or cryogenic temperature.

FIG. 29B is a schematic diagram of a noise insulating transformer with a primary and a secondary coil wrapped around a toroidal core for use to reduce or eliminate noise at non-galvanic connections between room-temperature electronics and processors operating at low or cryogenic temperature.

FIG. 29C is a schematic diagram of a noise insulating transformer with an air core for use to reduce or eliminate noise at non-galvanic connections between room-temperature electronics and processors operating at low or cryogenic temperature.

FIG. 30A is a schematic diagram of an example sample holder for use with a processor to reduce thermal current through a cross-shaped cut.

FIG. 30B is a schematic diagram of an example sample holder for use with a processor to reduce thermal current through a saltire cross-shaped cut.

FIG. 30C is a schematic diagram of an example sample holder for use with a processor to reduce thermal current through a Korsun cross-shaped cut.

FIG. 30D is a schematic diagram of an example sample holder for use with a processor to reduce thermal current through a rotated Korsun cross-shaped cut.

FIG. 30E is a schematic diagram of an example sample holder for use with a processor to reduce thermal current through a double triangle shaped cut.

FIG. 31A is a schematic diagram an underside of a sample holder for use in reducing thermal currents at a processor by balancing the flow of thermal current in a plane above the processor and a plane under a processor.

FIG. 31B is a schematic diagram an upper side of a sample holder for use in reducing thermal currents at a processor by balancing the flow of thermal current in a plane above the processor and a plane under a processor.

DETAILED DESCRIPTION

Non Dissipative Differential Filters

Figure 2:
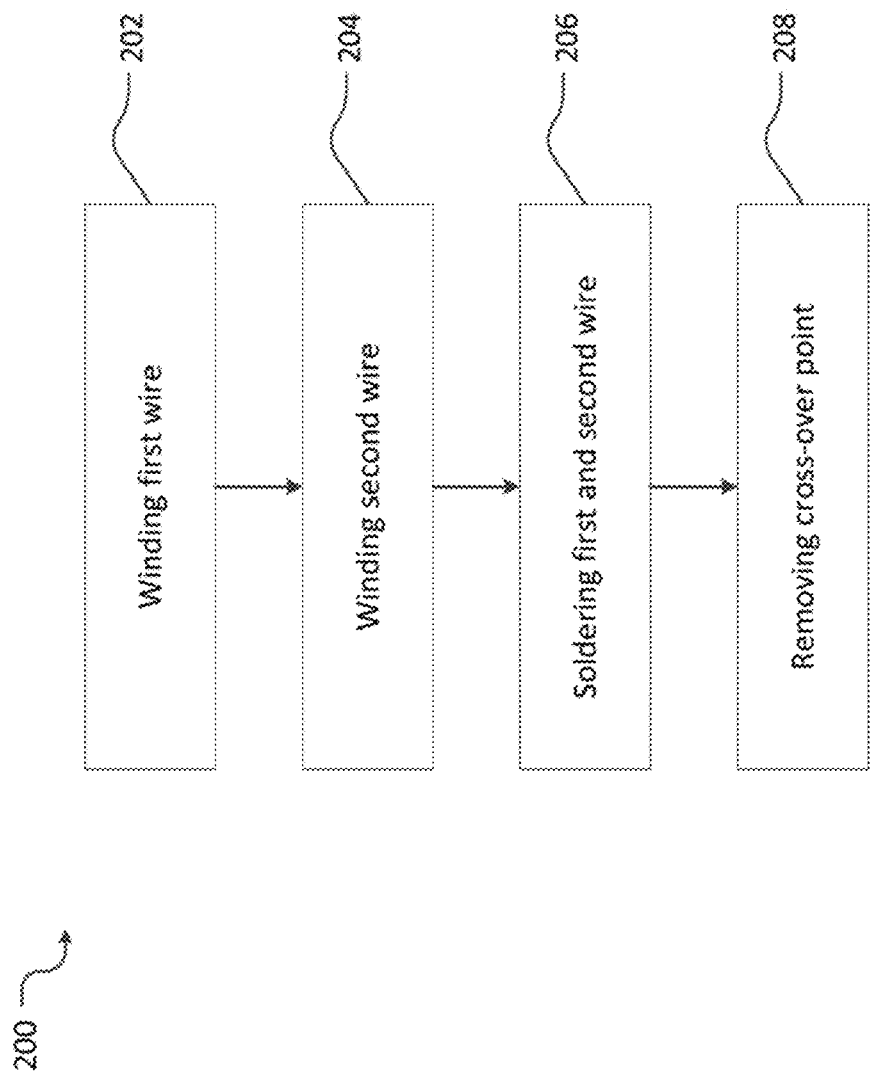
FIG. 2 is a flow diagram showing a method of electrically coupling an segment of an electrical filter for use with differential signals via a switching region, according to at least one exemplary implementation.

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with superconducting processors, such as superconducting devices, coupling devices, and control systems including microprocessors and drive circuitry have not been shown or described in detail to avoid unnecessarily obscuring descriptions of the embodiments of the systems, devices, and methods.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment," or "an embodiment," or "another embodiment" means that a particular referent feature, structure, or characteristic described in connection with the embodiment is included in at least one embodiment. Thus, the appearances of the phrases "in one embodiment," or "in an embodiment," or "another embodiment" in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms "a," "an," and "the" include plural referents unless the content clearly dictates otherwise. Thus, for example, reference to a problem-solving system including "a quantum processor" includes a single quantum processor, or two or more quantum processors. It should also be noted that the term "or" is generally employed in its sense including "and/or" unless the content clearly dictates otherwise.

The headings provided herein are for convenience only and do not interpret the scope or meaning of the embodiments.

The present systems, methods and apparatus describe techniques for the filtering of differential electrical signaling. Specifically, the techniques described herein implement passive electrical filters based on tubular filter geometries. Many different devices exist for the purpose of passive electrical signal filtering. These devices include filters that implement lumped elements such as inductors and capacitors (lumped element filters, or LEFs) and metal powder filters (MPFs). Various embodiments described herein provide passive electrical filters that combine lumped element filtering and metal powder filtering into one tubular filter geometry that is designed for use with differential signaling.

As previously described, differential signaling involves using two signal paths (e.g., wires) to transmit one signal, where a first signal path carries a first signal and a second signal path carries a second signal that is substantially complementary (i.e., substantially equal and opposite) to the first signal. According to this approach, the signal that is ultimately received and utilized by a receiving circuit or receiving device (e.g., receiver) is the difference between the first signal and the second signal. Differential signaling is robust against noise picked up during transmission, since such noise is typically picked up by both the first and second signal paths and canceled out in the receiving circuit or receiving device. Furthermore, differential signaling is well-suited for low-power applications, since the signal that is ultimately utilized by a receiving circuit or receiving device (i.e., the difference between the first signal and the complementary second signal) has a magnitude that is twice that of either of the transmitted signals, thereby increasing the signal-to-noise ratio of the utilized signal.

A known disadvantage to differential signaling is that it necessitates approximately twice as many signal paths (e.g., wires) compared to a similar application of single-ended signaling. Thus, in the filtering of differential signals, it is typically necessary to implement approximately twice as many filters compared to what would be needed if single-ended signaling were used. As is typically seen in the art, this can result in an overly complicated wiring system with many devices and an inefficient use of space. In some applications implementing differential signaling, efficient use of space is an important factor. For instance, in an application of superconducting differential signaling, at least a portion of the electronics may be confined within the dimensions of a refrigeration system, and as more and more wires are needed it can be advantageous to reduce the size and complexity of the filters or filter structures. Thus, there is a need in the art for passive differential signal filters that may be readily manufactured or assembled within a compact volume, while still providing the desired performance and range of frequency response for a wide variety of applications. Accordingly, various embodiments described herein provide individual tubular filter structures (i.e., one or more filters housed in tubular housings), each of the individual tubular filter structures which jointly filters the two signal paths of a differential signal. In some implementations, high performance filtering is achieved through both lumped element filtering and metal powder filtering within a single tubular filter structure.

Those of skill in the art will appreciate that some or all of the various concepts taught in the present systems, methods and apparatus may be applied in designs of low-pass, high-pass, band-pass, and band-stop applications. Throughout the remainder of this specification, specific structures relating to passive low-pass filters are described; however, those of skill in the art will appreciate that the concepts taught herein may be adapted to meet other filtering requirements, such as high-pass, band-pass, and band-stop filtering.

Throughout this specification and the appended claims, the term "signal path" is used to describe a conductive, superconductive, and/or semi-conductive conduit through or upon which an electrical signal may be propagated. In the illustrated embodiments, such paths are realized by wires and/or conductive traces on printed circuit boards (PCBs). However, as previously described, a typical electrical signal may comprise multiple signal frequencies or components and, during filtering, various frequencies or components may follow different signal paths. An electrical filter or tubular filter structure may be designed such that the signal frequency-range of interest propagates through the filter or tubular filter structure while substantially all undesirable frequencies are filtered out, or at least attenuated. Thus, the term "signal path" is used herein to describe the route traveled by the particular electrical signal for which filtering is desired as the electrical signal passes through an electrical filter or tubular filter structure.

The present systems, methods, and apparatus describe various exemplary electrical filters and tubular electrical filter structures (i.e., filter(s) housed in tubular housings), where each structure may be used to jointly filter the two signal paths of a differential signal. As previously discussed, differential signaling typically involves implementing two signal paths (e.g., wires) per signal, which typically necessitates two separate filters per signal. Various embodiments described herein provide systems, methods and apparatus for jointly filtering the two signal paths of a differential signal within one tubular filter structure.

Rather than using two single-ended filters structures to each individually filter a respective one of the two signal paths of a differential signal, various implementations described herein provide a single tubular differential filter structure that jointly filters the two signal paths of a differential signal. In this way, twice as many signal paths (e.g., wires) may be filtered, and with better performance, within any given spatial dimensions. Performance may be improved, for example, by increasing attenuation in high frequency regions.

In some examples, a tubular differential filter structure that jointly filters the two signal paths of a differential signal may include lumped elements (i.e., lumped element filter) to provide lumped element filtering. In applications where it is desirable to remove frequencies in the microwave range, such a tubular differential filter structure may include one or more structures that cause high frequency attenuation, such as increased length of wire with resistive cladding and/or a metal powder epoxy mixture to realize a metal powder filter. The principles governing the operation of typical metal powder filters are described in F. P. Milliken et al., 2007, Review of Scientific Instruments 78, 024701 and U.S. Pat. No. 8,441,329.

The present systems, methods, and apparatus describe embodiments of a differential electrical filter that is tubular in geometry (hereinafter referred to interchangeably as a "differential tubular filter" or "differential tubular filter structure"). While a cylindrically tubular structure is typically preferred, other tubular structures can be employed for certain applications, for instance elliptical tubular structures, hexagonal, octagonal, square or rectangular tubular structures. A plurality of lumped elements (e.g., inductors and capacitors) connected to at least one printed circuit board (PCB) provide the filtering, while the tubular aspect relates to a tubular, preferably cylindrical, shield in which the lumped elements may be enclosed. In accordance with the present systems, methods and apparatus, at least a portion of a PCB may serve as the core for at least the bottom or inner coils of an electrical filter for use in jointly filtering the two signal paths of a differential signal. As previously discussed in U.S. Pat. No. 9,231,181, bottom or inner coils may each serve as a respective core for a respective top or outer coil.

In any of the implementations, the PCB may include or take the form of a dielectric substrate, such as FR4. In an of the implementations, the PCB may serve as both a signal-carrying device and as a structural device in a manner similar to that described in U.S. Pat. No. 8,008,991. Various implementations described herein provide adaptations and modifications to the teachings of U.S. Pat. No. 8,008,991 in order to achieve joint filtering of the two signal paths of a differential signal.

Any of the implementations described herein can incorporate wires and conductive traces in tubular filter structures. In some applications, it may be desirable to use these tubular filter structures to filter electrical signals where the wire or other parts of the filter environment are superconductive. Thus, in any of the implementations, the various wires and coiled inductors may be formed of a material that is superconducting below a critical temperature. An example of such a material is niobium, or niobium-titanium with resistive cladding, for example copper-nickel cladding, though those of skill in the art will appreciate that other superconducting materials may similarly be used.

Furthermore, in any of the implementations, the various conductive traces may be formed of a material that is superconducting below a critical temperature. In PCB technology, a typical approach for providing superconducting traces is to first lay out the conductive traces on the surface of the PCB using a non-superconducting metal (e.g., copper) and then to plate the surface of the non-superconducting metal with a superconducting metal (e.g., tin). Again, those of skill in the art will appreciate that materials other than those given as examples herein may similarly be used.

In any of the implementations that incorporate superconducting components, it can be advantageous to form superconducting connections that for superconducting signal path at joint regions. Thus, in any of the implementations, the signal paths may be entirely superconducting from input to output in a tubular filter structure. One method to implements a signal path that entirely superconducting is to solder joint regions. This method may be suitable for joint regions that are small in size. However, in any implementations at least one superconducting signal path may be interrupted by non-superconducting segments.

FIGS. 1A, 1B, 1C, and 1D shows an example segment 100*a* of an electrical filter 100, according to at least one illustrated implementation, which can, for example, be a component in a differential tubular filter structure (not shown in FIG. 1A). In FIGS. 1A-1D segment 100*a* comprises two identical inductors. In particular, FIG. 1A illustrates segment 100*a* at an intermediate point during fabrication. FIG. 1B illustrates segment 100*a* after fabrication. FIGS. 1C and 1D are cross-sectional views along section lines 1C and 1D, respectively, through segment 100*a*. Segment 100*a* and its fabrication are described in more detail below with reference to FIGS. 1A, 1B, 1C, and 1D.

As illustrated in FIG. 1A, segment 100*a* comprises a PCB 102. A differential tubular filter structure can comprise one or more instances of segment 100*a* electrically coupled in series with one another. Segment 100*a* comprises a first region 104, and a second region 106, separated by an adjoining switching region 108.

As illustrated in FIG. 1C, in first region 104 of segment 100*a*, PCB 102 is wound by an inner-outer coil pair 110, the inner-outer coil pair 110 comprising an inner coil 110*a* and an outer coil 110*b*.

As illustrated in FIG. 1D, in second region 106 of segment 100*a*, PCB 102 is wound by an inner-outer coil pair 112, the inner-outer coil pair 112 comprising an inner coil 112*a* and an outer coil 112*b*.

The inner coil of each inner-outer coil pair 110, 112 can also be referred to as the bottom coil of the coil pair. The outer coil of each inner-outer coil pair 110, 112 can also be referred to as the top coil of the coil pair.

As illustrated in FIG. 1B, segment 100a after fabrication comprises two signal paths. In some implementations, it can be advantageous for each signal path to include one inner coil and one outer coil. For example, it can be advantageous for a first signal path to include inner coil 110a and outer coil 112b, and for a second signal path to include outer coil 110b and inner coil 112a.

The fabrication of segment 100a can be simplified by, in a first act or operation, winding a first wire 114 in first region 104 to form inner coil 110a, and in second region 106 to form inner coil 112a, and, in a second act or operation, winding a second wire 116 over inner coil 110a to form outer coil 110b, and over inner coil 112a to form outer coil 112b. First wire 114 and second wire 116 can each comprise a length of continuous wire.

As shown in FIG. 1A, wires 114 and 116 can be made to follow different routes across switching region 108. Switching region 108 comprises a first conductive trace 118 and a second conductive trace 120. Traces 118 and 120 are electrically isolated from one another. First wire 114 passes through notch 122 on switching region 108, across the front surface of switching region 108, and through notch 124. Second wire 116 passes through notch 126, across the front of switching region 108, and through notch 128, thereby crossing over (or under) wire 114 at a cross-over point 125.

To achieve the desired signal paths, first wire 114 can be electrically coupled to first conductive trace 118 and to second conductive trace 120, and second wire 116 can be electrically coupled to second conductive trace 120 and first conductive trace 118. Both first wire 114 and second wire 116 can be cut or terminated between traces 118 and 120 (for example at or near cross-over point 125) thereby breaking electrical coupling between first conductive trace 118 and second conductive trace 120.

The result is illustrated in FIG. 1B. First wire 114 has been cut into two parts 114a and 114b, and second wire 116 has been cut into two parts 116a and 116b. The first signal path is via wire 114a through inner coil 110a of FIG. 1C, first conductive trace 118, and wire 116b through outer coil 112b of FIG. 1D. The second signal path is via wire 116a through outer coil 110b of FIG. 1C, second conductive trace 120, and wire 114b through inner coil 112a of FIG. 1D.

In differential tubular filter structures comprising more than one segment 100a, and where the electrical filters are immersed in metal powder epoxy to realize high frequency attenuation, both signal paths may include approximately the same number of inner coils as the number of outer coils. In any implementation it is advantageous for the inner and the outer coil to have the same or similar stray capacitance to implement a pair of approximately identical inductors. In any implementation, including those previously discussed, first wire 114 and second wire 116 may be wound in the same direction in first region 104 and second region 106. In any implementations, including those previously discussed, PCB 102 can comprise a dielectric substrate, with or without electrical conductive traces.

In any implementation, including those previously discussed, inner coils 110a and 112a may have a different number of turns than the number of turns of outer coils 110b and 112b for differential mode signaling. In any implementation, including those previously discussed, the inner coils may have a larger number of turns than the outer coils.

The implementations, including those previously discussed, can be used for differential filters operating at low or cryogenic temperatures employing wires from a material that will become superconductive below a range of critical temperatures.

Superconductive connections are commonly obtained by welding (e.g., welds) or clamping (e.g., clamps) structures and methods as described in European Patent No 0148479A2 and U.S. Pat. No. 3,200,368. However, such methods are impractical for the present system and apparatus, owing to its small size. The switching region can be small enough to render welding or clamping difficult and ineffective for such short lengths of wires. In any implementation, including those previously discussed, the size of switching region 108 can be less than 3 mm×6 mm, and the size of each of conductive traces 118 and 120 can be lea than 1 mm×4 mm.

FIG. 2 shows a method 200 of fabricating segment 100a of FIGS. 1A, 1B, 1C, and 1D for use with differential signaling to achieve electrical coupling between two lengths of wire that may become superconductive below a critical temperature. Method 200 includes forming inner-outer coil pairs from wire, and electrically coupling the coil pairs to form two signal paths, with both signal paths having the same, or at least a similar, exposure to metal powder epoxy in tubular filters. Method 200 includes four acts 202-208, though those skilled in the art will appreciate that in alternative embodiments certain acts may be omitted and/or additional acts may be added. Those skilled in the art will appreciate that the order of the acts is shown for exemplary purposes only and may change in alternative embodiments. Method 200 is described in reference to segment 100a of FIGS. 1A, 1B, 1C, and 1D.

At 202, a first length of continuous wire 114 is wound over PCB 102 in first region 104 to form inner coil 110a, through notch 122, over the front of switching region 108, through notch 124 and over PCB 102 in second region 106 to form inner coil 112a.

At 204, a second length of continuous wire 116 is wound around inner coil 110a to form outer coil 110b. The second length of continuous wire is passed through notch 126, over the front of switching region 108 (passing under or over first length of wire 114 at or near wire cross-over point 125), though notch 128, and then wound around inner coil 112a to form outer coil 112b.

At 206, each of the first and the second length of wire is soldered (e.g., solder joint or solder connection), or otherwise electrically coupled, to each of conductive traces 118 and 120. Soldering allows for a smaller electrical coupling, and therefore can be used in a switching region sufficiently small to make other methods of electrical coupling impractical, or at least more difficult. The soldering procedure can be performed with little special training or experience. At the end of the soldering procedure, each of the first and the second lengths of wire are electrically coupled to both conductive traces 118 and 120. The soldering procedures is described in more detail with reference to FIGS. 3, 4, 5, 6, and 7.

At 208, the electrical coupling between the first and the second conductive traces 118 and 120 is removed by cutting or removing the first and the second lengths of wire between traces 118 and 120, for example at or near cross-over point 125. After removing the electrical coupling between conductive traces 118 and 120, segment 100a has a first signal path comprising inner coil 110a and outer coil 112b, and a second signal path comprising outer coil 110b and inner coil 112a.

Figure 3:
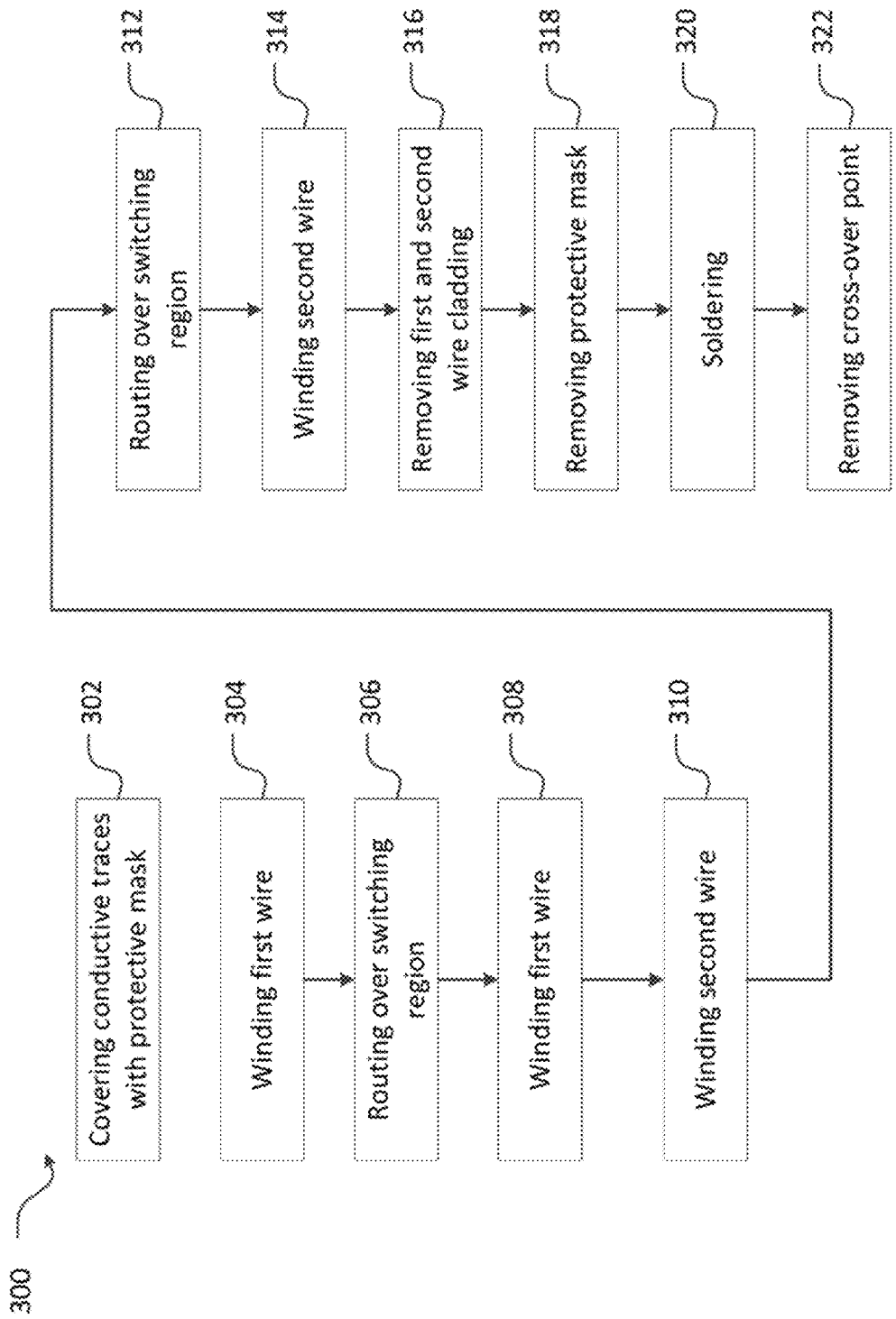
FIG. 3 is a flow diagram showing a method of electrically coupling a segment of an electrical filter for use with differential signals via a switching region, according to at least one exemplary implementation.

FIG. 3 shows an exemplary method 300 for assembling segment 100a of FIG. 1B for use with differential signaling to achieve superconductive electrical coupling via switching region 108. As previously described, switching region 108 of FIG. 1B includes two conductive traces 118 and 120 to which the first and the second lengths of wire can be soldered. In some embodiments, conductive traces 118 and 120 are copper pads plated with white tin. Tin, or any other superconducting alloy, can be used in preparation to solder (e.g., form solder joints or connections) the first and the second lengths of wire to conductive traces 118 and 120.

In some embodiments, high-frequency attenuation can be increased by cladding superconductive wire core that form the two signal paths with an electrically resistive material. The electrically resistive cladding is generally a high-resistivity cladding such as a copper-nickel alloy over a superconductive wire core. In order to create a superconductive junction, the electrically resistive material must be removed and the superconductive wire core exposed before soldering. Those skilled in the art will appreciate that various methods can be employed to expose the superconductive wire core, and that the electrically resistive cladding can be removed in situ during fabrication of segment 100*a*.

The first and the second lengths of continuous wire typically comprise a layer of electrically insulating material on the outside of the electrically resistive cladding. In the description below, it is assumed that the layer of electrically insulating material, also referred to as wire insulation, is stripped from the wire in sections where the wire is to be soldered or otherwise electrically coupled to traces 118 and 120.

Method 300 includes acts 302-322, though those skilled in the art will appreciate that in alternative embodiments certain acts may be omitted and/or additional acts may be added. Those skilled in the art will appreciate that the order of the acts is shown for exemplary purposes only and may change in alternative embodiments. Method 300 is described in reference to electrical filter 100 of FIGS. 1A, 1B, 1C, and 1D.

At 302, conductive traces 118 and 120 in switching region 108 of electrical filter 100 are covered with a protective mask. The protective mask can help to reduce the damage to conductive traces 118 and 120 during exposing of the wire cores of the first and the second lengths of conductive wire. The protective mask can be selected so that, subsequently, it can be easily removed from the conductive traces to allow for soldering of the first and the second lengths of conductive wires. In some implementations, the protective mask may be removed with little or no damage to the conductive traces. A solder mask may also be used over the conductive traces, for example when the conductive traces are white tin-plated copper. A solder mask typically has weak adhesion on white tin and therefore can be easily removed, while being sufficient to protect the conductive traces during the etching of the wires.

At 304, a first length of wire 114 is coiled over first region 104 of the dielectric substrate forming an inner coil.

At 306, the first length of wire passes through notch 122, over the front surface of switching region 108 and through notch 124, thereby passing over each of conductive traces 118 and 120, covered at 302 by the protective mask.

At 308, the first length of wire is wound around second region 106 of the dielectric substrate forming an inner coil.

At 310, a second length of wire 116 is wound around first region 104 of the dielectric substrate around the outside of the inner coil forming an outer coil and forming inner-outer coil pair 110.

At 312, the second length of wire passes through notch 126, over the front surface of switching region 108 and through notch 128, thereby passing over each of the conductive traces, covered at 302 by the protective mask, and passing over or under the first length of wire and intersecting it at or near wire cross-over point 125.

At 314, the second length of wire is wound around second region 106 of the dielectric substrate and around the outside of the inner coil forming an outer coil and forming inner-outer coil pair 112.

At 316, the first and the second length of s wire are opened to expose the superconductive wire core by removing the electrically resistive cladding. A person skilled in the art will appreciate that opening of the wire to expose the superconductive wire core can be achieved in different ways. For example, the first and the second wire may be first stripped of wire insulation and then etched in situ. Ferric chloride, for example, can be used as an etchant. The protective mask over first and second conductive traces 118 and 120 can eliminate, or reduce, damage caused by the etchant to first and second conductive traces 118 and 120.

Switching region 108 can be heated to reach a threshold temperature (or lie within a temperature region) at which the etchant will be corrosive to the electrically resistive cladding. Switching region 108 is maintained at the temperature to which it has been heated, and switching region 108 is kept in contact with the etchant for a period of time. The period of time is selected to cause the etchant to remove the electrically resistive cladding without damaging the superconductive wire core. The temperature and time can vary depending on the etchant used and the thickness of the resistive cladding.

At the end of 316, the middle portion of each of the first and the second length of continuous wire that has been opened is fully, or at least mainly, clear of electrically resistive cladding, while at the edge of the opened area there is a tapered portion of the electrically resistive cladding remaining.

At 318, the protective mask is removed from first and second conductive traces 118 and 120, respectively, fully, or at least mainly, exposing first and second conductive traces 118 and 120.

At 320, the first and the second length of wires are soldered to first and second conductive traces 118 and 120. The solder joint fully, or at least mainly, covers the surface area of first and second conductive traces 118 and 120, respectively, and, in particular, covers, at least mostly, the area with the tapered portion of electrically resistive cladding remaining. The soldering process over the area of the first and the second conductive traces results in a pressure force between the first and the second length of wire and the solder joint that is caused by contraction of the soldering material during solidification and that holds the wires in electrical contact with the traces to provide a superconductive connection. Further cooling of soldering material and wires, including cooling at low or cryogenic temperatures, causes an additional pressure between the first and the second length of wire and the solder joint due to the difference in thermal contraction of the wires and the soldering material.

At 322, the wire cross-over between conductive traces 118 and 120 is removed (by cutting each of the wires between traces 118 and 120), and the signal path is switched from the inner coil in first region 104 to the outer coil in second region 106, and from the outer coil in first region 104 to the inner coil in second region 106.

FIG. 4A is a cross-sectional view along section line 4 of switching region 108 of FIG. 1A before fabrication, showing PCB 102 and conductive traces 118 and 120.

FIG. 4B is a cross-sectional view along section line 4 of switching region 108 of FIG. 1A during fabrication, showing a protective mask 402 positioned over conductive traces 118 and 120. Protective mask 402 can cover some or all of switching region 108 and can shield conductive traces 118 and 120 from etchant. In any of the implementations, protective mask 402 may cover only, or mainly, conductive traces 118 and 120.

FIG. 4C is a cross-sectional view along section line 4 of switching region 108 of FIG. 1A showing the relative position of wire 114, wire 116, conductive traces 118 and 120 and a protective mask 402.

After protective mask 402 is placed over conductive traces 118 and 120, wires 114 and 116 are passed over switching region 108 and protective mask 402. Wires 114 and 116 comprise an electrically resistive cladding 404 and a superconductive wire core 406. Wire 116 can pass over or under wire 114, over switching region 108 and protective mask 402.

Electrically resistive cladding 404 needs to be removed to open superconductive wire core 406 to the soldering process. Many etchants are available to dissolve electrically resistive cladding 404, an example of etchant is ferric chloride. The etchant can be applied directly over wires 114 and 116. Those skilled in the art will notice that a higher amount of etchant is generally applied in the middle of the wires over the switching region 108 owing to the shape of a drop of etchant.

FIG. 5A shows the effect of etching of electrically resistive cladding 404 from FIG. 4C over switching region 108 over PCB 102. Superconductive wire core 406 is exposed in a region 502, and, at the edges of region 502, a portion 504 of electrically resistive cladding 404 has an approximately conical shape. Similarly, wire 116 (not shown in FIG. 5A) has an exposed region of superconductive wire core surrounded by tapered electrically resistive cladding of approximately conical shape.

After the etching process has removed the electrically resistive cladding from wires 114 and 116 in switching region 108, protective mask 402 is removed to allow soldering to provide electrical coupling between wires 114 and 116, and conductive traces 118 and 120. During the soldering process, solder joint 506 covers both exposed region 502 and at least a portion of tapered electrically resistive cladding 504, as shown in FIG. 5B. The soldering process further partially dissolves electrically resistive cladding 404, producing tapered surface 508. At the end of tapered surface 508, there will be a region 502a that has not previously been exposed to air or etchant, and will therefore be clean of impurities and/or have no oxidation and may be beneficial for creating superconductive electrical couplings. After the soldering process, the area of superconductive wire core that is free of electrically resistive cladding 502b is larger than the previous exposed area of region 502.

Solder joint 506 also covers both the exposed area and at least a portion of the tapered electrically resistive cladding of wire 116 (not shown in FIG. 5A) further dissolving the electrically resistive cladding in a manner similar to wire 114.

The solidification of the solder joint 506 causes a contraction of the solder material that causes a pressure force between the superconductive wire cores and the solder joint. Additional cooling below the critical temperature of the solder material and wires will further increase the pressure between the superconductive wire cores and the solder joint.

The coefficient of thermal contraction of the solder alloy is typically approximately twice the coefficient of thermal contraction of the niobium-titanium wire core. The difference in thermal contraction causes significant mechanical pressure between the solder alloy and the superconductive wire cores to provide a superconductive electrical coupling between the solder alloy and the wire cores. This effect produces a superconductive junction at switching region 108 even if the superconductive wire core is not a solderable material, for example if the superconductive wire core comprises niobium-titanium.

Figure 6:
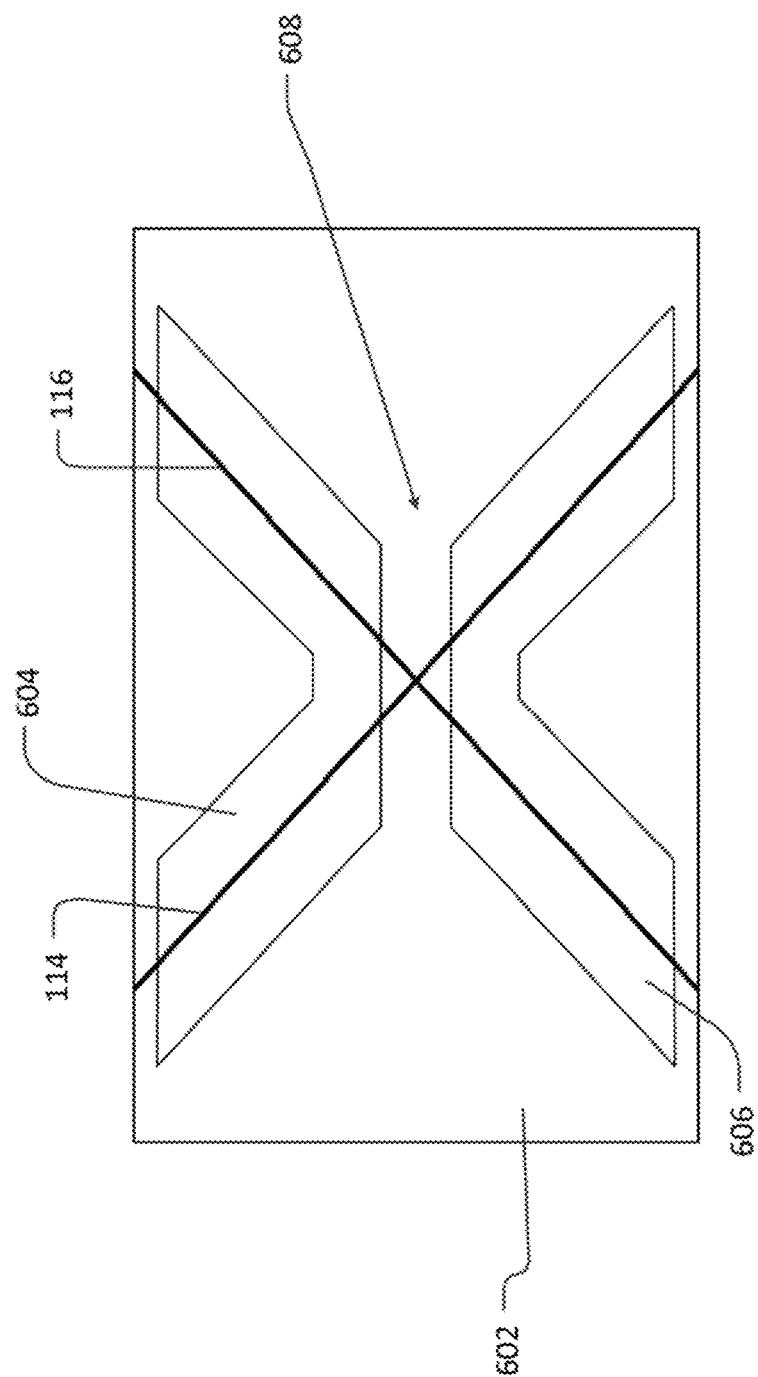
FIG. 6 is a schematic diagram of a switching region in a segment of an electrical filter, showing two wires and a shape of the conductive traces.

FIG. 6 is schematic diagram of another example of a switching region 602 in a segment of an electrical filter such as segment 100a of FIG. 1B. Switching region 602 comprises two conductive traces 604 and 606. Conductive traces 604 and 606 of switching region 602 can have a characteristic shape. The shape of conductive traces 604 and 606 can be selected to facilitate soldering.

As shown in FIG. 6, conductive traces 604 and 606 can have a wide area under the wires, and can be separated by a narrow neck area 608. The characteristic shape illustrated in FIG. 6 facilitates the soldering of one wire without disturbing the solder junction of the other wire. Narrow neck 608 between conductive traces 604 and 606 can keep solder on conductive trace 604 from merging with solder from conductive trace 606, and vice versa.

Any of the various implementations described herein provide input/output systems and devices for use with superconducting devices, such as superconducting computing devices. These systems and devices provide filtering, shielding, and thermalization of communication paths that connect between room temperature electronics and the superconducting devices that make up, for example, a superconducting quantum processor.

As described before, in implementations that incorporate superconducting components, it can be advantageous to form superconducting connections at solder joints using superconducting solder. Thus, in any of the implementations, the signal paths may be entirely superconducting from input to output in a tubular filter structure. Alternatively, in any of the implementations, at least one superconducting signal path may be interrupted by non-superconducting segments.

Figure 7:
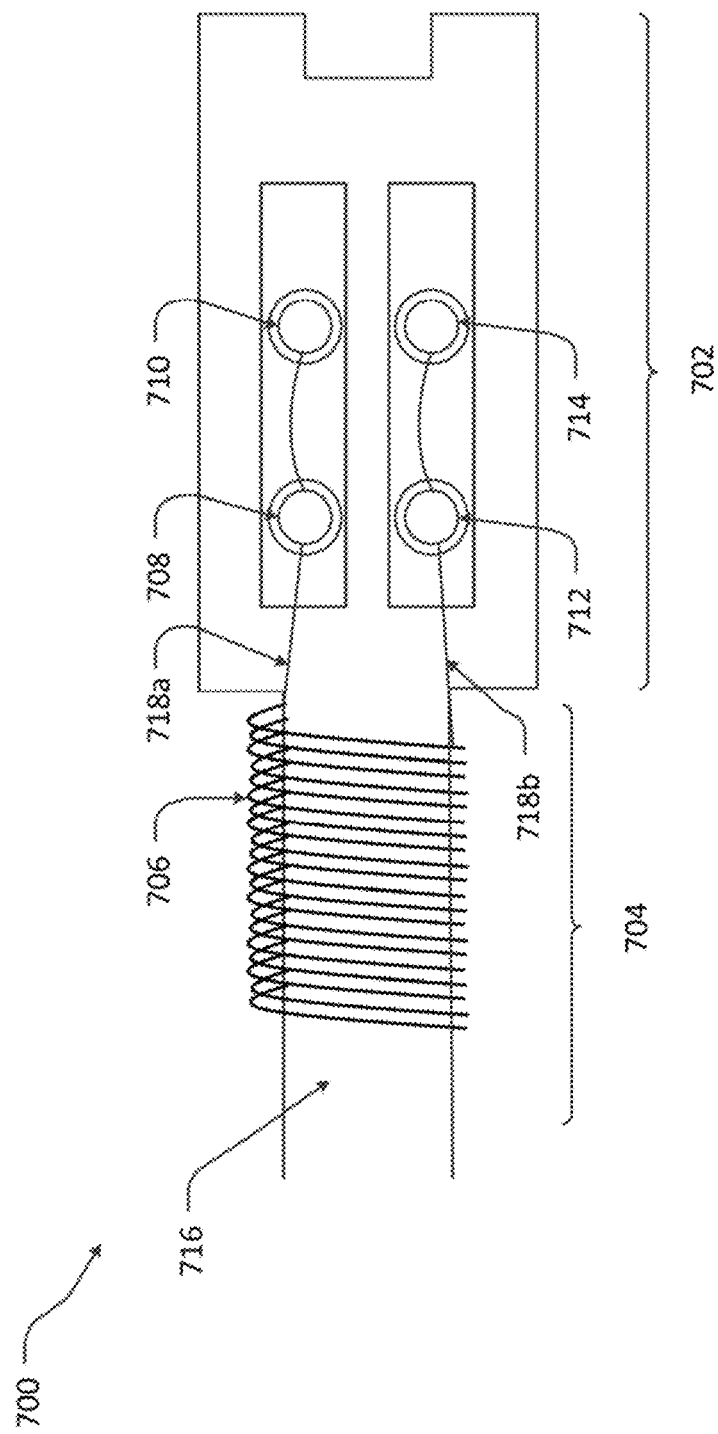
FIG. 7 is a plan view of a segment of an electrical filter, according to at least one exemplary implementation the electrical filter comprising a printed circuit board with lumped elements for use in a tubular filter structure, showing the connection of the wires in an input/output region.

FIG. 7 is a top plan view of a portion 700 of a filter comprising a printed circuit board with lumped elements for use in a tubular filter structure, according to at least one implementation, showing the connection of the wires in an input/output region 702. Cables or wires external to portion 700 of a filter (not shown in FIG. 7) may be electrically coupled to a filter via input/output region 702. To provide superconductive connections at the input and output of filter devices such as those that employ segment 100a of FIG. 1A-1D an input-output region can be used. The input-output region 702 is positioned at the end of a region 704 where inner-outer coil pair 706 is wound. Input-output region 702 has at least two through-holes (e.g. through-holes 708 and 710, and 712 and 714) in a PCB 716 for each wire. In FIG. 7, through-holes 708 and 710 allow passage of a wire 718a, and through-holes 712 and 714 allow passage for a wire 718b. Through holes 708 through 710 may be plated to provide superconductive electrical coupling.

FIG. 8 shows an exemplary method 800 for connecting input-output region 702 of FIG. 7 for use with differential signaling to achieve superconducting connections. Method 800 includes five acts 802-810, though those skilled in the art will appreciate that in alternative embodiments certain acts may be omitted and/or additional acts may be added. Those skilled in the art will appreciate that the order of the acts is shown for exemplary purposes only and may change in alternative embodiments.

At 802, wires 718a and 718b from the inner-outer coil pair 706 are extended. It can be advantageous to extend wires 718a and 718b over a work surface while at the same time ensuring that inner-outer coil pair 706 remain undisturbed.

At 804, each of wires 718a and 718b is stripped of its wire insulation.

At 806, each of wires 718a and 718b is opened to expose the superconductive wire core by removing the electrically resistive wire cladding over at least part of the length of extended wire. As previously described, an etchant can be used to remove the electrically resistive cladding.

At 808, the portion of the wire 718a that has been opened is wound through holes 708 and 710. The purpose of the winding is to anchor wire 718a to PCB 716 and provide a superconductive electrical coupling. To this end, wire 718a can be wound a number of times as necessary to obtain sufficient anchoring of the wire. Similarly, wire 718b is wound through through-holes 712 and 714 a number of times to obtain a sufficient anchoring of the wire and provide a superconductive electrical coupling.

At 810, the wires are soldered with the soldering material fully, or at least mostly, covering the wires and filling the through-holes. Through-holes 708-714 are filled to ensure that wires 718a and 718b are covered more thoroughly with soldering material.

As described before, the solidification of the soldering material creates a pressure on wires 718a and 718b (or equivalently causes a binding force) owing to thermal contraction. Additional cooling of the filter device further increases the pressure between wires 718a and 718b and the soldering material, thus increasing the critical temperature to produce a superconductive junction at a higher temperature than otherwise.

Filter Matching

The present systems, methods, and apparatus can provide electrical communication between room temperature electronics and colder temperatures. The present systems, methods, and apparatus can be used for differential filters operating at low temperatures employing wires comprising a material that will become superconductive below a critical temperature. Such filters can employ low-frequency control lines that run between electronics at room temperature and electrical components at low temperatures for which the electronics is superconductive.

One of the components of these control lines are low-pass filters such as those described above. It is typically desirable that the low-pass filters reduce the out-of-band noise such that the out-of-band blackbody thermal temperature is near the base temperature of the environment which is below a range of critical temperatures. The environment may include a dilution refrigeration system.

The present systems, methods, and apparatus relate to electrical differential filters and input/output (I/O) circuits for providing electrical signals in a superconductive environment while reducing the effects of room temperature noise and while reducing heating effects in the filters. The superconductive environment may include superconducting devices comprising, for example, a superconducting quantum processor.

Signal integrity at the superconductive device can generally be improved if the impedances of the filter and the I/O are matched. One approach is to add a room temperature termination resistor to provide impedance matching. A shortcoming of this approach is that it can introduce Johnson noise to the circuit, and some of the control lines that operate the superconductive device can be sensitive to noise.

FIG. 9A is a schematic diagram of an exemplary circuit 900a for terminating an I/O line. In any implementation, circuit 900a may include a 3 MHz line. Circuit 900a comprises a current source 902 and a matching source resistor 904, both situated at room temperature. Electrical filter 906 and superconducting device 908 are below a range of critical temperatures for which electrical filter 906 and superconducting device 908 are superconductive.

Resistor 904 can introduce noise to superconductive device 908, and can affect the performance of superconductive device 908. To reduce the effect of noise from resistor 904, it can be advantageous to place an impedance-matching network of resistors at the same temperature as electrical filter 906 and superconductive device 908. The noise contribution from the impedance-matching network is lower than the noise introduced by resistor 904.

To reduce the noise introduced by source resistor 904, it can be desirable to select a high level of attenuation at the matching network. The voltages required at the matching network to reduce the room-temperature noise to acceptable levels can become impractical. In addition, significant power is dissipated at the matching network, causing higher work load to maintain superconductive temperatures at filter 906 and superconductive device 908.

FIG. 9B shows a schematic diagram of an exemplary circuit 900b terminating an I/O line to reduce room-temperature source noise. In circuit 900b, resistor 904 can be replaced by a single resistor 910 connected to ground, and positioned within the circuit below a range of critical temperatures.

In circuit 900b, the impedance matching can be desirable for electrical filter 906. In any implementation, the transmission line can be approximately 2 m long, and electrical filter 906 is operated at 3 MHz. For this reason, transmission line impedance can be less significant, taking into account that the transmission line length is much less than the wavelength of the electrical signal, and resistor 904 (at room temperature) can be eliminated.

Packaging

The present system, method, and apparatus describe techniques for packaging a superconductive device, for instance a superconductive processor. One example of a superconductive processor is a quantum processor.

The superconductive device can be formed of materials that become superconductive below a critical temperature. Heat generated during operation of the superconductive device can cause the temperature of the superconductive device to rise, thereby decreasing performance. It can be beneficial to dissipate the heat generated during operation of the superconductive device.

In an example, where the superconductive device is a processor, one approach to dissipating heat from the processor is to gold-plate the underside of the processor, and place the gold-plated underside of the processor in thermal contact with a non-superconducting metal surface. The metal surface can act as a metal thermalizing carrier to dissipate heat from the processor. The metal surface can, for example, be the surface of metal carrier such as a bulk piece of gold or copper having approximately the same area as the area of the underside of the processor.

One technical challenge is the difference in Integral Thermal Expansion between the processor and the metal carrier. The processor is typically fabricated on a silicon substrate, and the Integral Thermal Expansion coefficient of silicon is approximately 2.16E-4 from room temperature to the millikelvin range. The Integral Thermal Expansion coefficient of copper is approximately 32.6E-4. The difference in thermal expansion means that, when the processor is clamped to the metal carrier, the processor can be prone to cracking when cooled to cryogenic temperatures.

Some freedom to physical contract during cooling on the part of the processor can help to reduce or eliminate the risk of cracking. On the other hand, effective thermalization can depend on a tight thermal coupling of the processor to the metal carrier.

One approach to reducing or eliminating the risk of cracking is to insert an additional metal layer between the processor and the metal carrier. The additional metal layer can be selected to have an Integral Thermal Expansion coefficient near the Integral Thermal Expansion coefficient of the silicon processor. The additional metal layer can act as a buffer, and can allow some freedom of contraction to the processor.

The additional metal layer can, for example, be a thin tungsten shim attached to the underside of the processor with an adhesive, for example a silver epoxy. Those skilled in the art will appreciate that another metal layer having an Integral Thermal Expansion coefficient near the Integral Thermal Expansion coefficient of the silicon processor could be employed.

In any implementation, more than one additional metal layer can be inserted between the processor and the metal carrier. While reducing the risk of cracking of the processor on cooling, the further additional layers can reduce the effectiveness of heat dissipation. It can be desirable to select the number of additional layers to achieve a suitable balance between the effectiveness of heat dissipation from the processor and the risk of cracking of the processor during cooling.

The superconducting processor is typically electrically coupled to room temperature electronics via an input-output system. The processor can be electrically coupled to the input-output system using wirebonds such as aluminum wirebonds. During wirebonding, it is desirable for the processor to be held rigidly in place to produce reliable bonds. After wirebonding, it is also desirable for the processor to be held rigidly in place to avoid causing stress to the wirebonds that could result in wirebond breakage. It can present technical challenges to clamp the processor from the top during wirebonding, as a pressure clamp placed over the processor can interfere with the wirebonding tools.

One approach is to use a vacuum to clamp the processor to the metal carrier on the underside of the processor. This approach eliminates or reduces the need for using adhesives and/or applying pressure from the top of the processor.

Figure 10:
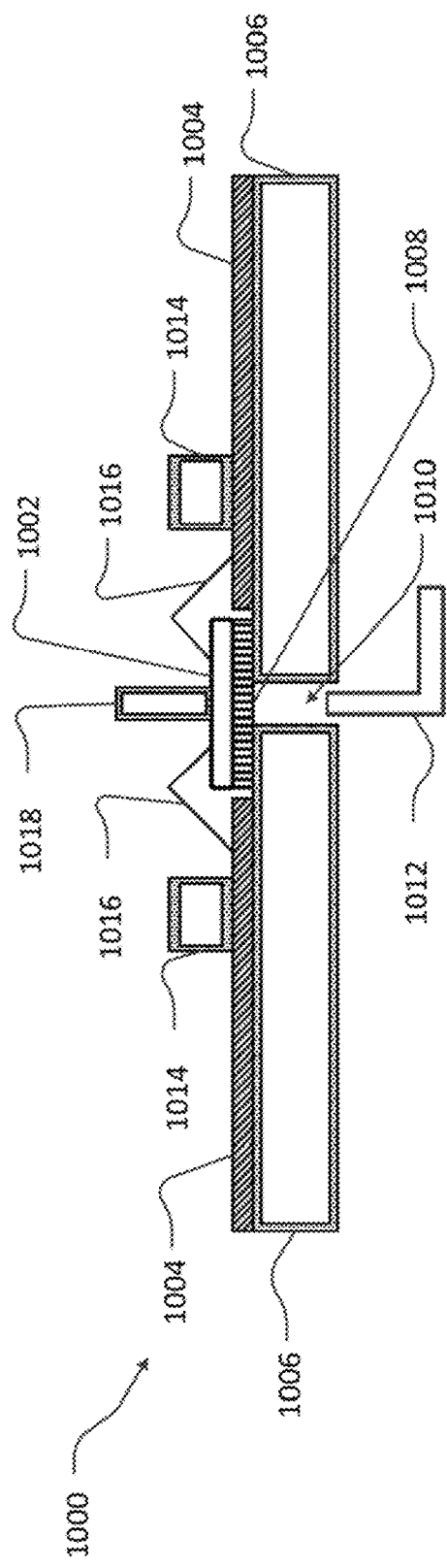
FIG. 10 is a cross-sectional view of a system for wire-bonding a superconductive device to a printed circuit board and thermally coupling the superconductive device to a metal carrier.

FIG. 10 shows an exemplary apparatus 1000 for wirebonding a processor 1002 to a PCB 1004 and thermally coupling processor 1002 to a metal carrier 1006. Processor 1002 can include a superconducting processor such as a quantum processor.

Processor 1002 has a gold-plated underside surface 1008 gold plated and is positioned over a through-hole 1010 of metal carrier 1006 such that the center of processor 1002 is approximately aligned with through-hole 1010. Metal carrier 1006 can also be gold-plated to improve the thermal coupling with processor 1002 via underside surface 1008.

A vacuum pump 1012 can apply a vacuum via through-hole 1010 to hold processor 1002 firmly in place during wirebonding. A side clamp 1014 can be applied to hold PCB 1004 firmly in place over metal carrier 1006. The side clamp 1014 can be a hollow clamp with the same, or similar, shape as processor 1002, and having larger dimensions so as to surround or encompass the processor and not interfere with the wirebonds (such as wirebonds 1016—only two shown in FIG. 10).

Similarly, after wirebonding is complete, a top clamp 1018 can be applied to processor 1002 from the top. Top clamp 1018 provides pressure on the processor 1002 to assist thermalization. Top clamp 1018 can be a gold-plated copper, sapphire, parylene-coated copper and/or silicon top clamp. A parylene-coated copper top clamp 1018 may be used when processor 1002 may have metal conductors on its surface to avoid short-circuit forming between processor 1002 and top clamp 1018. The use of a vacuum provided by vacuum pump 1012 can be applied during wirebonding and removed after the wirebonds are in place.

Apparatus 1000 can provide direct thermal conduction between processor 1002 and metal carrier 1006, reducing or eliminating the need for adhesive and/or intermediate layers. In addition, apparatus 1000 can hold processor 1002 in place during wirebonding.

Figure 11:
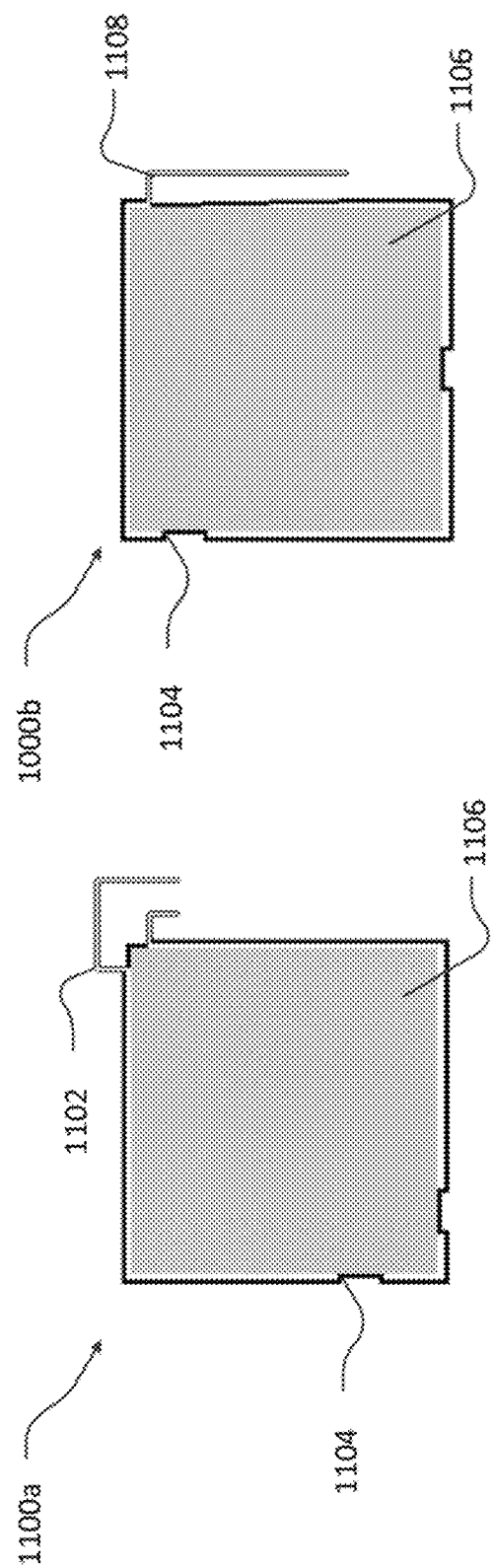
FIG. 11A is a top plan view of a printed circuit board with a corner clamp.
FIG. 11B is a top plan view of a printed circuit board with a side clamp.

FIG. 11A and FIG. 11B are schematic drawings illustrating an alternative apparatus 1100a and 1100b to the apparatus 1000 of FIG. 10. Apparatus 1100a comprises a corner spring clamp 1102 attached via one or more grooves 1104 (only one called out in FIG. 11A) cut in PCB 1106, thereby reducing the space available in the PCB so that a processor will be slightly larger than the space available. Grooves 1104 can, for example, be cut in PCB 1106 during fabrication of PCB 1106. When a processor is inserted, corner clamp 1102 flexes and holds the processor in place. Corner spring clamp 1102 can hold a processor (not shown in FIG. 11A) in place during wirebonding in the absence of a vacuum or in the event a vacuum applied to the underside of the processor fails.

Apparatus 1100b comprises a side spring clamp 1108 attached via grooves 1104 cut in PCB 1106. Side spring clamp 1108 can hold the processor (not shown in FIG. 11B) in place during wirebonding in the absence of a vacuum or in the event a vacuum applied to the underside of the processor fails. Similarly to corner clamp 1102, side spring clamp flexes when a processor is inserted, thus holding a processor in place.

Figure 12:
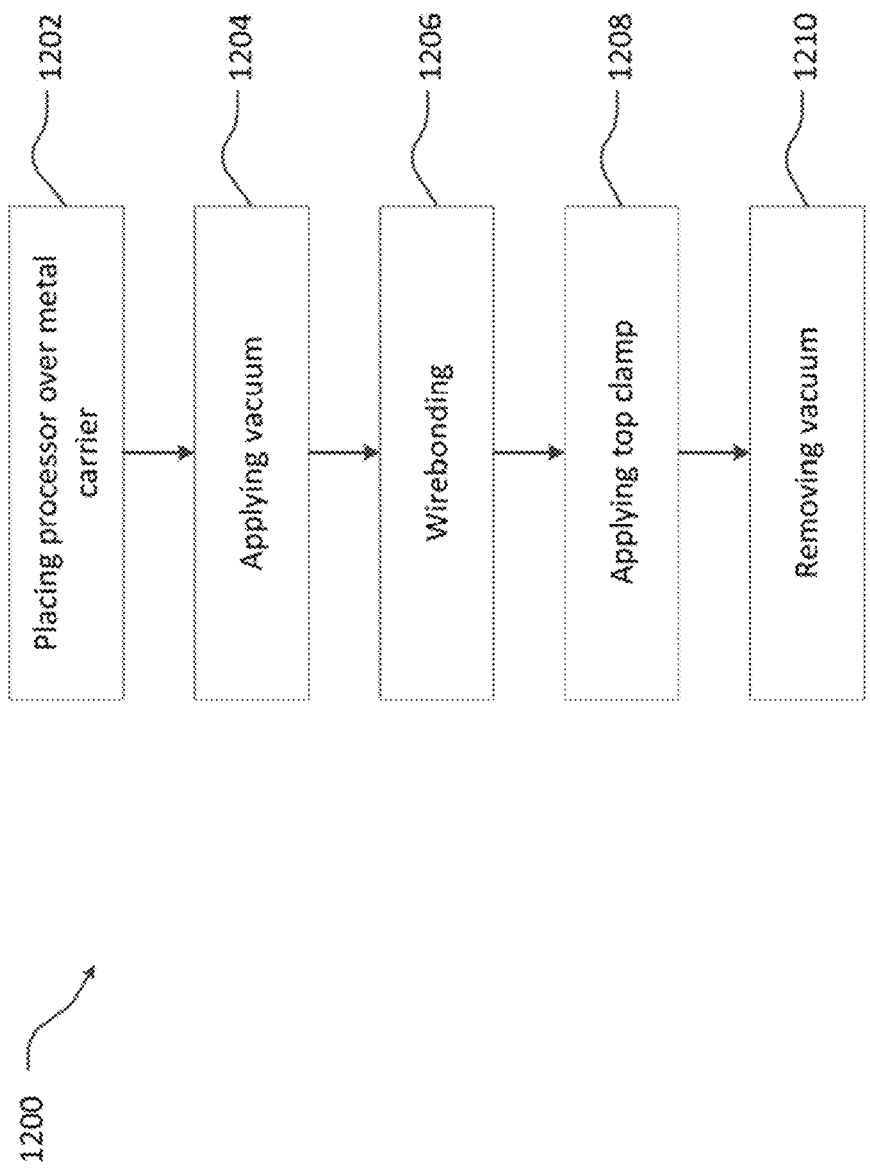
FIG. 12 is a flow diagram showing a method of wire-bonding a superconductive device to a printed circuit board and thermally coupling the superconductive device to a metal carrier, according to at least one illustrated implementation.

FIG. 12 is a flow diagram illustrating an example method 1200 of wirebonding a superconductive device to a printed circuit board and thermally coupling the superconductive device to a metal carrier. A superconductive device can include a superconducting processor such as a quantum processor.

Method 1200 includes five acts 1202-1210, though those skilled in the art will appreciate that in alternative embodiments certain acts may be omitted and/or additional acts may be added. Those skilled in the art will appreciate that the order of the acts is shown for exemplary purposes only and may change in alternative embodiments. Method 1200 is described with reference to apparatus 1000 of FIG. 10.

At 1202, processor 1002 (FIG. 10) is placed over metal carrier 1006 having through-hole 1010. The center of processor 1002 is approximately aligned with through-hole 1010. PCB 1004 comprising a cavity for processor 1002 is placed over metal carrier 1006. A side clamp 1014 can be used to hold PCB 1004 over metal carrier 1006.

At 1204, a vacuum is applied to the underside of the processor 1002 through the through-hole 1010. The vacuum will hold processor 1002 in place from the underside, thus allowing work such as wirebonding to be performed on the top side of the processor.

At 1206, processor 1002 is wirebonded to PCB 1004. As described previously, the vacuum helps to keep processor 1002 in place during wirebonding and reduce stress on the wirebonds after wirebonding.

At 1208, top clamp 1018 is applied over the top of processor 1002. After wirebonding is complete, the space over processor 1002 can be utilized without interfering with wirebonding. Top clamp 1018 can be in direct contact with the processor active area and can be made of gold-plated copper, sapphire, or a layer of parylene.

At 1210, the vacuum can be removed, and processor 1002 can continue to be held in place by top clamp 1018. Top clamp 1018 reduces stress on the wirebonds and helps achieve thermalization.

Figure 13:
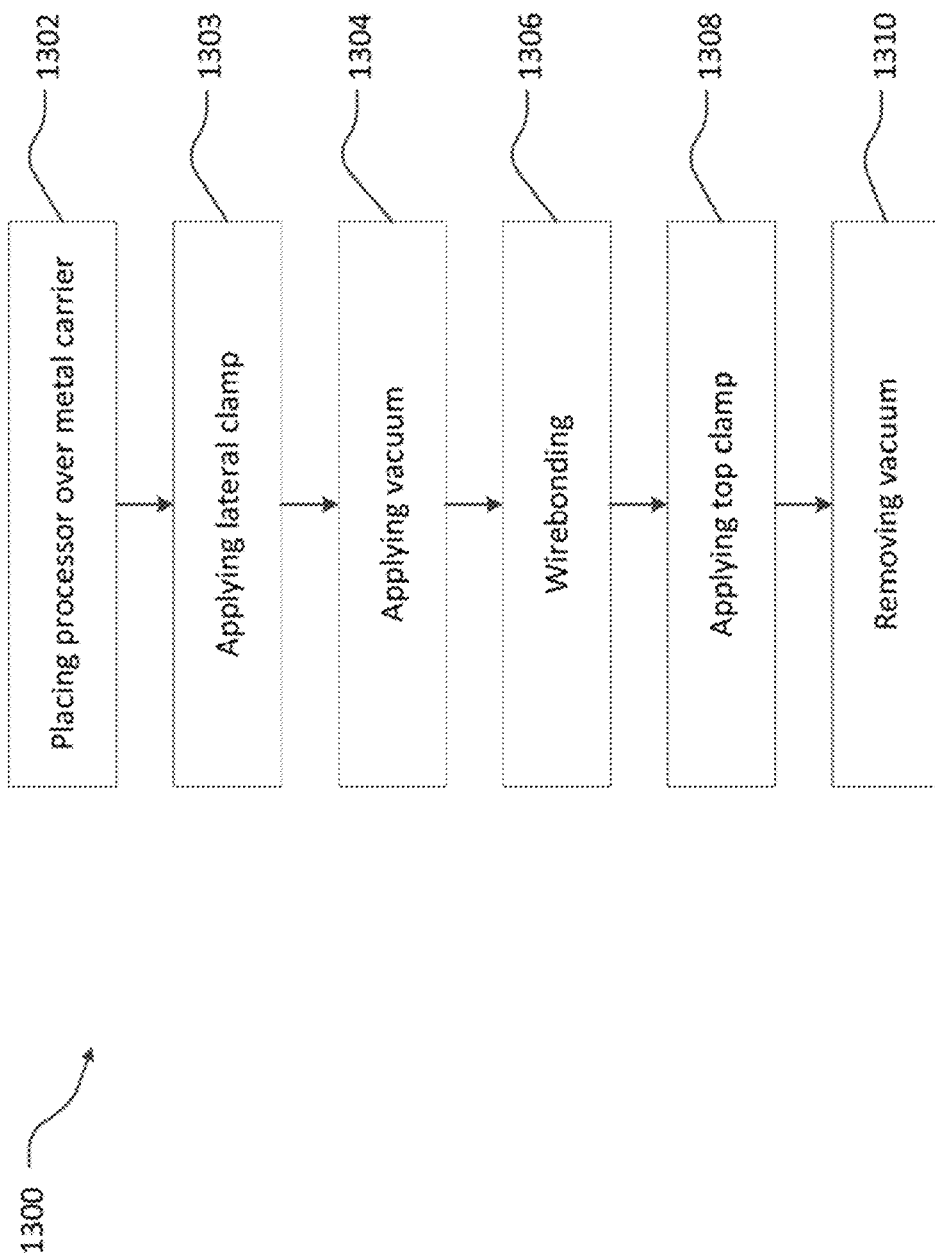
FIG. 13 is a flow diagram showing a method of wire-bonding a superconductive device to a printed circuit board and thermally coupling the superconductive device to a metal carrier, according to at least another illustrated implementation.

FIG. 13 shows another exemplary method 1300 of wirebonding a superconductive device to a printed circuit board and thermally coupling the superconductive device to a metal carrier. Method 1300 includes six acts 1302-1310, though those skilled in the art will appreciate that in alternative embodiments certain acts may be omitted and/or additional acts may be added. Those skilled in the art will appreciate that the order of the acts is shown for exemplary purposes only and may change in alternative embodiments. Method 1300 is described with reference to apparatus 1000 of FIG. 10.

At 1302, processor 1002 (FIG. 10) is placed over metal carrier 1006 having through-hole 1010, as described with reference to 1202 of method 1200.

At 1303, a lateral clamp is applied to the processor. A lateral clamp can be fabricated into PCB 1004 as a spring clamp, for example, as shown in FIG. 11A or FIG. 11B. A lateral clamp can be a corner spring clamp such as corner spring clamp 1102 of FIG. 11A or a spring side clamp such as spring side clamp 1108 of FIG. 11B.

At 1304 a vacuum is applied via the through-hole 1010, as described with reference to 1204 of method 1200.

At 1306, processor 1002 is wirebonded, and, at 1308, top clamp 1018 is applied directly over the top surface of processor 1002, as described with reference to 1206 and 1208 of method 1200, respectively.

At 1310, the vacuum is removed, as described with reference to 1210 of method 1200.

As described above, heat can be extracted from a processor by gold-plating the underside of the processor and placing the underside in thermal contact with a metal surface acting as a metal thermalizing carrier. In any implementation, the metal thermalizing carrier can, for example, be copper.

As described above, differences in thermal expansion between the processor substrate and the metal carrier can cause the processor to crack when cooled to cryogenic temperatures, unless the processor is able to contract relative to the metal surface against which it is being held. Securing the processor to the metal surface using varnish or glue can result in damage to the processor and a risk of cracking.

FIG. 14A shows an exemplary thermalization structure 1400a according to the present systems, methods, and apparatus. Thermalization structure 1400a comprises a processor 1402 and a metal carrier 1404, the substrate of processor 1402 placed on top of metal carrier 1404.

The metal carrier 1404 can, for instance, take the form of a metal plate, for example a copper plate. The metal plate 1404 may, for instance, be a non-superconducting or non-magnetic metal plate to reduce thermal resistivity at metal carrier 1404. Metal carrier 1404 comprises a recess 1406 located approximately centrally on metal carrier 1404 and dimensioned to be smaller than processor 1402.

A post 1408 is located approximately centrally in recess 1406. In any of the implementations (e.g., apparatus 1400a of FIG. 14A), post 1408 comprises the same material as the rest of metal carrier 1404. Recess 1406 can, for example, be milled around post 1408. Alternatively, in any of the implementations, post 1408 comprises a different material than the rest of metal carrier (e.g., a non-magnetic metal post).

Surface 1410 of metal carrier 1404 can be in direct contact with the underside of processor 1402. Surface 1410 can be a surface to which heat can be dissipated from processor 1402. Another surface through which heat can be dissipated from processor 1402 is post 1408 and adhesive layer 1412.

A top of post 1408 can be lower in height than surface 1410 of metal carrier 1404. A layer of adhesive 1412 can be placed on post 1408, the adhesive layer 1412 having sufficient thickness that the underside of processor 1402 is in contact with layer 1412. The force holding the underside of processor 1402 to metal carrier 1404 is partly dependent on the thermal expansion (contraction) of the adhesive and can depend on the thickness of adhesive layer 1412. The adhesive layer 1412 can, for example, comprise or consist of a silver epoxy. The Integral Thermal Expansion coefficient of silver epoxy is greater than the Integral Thermal Expansion coefficient of metals such as copper.

Thermalization structure 1400a uses the difference in the coefficients of thermal expansion between post 1408 and adhesive layer 1412 to pull the underside of processor 1402 and the surface of metal carrier 1404 together, so that one is held against the other to provide effective thermal contact and heat dissipation from processor 1402 to metal carrier 1404, while providing some freedom of lateral movement between processor 1402 and metal carrier 1404.

FIG. 14B another exemplary thermalization structure 1400b according to the present systems, methods, and apparatus. In FIG. 14B, post 1414 comprises a different material than the material of metal carrier 1404. For example, post 1414 can comprise a material with an Integral Thermal Expansion coefficient greater than the Integral Thermal Expansion coefficient of the material of metal carrier 1404. A top of post 1414 can have the same height as that of surface 1410, and can be in contact with the underside of processor 1402. Layer of adhesive 1412 can be placed around the rim of post 1414 to be in contact with the underside of processor 1402. Adhesive layer 1412 can, for example, extend to provide a thin interface between post 1414 and the underside of processor 1402.

In both apparatus 1400a and 1400b, surface 1410 can provide the low thermal resistance between processor 1402 and metal carrier 1404 to dissipate heat at processor 1402. The difference in thermal contraction pulls the underside of processor 1402 against metal carrier 1404. The force holding the underside of processor 1402 to metal carrier 1404 is partly dependent on the thermal expansion of post 1414 and can depend on the height of post 1414. Post 1414 can, for example, comprise or consist of brass or aluminum.

An advantage of apparatus 1400a and 1400b over other clamps or clamping approaches is that the apparatus allows for lateral movement of processor 1402 over surface 1410. The freedom to move laterally can reduce the risk of damage to processor 1402 during cooling.

Figure 15:
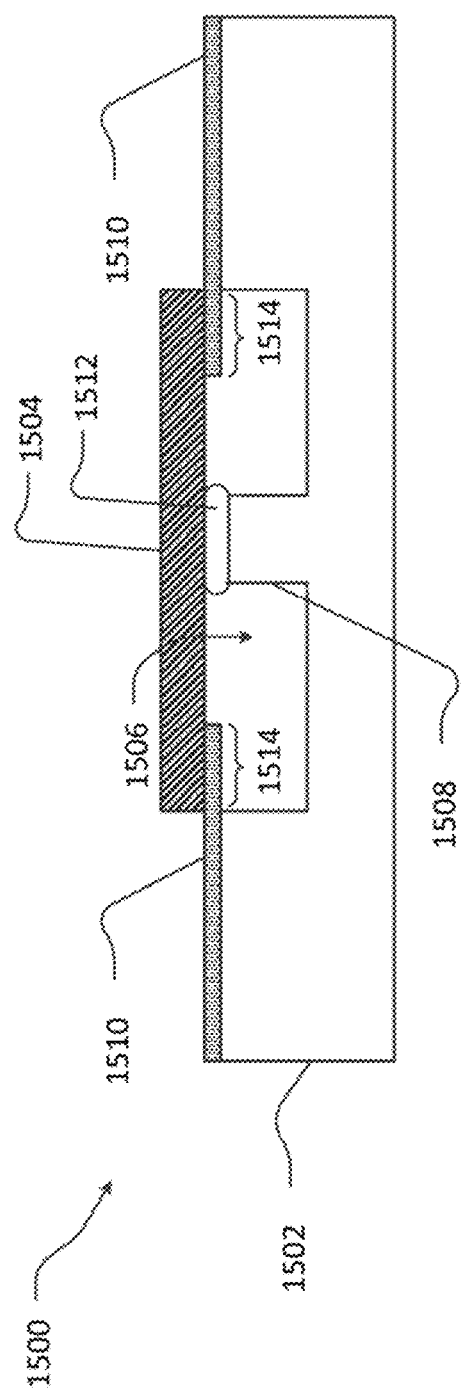
FIG. 15 is a cross-sectional view of a thermalization structure showing a metal shim between the metal carrier and the superconductive device.

FIG. 15 shows another exemplary thermalization structure 1500 including a metal shim between a metal carrier 1502 and a superconductive device 1504. Superconductive device 1504 can include a superconductive processor, in particular a quantum processor.

Thermalization structure 1500 comprises a recess 1506 having the same or approximately the same dimensions (in length and width) as superconductive device 1504. A post 1508 is located approximately centrally in recess 1506. In any of the implementations, post 1508 comprises the same material as the rest of metal carrier 1502. Alternatively, in any of the implementations, post 1508 comprises a different material than the rest of metal carrier (e.g., a non-magnetic metal post). Recess 1506 can, for example, be milled around post 1508.

Thermalization structure 1500 further comprises a metal shim 1510 that is placed over metal carrier 1502. A top of post 1508 can be lower in height than the top surface of metal shim 1510. A layer of adhesive 1512 can be placed on post 1508, the adhesive layer 1512 having sufficient thickness that the underside of superconductive device 1504 is in contact with layer 1512. Pulling pressure on the underside of superconductive device 1504 causes superconductive device 1504 to push on metal shim 1510. Metal shim 1510 has a surface 1514 that is not in contact with metal carrier 1502 and at least partially in contact with superconductive device 1504. Surface 1514 of metal shim 1510 can also experience a pressure pushing towards the base of recess 1506, producing a slight deformation of metal shim 1510. The deformation of metal shim 1510 can cause the upper surface of metal shim 1510 to be more parallel to the sides of superconductive device 1504, offering better thermal contact, and typically better thermalization.

As described in reference to FIGS. 14A and 14B, the difference in thermal contraction can provide pressure at surface 1514 to help dissipate heat from superconductive device 1504.

A larger surface 1410 may be advantageous to achieve a lower thermal resistivity between processor 1402 and metal carrier 1404. To provide a larger surface 1410 it may be advantageous to reduce the distance between surface 1410 and post 1408; however, the distance between surface 1410 and post 1408 must be such that the adhesive layer 1412 does not spread between surface 1410 and the underside of processor 1402.

Figure 16A:
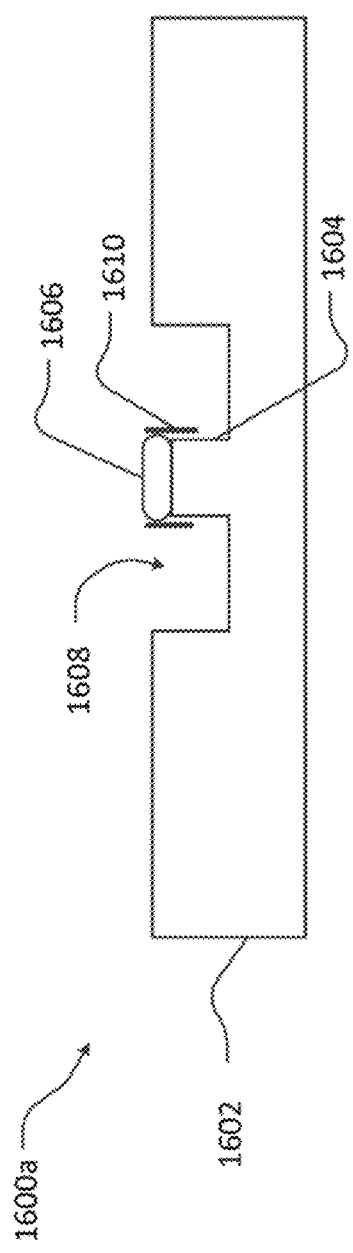
FIG. 16A is a cross-sectional view of a thermalization structure further comprising of a ring over the post.

FIG. 16A shows another exemplary thermalization structure 1600*a*. Thermalization structure 1600*a* comprises metal carrier 1602, post 1604, adhesive 1606, and a recess 1608. Thermalization structure 1600*a* further comprises a ring 1610 around post 1604 to prevent excess adhesive from spreading to the underside of the processor such as processor 1612 of FIG. 16B (not shown in FIG. 16A). As described before, it can be advantageous that the adhesive applied over the post does not spread excessively over the underside of the processor. In particular, it is desirable that the adhesive not spread between metal carrier 1602 and the processor.

To reduce the spread of adhesive to the underside of the processor, ring 1610 can be placed around post 1604 before applying adhesive 1606. Ring 1610 can be a plastic or elastomeric ring or a metal ring. Ring 1610, when positioned around post 1604, generally is allowed to protrude above the top of recess 1608.

Figure 16B:
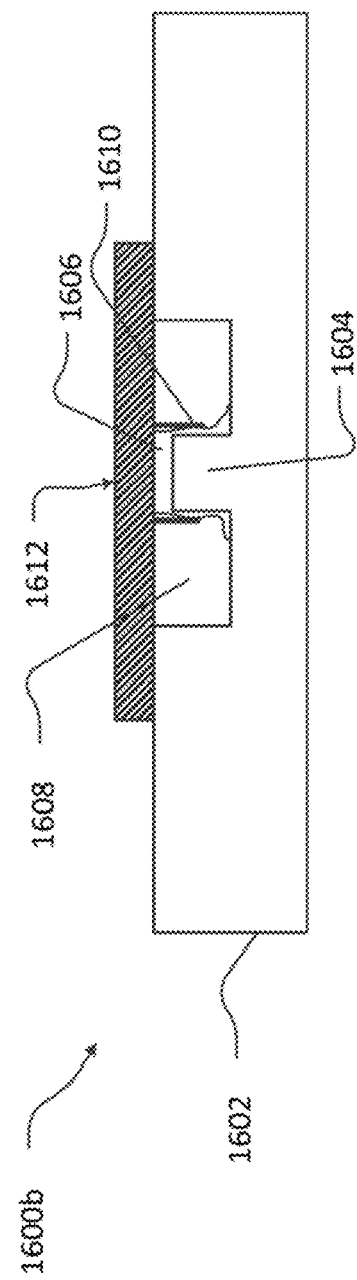
FIG. 16B is a cross-sectional view of a thermalization structure showing the effect of pushing the ring downward and allowing the adhesive to flow to the bottom of the recess.

FIG. 16B shows another exemplary thermalization structure 1600*b*. Thermalization structure 1600*b* comprises thermalization structure 1600*a* of FIG. 16A with a processor 1612 placed on the upper surface of metal carrier 1602. The upper end of ring 1610 can be higher than the upper surface of metal carrier 1602. When placed on the upper surface of metal carrier 1602, underside of processor 1612 can cause ring 1610 to move down towards the base of recess 1608. Processor 1612 can also cause adhesive 1606 to move down towards the base of recess 1608. The wall of ring 1610 can limit the spread of adhesive 1606 on the underside of processor 1612.

Excess adhesive can flow down towards the base of recess 1608, and pool at the base of post 1604. Post 1604 can, for example, include one or more grooves (not shown in FIGS. 16A and 16B) directing adhesive down towards the base of recess 1608.

Figure 17:
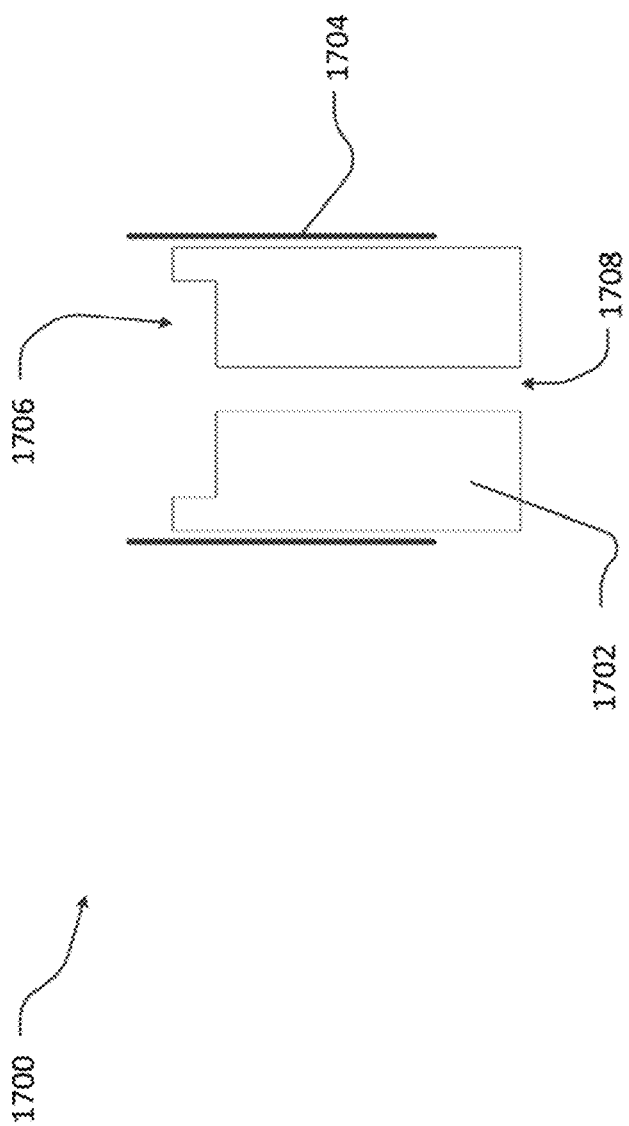
FIG. 17 is a cross-sectional view of a thermalization structure with a through-hole to evacuate excess adhesive.

FIG. 17 shows an exemplary apparatus 1700, comprising a post 1702 and a ring 1704. Post 1702 and ring 1704 can be used in place of post 1604 and ring 1610 of FIGS. 16A and 16B. Post 1702 comprises a recess 1706 at the upper end of the post. Recess 1706, in conjunction with ring 1704, can accommodate adhesive (not shown in FIG. 17) applied at the upper end of post 1702.

Post 1702 further comprises a through-hole 1708 to facilitate the evacuation of excess adhesive through the base of post 1702, and prevent adhesive from coming into contact with the underside of the processor other than at, or near, the upper end of post 1702.

The ring 1704 is optional in apparatus 1700 or any implementations incorporating the apparatus 1700.

Figure 18:
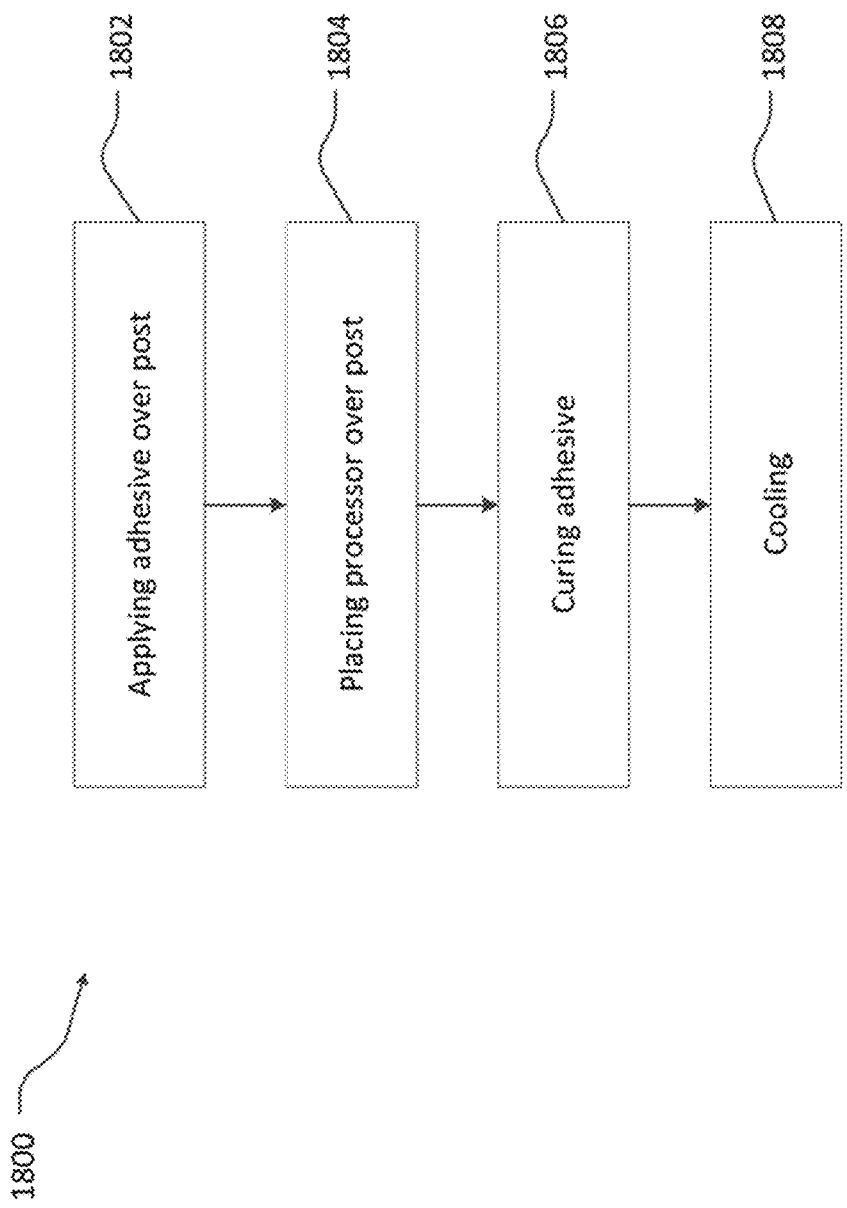
FIG. 18 is a flow diagram showing a method of thermally coupling a superconductive device to a metal carrier.

FIG. 18 shows an exemplary method of thermally coupling a superconductive device to a metal carrier in accordance with the present systems, methods, and apparatus. Method 1800 is described with reference to FIGS. 14, 15, 16, and 17. Method 1800 includes four acts 1802-1808, though those skilled in the art will appreciate that in alternative embodiments certain acts may be omitted and/or additional acts may be added. Those skilled in the art will appreciate that the order of the acts is shown for exemplary purposes only and may change in alternative embodiments.

At 1802, referring again to FIG. 14A, adhesive 1412 is applied to the upper end of post 1408 in recess 1406 of metal carrier 1404. The height of post 1408 can be the same as metal carrier 1404 or lower. Post 1408 can be manufactured from a material with a greater Integral Thermal Expansion coefficient than metal carrier 1404, or from the same material as metal carrier 1404. Adhesive 1412 is applied such the upper side of adhesive 1412 is approximately level with metal carrier 1404.

At 1804, processor 1402 is positioned to overlie post 1408, such that post 1408 is approximately centrally positioned with respect to the center of processor 1402. A ring (such as ring 1610 of FIG. 16A) can be placed around post 1408 to contain adhesive 1412.

At 1806, adhesive 1412 is cured, providing an initial pulling force because of shrinkage of the adhesive 1412 during curing.

At 1808, processor 1402 and metal carrier 1404 are cooled to a superconductive temperature. The result of acts 1806 and 1808 causes a pulling force holding the underside of processor 1402 in thermal contact with metal carrier 1404 to dissipate heat from the processor.

Other methods and apparatus may be employed to dissipate heat from a processor without the use of adhesive layers while at the same time reducing the risk of breakage of the processor due to differences in thermal contraction.

Figure 19:
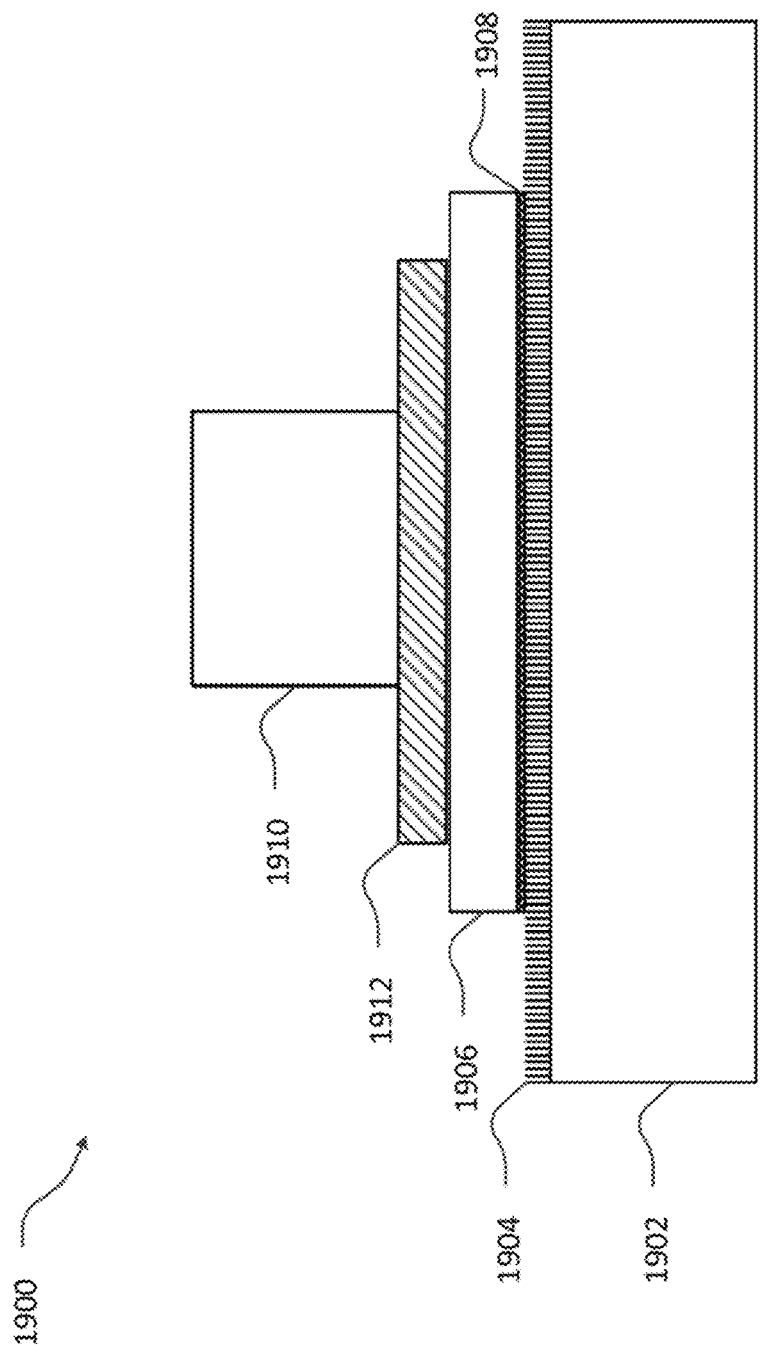
FIG. 19 is a cross-sectional view of a thermalization structure with metal flocking to provide freedom of lateral movement of a processor during cooling.

FIG. 19 is a cross-sectional view of a thermalization structure 1900 with metal flocking to provide freedom of lateral movement of a processor during cooling.

Thermalization structure 1900 comprises a metal carrier 1902, for example bulk piece of copper, with a metal flock 1904 on an upper surface. Metal flock 1904 may be bonded on metal carrier 1902 with an adhesive layer or it may be fabricated from metal carrier 1902 (i.e., the metal carrier 1902 and metal flock 1904 can be an integral single unitary piece).

A processor 1906 may be placed over metal carrier 1902 and in contact with metal flock 1904. A layer 1908 of gold plating may be present on an underside of processor 1906 to improve thermalization of processor 1906.

While in FIG. 19 metal carrier 1902 is shown as larger than processor 1906 a person skilled in the art will understand that metal carrier 1902 may have the same dimensions as, or be smaller than processor 1906. Similarly, metal flock 2404 may be present only under the area of processor 1906.

A clamp 1910 is placed above processor 1906 so that an underside 1912 of clamp 1910 is in direct contact with an upper surface of processor 1906. Underside 1912 is comprised of a material with an Integral Thermal Expansion coefficient that is sufficiently closed to the Integral Thermal Expansion coefficient of processor 1906 to ensure no lateral shift between clamp 1910 and processor 1906 during cooling. Metal carrier 1902 and processor 1906 will generally have different Integral Thermal Expansion coefficients, so that cooling to low or cryogenic temperatures will cause a lateral shift between metal carrier 1902 and processor 1906 caused by a difference in contraction. When clamp 1910 applies pressure over processor 1906, so that processor 1906 is firmly in place over metal carrier 1902, freedom of movement between processor 1906 and metal carrier 1902 is limited, potentially causing breakage of processor 1906. The addition of metal flock 1904 reduces the risk of breakage by allowing more freedom of lateral movement between processor 1906 and metal carrier 1902, while at the same time ensuring contact between processor 1906 and a metal surface (metal flock 1904) to provide heat dissipation.

Shielding

The various embodiments described herein provide systems and methods for achieving low magnetic field gradients over a particular area or volume.

A passive technique for reducing magnetic fields within an environment is to enclose the environment with a shield formed of a material having high magnetic permeability. Such shields are preferably cylindrical in geometry with at least one open end providing access to the enclosed volume. Exemplary materials that are appropriate for this purpose include nickel-alloys of high magnetic permeability (e.g., with a maximum permeability typically in the range of 50,000 to 1,000,000) or any other material with high permeability and are known in the art. For the purposes of the present systems and methods, the term "high magnetic permeability" is used to describe a material with a maximum magnetic permeability on the order of 50,000 or more.

The performance of a magnetic shield may be significantly enhanced by degaussing. Degaussing is a process by which a residual magnetism within a material is reduced, or "wiped." The material forming a magnetic shield typically exhibits some residual magnetism which can be reduced by, for example, wrapping a coil of wire around the shield and applying a periodic waveform of gradually decreasing amplitude through the coil. The present systems and methods describe improvements to established degaussing techniques.

It is to be noted that Gaussian techniques still leave a residual magnetic field on the shield, in the order of a few nT. In addition, it is desirable for magnetic shields to operate in environment with high magnetic fields or near other equipment that can be magnetic or produce magnetic fields. To decrease the field further, a possible solution is to increase the number of shields by adding more layers of ferromagnetic material. However, the increased number of layers will increase the weight and size of the shielding apparatus, thus rendering it more impractical. Also, in areas where a magnetic shield needs to operate in conjunction with a cryogenic system to maintain low temperatures, adding layers of shield material will increase heat capacity, increasing cooling and thermocycling time accordingly.

The present systems, methods and apparatus describe techniques for reducing the residual magnetic field of magnetic shields. To increase the shielding effect, a magnetic shield can be manufactured with two types of materials, one type of material forming an inner layer, and another type of material forming an outer layer surrounding the inner layer.

FIGS. 20A and 20B show an exemplary magnetic shield 2000. Magnetic shield 2000 has cylindrical tubular geometry; however, one skilled in the art will understand that another tubular geometry may be employed to provide magnetic shielding, e.g., tube with an oval, rectangular, square, hexagonal or octagonal profile or cross section.

Magnetic shield 2000 has an inner layer 2002 made from a material with high magnetic permeability. Inner layer 2002 can, for example, be manufactured from ferromagnetic foil comprising, for example, a magnetic alloy with high permeability. Inner layer 2002 can be annealed by heating inner layer 2002 above its Curie temperature.

An outer layer 2004 is placed around inner layer 2002 (e.g., radially outward thereof). Outer layer 2004 can, for example, be made from materials with high saturation field. For the purposes of the present systems and methods, the term "high saturation field" is used to describe a material with a magnetic saturation field on the order of 1.2 T or more. Using a material with high saturation field can help to reduce the number of layers needed to provide a desired magnetic shielding effect. Reducing the number of layers can, in turn, reduce the heat capacity and thermalization of the entire shield. High saturation fields can typically be between 1.2 Tesla and 1.55 Tesla.

The combination of inner layer 2002 and outer layer 2004 can help to achieve a lower magnetic field inside magnetic shield 2000. The combination of inner layer 2002 and outer layer 2004 can also help magnetic shield 2000 to operate effectively in a higher ambient magnetic field.

Magnetic shield 2000, as shown in FIGS. 20A and 20B comprises only one inner layer 2002 and one outer layer 2004. A person skilled in the art will appreciate that additional inner and/or outer layers can be employed to further reduce the magnetic field inside magnetic shield 2000.

To increase the shielding factor, inner layer 2002 and outer layer 2004 can be arranged as concentric multilayers. Layers can be spaced with a dielectric, for example epoxy, to increase permeability. In addition, where magnetic shield 2000 is operated at low or cryogenic temperatures, layers can be spaced with a mixture of dielectric, for example epoxy, and copper powder to provide better thermalization of the inner layers 2002 and outer layer 2004. Magnetic shield 2000 may include an end cap and a base, the end cap and the based positioned at opposite ends of a longitudinal axis of magnetic shield 2000.

FIG. 20C is a cross-sectional view of magnetic shield 2000 showing trilayer 2004 in between inner layer 2002 and outer layer 2004. Trilayer 2006 is comprised of non-magnetic metal 2008 in between two layers of dielectric 2010.

Magnetic shield 2000 can be used in environments with low temperatures, for example superconductive temperatures. Magnetic shield 2000 can, for example, be used to shield a superconductive device, such as a superconductive processor and a quantum processor. Magnetic shield 2000 can have a high degree of thermalization to protect the superconductive device.

A non-magnetic highly conductive metal 2008 can be placed between layers in magnetic shield 2000. For example, a non-magnetic highly conductive metal such as copper foil can be placed between inner layer 2002 and outer layer 2004 of magnetic shield 2000. A dielectric 2010, such as epoxy, can provide spacing between inner layer 2002 and outer layer 2004 of magnetic shield 2000 and non-magnetic metal 2008 to form a trilayer 2006.

As described above, magnetic shield 2000 can have a cylindrical tubular geometry comprising a cylindrical tubular body and a flat base. A person skilled in the art will appreciate that it is desirable for the junction between the cylindrical tubular body and the flat base to be magnetically sealed to reduce the effect of an external field penetrating the magnetic shield.

Current fabrication methods can make it difficult to create complex forms of ferromagnetic film for magnetic shield 2000, such as to follow sharp changes in contour. Accordingly, the junction of the cylindrical body and the flat base can be formed with a smaller number of layers than the number of layers used to form the cylindrical body of magnetic shield 2000. If the junction of the cylindrical body and the flat base has fewer layers, the junction can be thinner, and can saturate at a lower external magnetic field than other areas of the shield. In other words, the junction of the cylindrical body and the flat base of magnetic shield 2000 can be a weak area through which an external magnetic field can penetrate.

FIG. 21 shows an exemplary magnetic shield 2100. Magnetic shield 2100 comprises a cylindrical body 2102 and a flat base 2104. As described above, it can be desirable to provide additional magnetic sealing at the junction between cylindrical body 2102 and flat base 2104.

One approach to providing additional magnetic sealing places a cornerpiece 2106 at the junction between cylindrical body 2102 and flat base 2104. For a cylindrical shield, cornerpiece 2106 circles the perimeter of flat base 2104.

Cornerpiece 2106 can be fabricated with ferromagnetic material and used to provide additional magnetic sealing from external fields by increasing the magnetic coupling between cylindrical body 2102 and flat base 2104.

The material of cornerpiece 2106 can be made by mixing a binding material, for example epoxy, with ferromagnetic pieces. The ferromagnetic pieces can be fabricated by cutting small fragments of ferromagnetic materials. Alternatively, strips of ferromagnetic material can be etched. A benefit of etching is that it can reduce the mechanical and thermal stress on the material that can degrade the magnetic properties of the material. The mixture of epoxy and ferromagnetic material can be added to shield 2100, as illustrated in FIG. 21, to form cornerpiece 2106.

FIGS. 22A and 22B show another exemplary magnetic shield 2200. Magnetic shield 2200 comprises a cylindrical tubular body 2202 and a flat base 2204.

Magnetic shield 2200 further comprises a shielding skirt 2206 that extends below flat base 2204. Shielding skirt 2206 can be fabricated as an extension of cylindrical tubular body 2202 with no junction between cylindrical body 2202 and shielding skirt 2206.

As mentioned before, another tubular geometry (e.g., elliptical, hexagonal, octagonal, square, rectangular) can also be utilized to provide magnetic shielding.

FIG. 22C illustrates an effect of using magnetic shield 2200 to reduce the amount of external magnetic field (dark shaded area in FIG. 22C) on the inside of body 2202. The addition of shielding skirt 2206 reduces the amount of external magnetic field that can penetrate the junction between flat base 2204 and body 2202, therefore reducing the effect of this weak area.

To avoid weak joints in the geometry of a shield, the design of the shield may be adjusted so that the shield can be fabricated with U-shape pieces of ferromagnetic material. In this design the shield base is fabricated as part of the sides of the shield, therefore not as a separate piece that needs to be attached to the sides. In some implementations, the U-shaped pieces can take the form of a plurality of distinct U-shaped pieces of a nanocrystalline material, for example each comprised of a plurality of layers of a nanocrystalline amorphous iron-based material. The distinct U-shaped pieces of a nanocrystalline material can, for instance, each be comprised of a respective laminate of a plurality of layers of a nanocrystalline amorphous iron-based material in a polyethylene terephthalate (PET). In some implementations, the plurality of distinct U-shaped pieces of a nanocrystalline material are each comprised of a laminate of a plurality of layers of a nanocrystalline amorphous iron-based material in a polyethylene terephthalate (PET) loaded with a copper powder. In some implementations, the laminate may be formed of 10 to 30 layers of nanocrystalline material. The laminate can, for example take the form of a tape or pieces of a tape, which can advantageously be wrapped into desired shapes or geometries. In one implementation, the tape has a thickness of 15 micrometers to 20 micrometers. The U-shaped pieces can each be formed from a single strip or a single piece of a laminate strip, with a first bend and a second bend each of which extend laterally across a longitudinal axis of the strip. As previously mentioned the U-shape pieces can optionally be arrayed about a base to form a tubular shell, closed at one end, for example a copper base. An end cap can be formed from the same type or similar materials in a same or similar fashion, and fitted to the tubular shell to close of the other end thereof. The tubular shell can comprise an outer shield or an inner shield. An identical or similar tubular shell, with a larger or smaller diameter can be fashioned using identical or similar materials in an identical or similar fashion, sized to either receive the other tubular shell or to be received by the other tubular shell. Thus, nested tubular shells with closed ends can be formed from the materials and approach described herein. While denominated as closed ends, one or more ends or end caps can include one or more passages to provide wiring into an interior of the tubular shields from an exterior thereof. One or more of the shields can include a thermalization path, for example via a copper shell. Additionally or alternatively, one or more of the shields may include a first formulation of an unsintered high permeability powder, e.g., ferrite powder, in the cavity formed thereby, which remains unsintered throughout use and which can be replaced with other formulations of unsintered high permeability powder at any desired time, the other formulations different in at least one respect (e.g., type of materials, percentage of materials) than first formulation.

FIG. 23A is a schematic design of a component 2300a that can be used to fabricated a magnetic shield. Component 2300 has a largely rectangular shape, bent so as to form U-shape having a base 2302 and two sides 2504a and 2504b (collectively, 2504), and is comprised of an amorphous ferromagnetic material that provides magnetic shielding when employed as part of a magnetic shielding system. A magnetic shield fabricated with a number of components 2300a reduce the weakness of the joint between a shield base and shield sides, therefore reducing the magnitude of external magnetic field that may penetrated inside a magnetic shield. In addition, a magnetic shield fabricated with a number of components 2300a is more uniform in the thickness of material and therefore can be more uniformly degaussed.

FIG. 23B is a schematic design of a prism shield 2300b fabricated with three components 2300a for reducing weak joints and providing a uniform thickness of ferromagnetic material.

Prism shield 2300b has a hexagonal base 2306 that can be fabricated from the same ferromagnetic material as component 2300a. Three U-shaped components 2300a-1, 2300a-2 and 2300a-3 are arranged over the optional base 2306 and each rotated with respect to the another to form the sides of a prism as shown in FIG. 23B. For example, component 2300a-1 is rotated with respect to components 2300a-2 and 2300a-3 so that component 2300a-1 does not overlap any area of components 2300a-2 and 2300a-3 on the side of prism shield 2300b.

Additional layers of ferromagnetic material (not shown in FIG. 23B) may be wrapped around the sides of prism shield 2300b to seal components 2300a-1 through 2300a-3 and/or around the base of prism shield 2300b.

Degaussing of prism shield 2300b may be implemented as described in U.S. Pat. Nos. 8,441,330 and 9,465,401 or each component 2300a and the base may be degaussed with a dedicated degaussing coil.

Prism shield 2300b has a hollow interior that may accommodate electronics or components, for example a quantum processor, that need to be shielded from an external magnetic field. To seal the environment to be shielded, a cap 2308 may be mounted over the top opening of prism shield 2300b. The cap may be fabricated in a similar way as described above, with a base and three components 2300a, of a size fitted to cover the opening of prism shield 2300b. The cap may be bolted or otherwise fastened to the sides of prism 2300b to allow the cap to be removed when needed to access the hollow inside of prism shield 2300b. A through-hole 2310 in cap 2308 may allow for the passage of wires or other electronic components to communicatively couple with the interior of prism shield 2300b.

While in FIG. 23B prism shield 2300b is shown as having an hexagonal base and six sides formed by three components 2300a, a person skilled in the art will understand that prism shield may have a base of another shape and a different numbers of components 2300a forming the sides. For example, in any implementations prism shield 2300b may be fabricated with a rectangular base, two U-shaped components 2300a forming the sides. A cap of the same shape can be formed in a similar manner, from a rectangular base, two U-shaped components. A similar approach can be employed to form a prism shield having 2×n sides or facets from a number n U-shaped components, either with or without a separate base, where n is a positive integer. Likewise, a similar approach can be employed to form a cap or end cap for the 2×n-faceted prism shield.

A known approach to reduce magnetic field within a volume of interest is to wrap multiple layers of a degaussed shielding material around the volume. An example of material commonly used for shielding is a mu-metal (i.e., μ-metal, e.g., a nickel-iron soft magnetic alloy with a very high permeability). The layers of degaussed shielding material redirect external magnetic field lines through a path of least reluctance around the volume of interest. Such shields may be used, for example, to shield a processor from external magnetic field, including fields generated by other electronic component and/or the Earth's magnetic field. Degaussing techniques for magnetic shields, for example via use of one or more degaussing coils wrapped around or about a shield, or otherwise positioned in proximity to the shield, are discussed in U.S. Pat. Nos. 8,441,330 and 9,465,401. The shield may be one of two or more shields, for instance a first tubular shield that receives or is received by a second tubular shield. Such can include a thermalization path (e.g., copper shell), with or without a high permeability material (e.g., unsintered packed high permeability powder for instance a ferrite powder such as MnZn powder or NiZn powder, or an amorphous cobalt powder) therebetween or therein. Shape transitions in the geometry of the shell may be advantageously avoided, for instance alongside edges (e.g., along a length) or proximate the ends (e.g., between side walls and end caps).

In many cases degaussing the field distribution in a magnetic material so that that domains are randomized and, therefore, will not contribute a significant remnant field, is difficult. Thus, there may be regions within the magnetic material that have ordered domains; these domains will contribute a remnant field. Despite offering a low reluctance path for external field lines to follow and redirect around the volume of interest, the ordered domains in some regions of the magnetic material will act as a source and contribute a magnetic field. While known methods of degaussing and magnetic field compensation may attenuate or remove uniform fields within a volume, the fields produced by these ordered domains will produce a non-uniform field. Thus there is the need to reduce or eliminate non-uniform fields within a volume of interest left after degaussing a magnetic shield.

Figure 24:
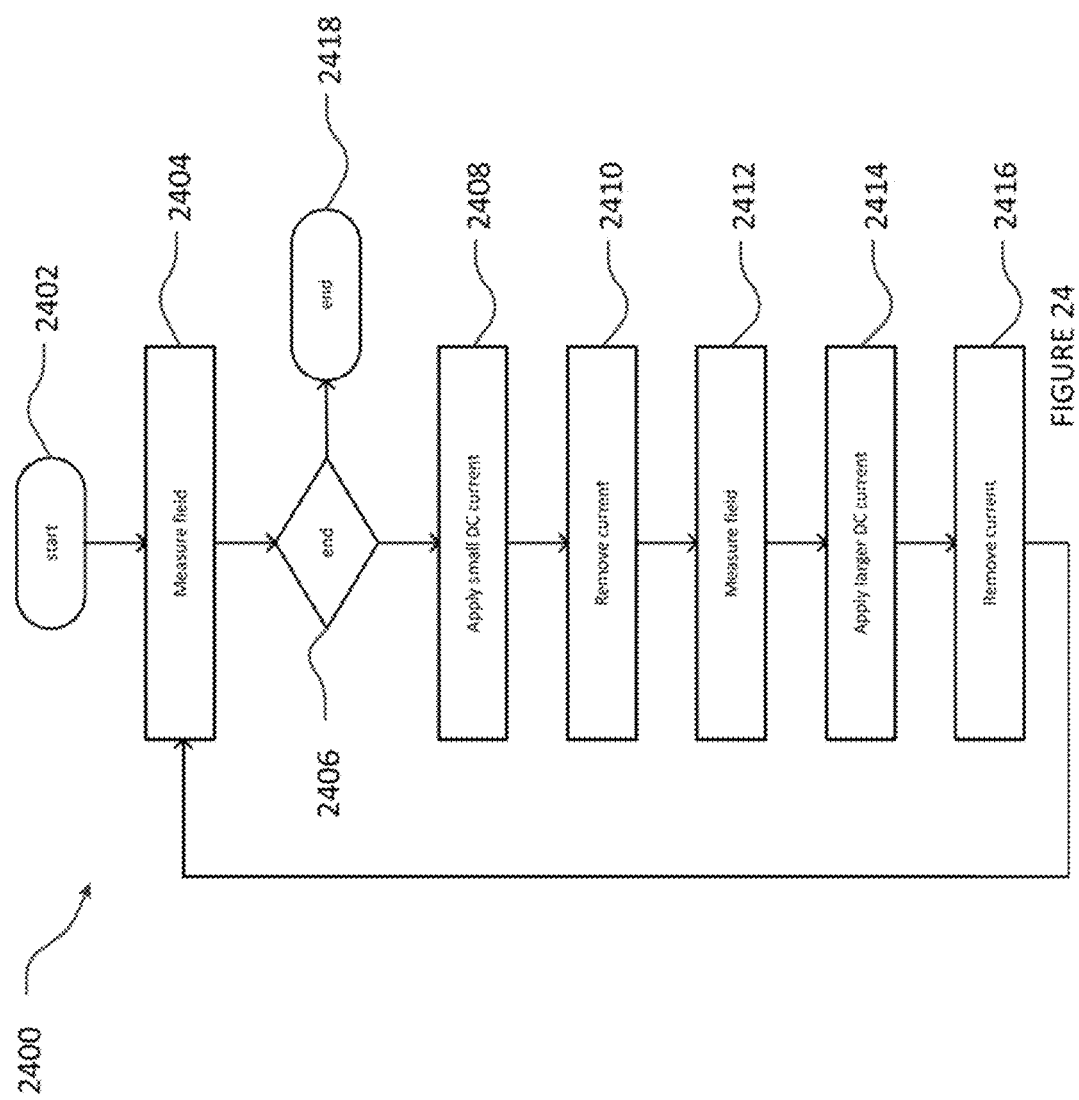
FIG. 24 is a flow chart of a method for reducing non-uniform fields in a degaussed shielding material.

FIG. 24 is a flow chart of a method 2400 for reducing non-uniform fields in a degaussed shielding material. Degaussing coils surrounding a μ-metal shield can be used to favorably order magnetic domains within the material to counteract the remnant fields left behind following imperfect degaussing.

Following degaussing of a magnetic shield, for example an inner layer of a μ-metal shield, the remnant field value can be measured and a small DC current may be applied through the degaussing coils. After removing the current, the field can be measured again and a higher DC current may be applied again through the coils. Repeated applications of DC currents and field measurement will progressively order domains in the direction of the applied field, beginning first with reversible domain wall growth followed by irreversible boundary growth and finally domain rotation. This favorable ordering of domains will act in opposition to the unfavorably ordered domains left behind after degaussing, resulting in a reduction of the net field and lower field gradient across the volume of interest.

Method 2400 comprises acts 2402 through 2418; though those skilled in the art will appreciate that in alternative embodiments certain acts may be omitted and/or additional acts may be added. Those skilled in the art will appreciate that the order of the acts is shown for exemplary purposes only and may change in alternative embodiments.

Method 2400 starts at 2402, for example after completing a degaussing procedure.

At 2404 the remnant field is measured in a position of interest within the volume of the shield via a magnetic field sensor. A position of interest may be, for example, the location of a sample holder with a processor inside the shield; however, other areas of the shield volume may be measured as appropriate. Method 2400 may employ a digital processor in communicative coupling with the degaussing coils and other electronic components to measure the field.

At 2406 method 2400 determines whether an exit condition has been met via a digital processor. An exit condition may be the measure of remnant field lower than a threshold value. If the exit condition has been met, control passes to 2408, otherwise to 2418.

At 2408 the digital processor applies a small DC current through the degaussing coils. Depending on the degaussing coils configurations, the applied DC current may be in the order of a few mA. The digital processor may apply the DC current through one or more of the degaussing coils.

At 2410 the digital processor removes the DC current by interrupting the flow of DC current through the degaussing coils.

At 2412 method 2400 measures the remnant field in the same position of interest as 2404, via the digital processor.

At 2414 the digital processor applies a DC current through the degaussing coils. The current applied at 2414 is higher than the current at 2408. For example, the current applied at 2414 may be in the order of tens of mA. The digital processor may apply the DC current through one or more of the degaussing coils.

At 2416 the digital processor removes the DC current by interrupting the flow of DC current through the degaussing coils. After 2416 control passes back to 2404.

At 2418 method 2400 terminates.

As mentioned before, in certain applications, for example in applications that use an analog processor, such as a quantum processor, it is important to achieve a consistently low magnetic field and low field gradients to avoid perturbing the processor.

Multiple factor can contribute to the difficulty in obtaining a consistently low field and low gradients, for example abrupt geometrical changes in the magnetic shield shape, in particular between shield sides and a shield base, often caused by flat sheets of materials, and/or intentionally engineered grain orientations from material vendors and/or large saturation indices of the materials. For magnetic shielding it is desirable to use materials with a low saturation index and high permeability; however, such materials commonly have impractical mechanical properties such as brittleness and poor thermal properties which can lead to high internal stress during cool-down for operation at low or cryogenic temperatures.

To reduce the occurrence of areas in the magnetic shield with non-uniform field and/or high gradient, a hybrid powder may be used as part of the building materials for magnetic shields.

FIGS. 25A and 25B are cross-sectional views of a magnetic shield with a hybrid powder.

FIG. 25A is a cross-sectional view of a magnetic shielding system 2500a that uses a hybrid powder 2502 deposited on the inside of magnetic shield 2504. Where magnetic shield 2504 is comprised of multiple layers of materials or of an outer layer and inner layer, hybrid powder 2502 may be deposited on the inside of the innermost layer.

Hybrid powder 2502 may be a combination of powders of materials with high permeability and low saturation index, for example ferrite powder (MnZn, NiZn) and/or amorphous cobalt. A copper shell 2506 on the inside of magnetic shield 2504 serves both as a support for hybrid powder 2502 and a thermalization pathway. Copper shell 2506 may have an inner layer in contact with magnetic shield 2404 and an outer layer (not shown in FIG. 25A) to contain hybrid powder 2502.

FIG. 25B is a cross-sectional view of a magnetic shielding system 2500b that uses a hybrid powder 2502 deposited on the inside of magnetic shield 2504 with a shell 2508 comprised of pliable material, for example plastic.

Shell 2508 serves as a support for hybrid powder 2502 while allowing greater flexibility to follow the geometry of magnetic shield 2504. The shell 2508 can, for example, be employed as in inner shield described elsewhere herein.

Where magnetic shield 2504 is comprised of multiple layers of materials, hybrid powder 2502 may be deposited on the inside of the innermost layer.

Both shielding systems 2500a and 2500b reduce the mechanical limitations imposed from using flat sheets of building material so that any geometry may be used for building magnetic shields to obtain uniform low magnetic field, including in areas of transition between a shield base and shield sides which are common sources of field non-uniformity. Thus, for example sharp edges may be avoided.

Both shielding systems 2500a and 2500b allow for the removal and substitution of hybrid powder 2502 with a new mixture if desired. Brittle materials and materials susceptible to plastic deformation due to thermal gradients may be used in shielding systems 2500a and 2500b as a result of the normalized displacement or strain of the material in hybrid powder 2502 being made up of many small displacements between neighbouring particles.

The thickness of hybrid powder 2502 may be determined from measurements of the background magnetic field left inside magnetic shield 2504.

After depositing hybrid powder 2502, shielding systems 2500a and 2500b may be vibrated while compressing the top of hybrid powder 2502 to increase powder density and reduce voids in the powder assembly.

Refrigeration

The various embodiments described herein provide systems, methods and apparatus for improving the performance of cryogenic refrigeration systems. Most specifically, the various embodiments described herein provide systems, methods and apparatus for improving the performance of dilution refrigeration systems.

Dilution refrigeration systems, in particular helium-3 ($^3$He)-helium-4 ($^4$He) systems, are known in the art and commonly used to achieve cryogenic temperatures. Such dilution refrigeration systems can employ vacuum chambers and vacuum pumps.

Such apparatus uses a standard type of vacuum flange, known as ISO standard. ISO type flanges come in two varieties, ISO-K and ISO-F, and are also well known in the art and commonly used. However, an ISO-K flange can only mate with another ISO-K flange and ISO-F flange can only mate with another ISO-F flange, although in some applications it can be desirable to be able to interface to both type of flanges.

An adapter can be fitted adapt an ISO-K type flange to an ISO-F type flange. However, adapters may not be used for all applications. An example of a case where flange adapters may not be used is turbo pumps.

Figure 26B:
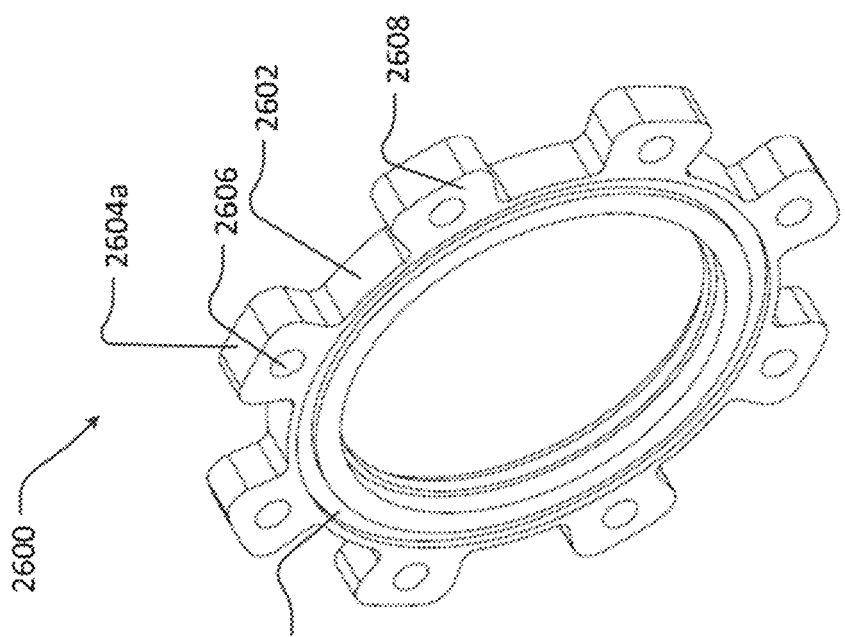
FIG. 26B is an isometric view of a hybrid flange to be used with ISO-K and ISO-F type flange.
Figure 26A:
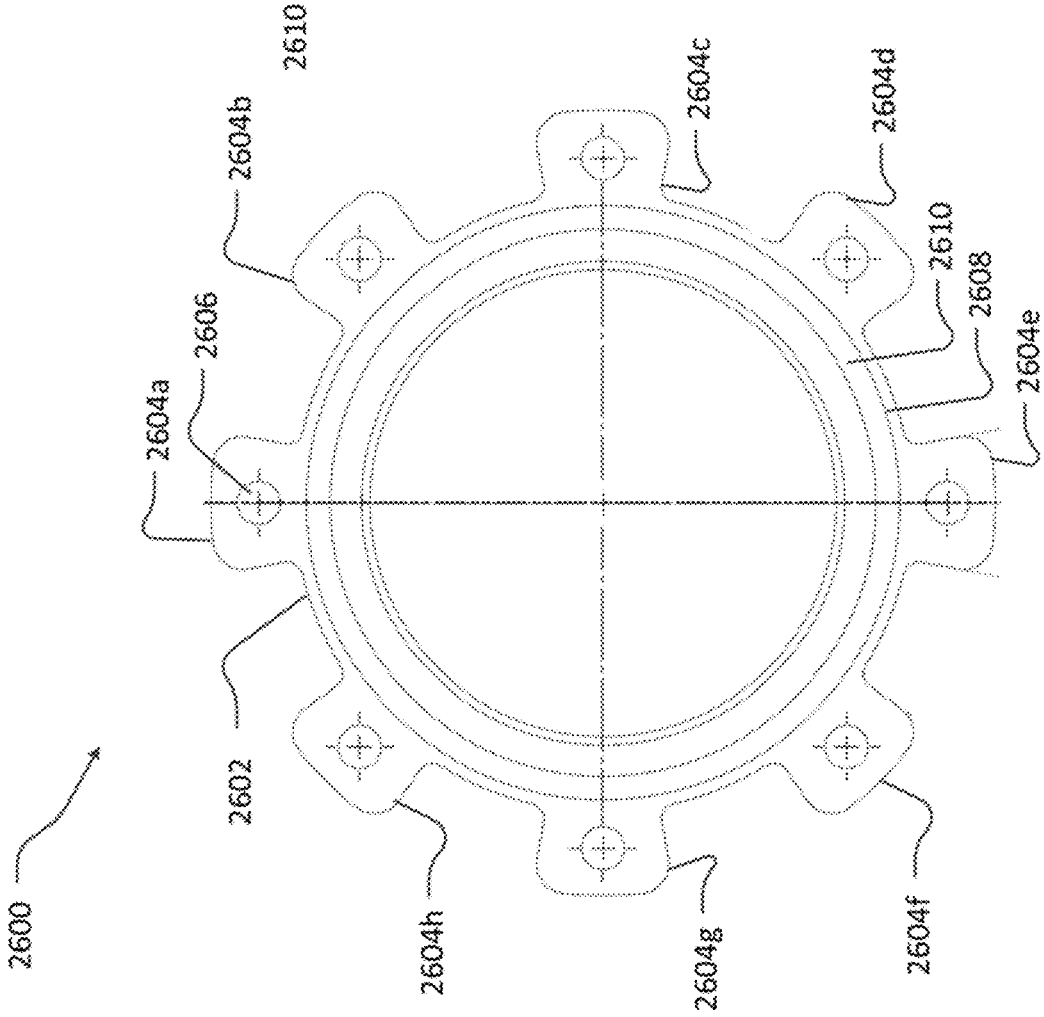
FIG. 26A is a schematic diagram of a hybrid flange to be used with ISO-K and ISO-F type flange.

FIGS. 26A, 26B and 26C show an exemplary hybrid flange 2600 that can be used to interface to both ISO-K and ISO-F type flanges.

Hybrid flange 2600 comprises a hollow cylindrical body 2602 and a number (e.g., eight) protrusions 2604a through 2604h (collectively 2604) that extend outwardly from cylindrical body 2602, spaced circumferentially around cylindrical body 2602. Each of protrusions 2604a through 2604h comprises a though-hole, such as through-hole 2606 (only one called out in FIG. 26A-26C) to accommodate a bolt of an ISO-F type flange. Through-holes 2606 extend generally parallel with a longitudinal axis of cylindrical body 2602 and a central or longitudinal passage thereof. First face 2608 of cylindrical body 2602 comprises a circular or annular grove 2610 designed to accommodate an ISO-K type claw clamp.

FIG. 26C shows a cross-section of cylindrical body 2602 with protrusions 2604a and 2604e extending outwardly from cylindrical body 2602. First face 2608 comprises circular or annular grove 2610 that can accommodate an ISO-K type claw clamp, while through-holes 2606 in each of protrusions 2604a through 2604h, respectively, are designed to fit bolts for an ISO-F type flange. Protrusions 2604b, 2604c, 2604d, 2604f, 2604g, 2604h and respective through-holes 2606 are not shown in FIG. 26C.

An advantage of hybrid flange 2600 is that it can be used to interface to both an ISO-K and an ISO-F flange, thereby simplifying vacuum pump apparatus, for example.

As mentioned before, dilution refrigeration systems are commonly used to achieve cryogenic temperatures and employ a variety of techniques to prevent plugging in a helium circuit caused by freezing of contaminants present in the helium circuit. In some applications, it can be desirable for a dilution refrigeration system to be capable of continuous operations for at least one year. For example, in applications of superconducting computing (such as superconducting quantum computation) where the computer processor is cooled by a dilution refrigerator, it can be desirable for the computer processor to remain cold (i.e., operational) for at least one year.

Conventional dilution refrigeration systems typically experience a break in continuous operations, such as a plugging event. Plugging events can occur more frequently than once per year. Conventional dilution refrigeration systems can rely on filters or "cold traps" to remove contaminants from the helium circuit. Some for techniques for removing contaminants from the helium circuit are described in U.S. patent application Ser. Nos. 14/086,697 and 14/284,138.

While current systems, methods and apparatus of condensation traps can remove some contaminants from the helium circuit, other contaminants such as hydrogen ($H_2$) can remain in circulation in the dilution refrigeration system. Hydrogen can freeze at a higher temperature than helium and can therefore cause blockages in the helium circuit of a dilution refrigerator. Other techniques commonly use rely on chemical and physical absorption; however, after the absorbent becomes saturated with hydrogen, the efficiency of the removal process starts to decay.

The present system, methods, and apparatus describe the use of hydrogen getters or filters in conjunction with dilution refrigeration systems to optimize the removal of contaminants from dilution refrigerators.

Hydrogen getters remove unwanted hydrogen in vacuum applications and gas purification systems. Hydrogen getters typically contain reactive materials that remove hydrogen from a system either by chemical or physical absorption of gas molecules present in the system. An example of hydrogen getters that remove hydrogen by chemical absorption are palladium (Pd) getters.

FIG. 27A shows an exemplary refrigeration system 2700a comprising a dilution refrigerator 2702, a helium circuit 2704 and a hydrogen getter 2706. Hydrogen getter 2706 can be used to remove excess hydrogen from helium circuit 2704. Dilution refrigerator 2702 and hydrogen getter 2706 can be operated continuously. Refrigeration system 2700a further comprises tank 2708, valves 2710a, 2710b, and 2710c, and pump 2712. Pump 2712 can circulate helium through dilution refrigerator 2702 and hydrogen getter 2706.

In some applications, hydrogen getter 2706 can be used only as part of a scheduled maintenance activity, an upgrade of a refrigeration system, or for diagnostic purposes. In this case, hydrogen getter 2706 can be run when needed, rather than run continuously. In some applications, hydrogen getter 2706 would have a set of valves 2710d-2710f to allow helium circuit 2704 to bypass hydrogen getter 2706.

Hydrogen getter 2706 can, for example, be maintained at room temperature. When hydrogen getter 2706 is at room temperature system maintenance is easier than when hydrogen getter is at a cryogenic temperature. Alternatively, hydrogen getter 2706 can be maintained at a cryogenic temperature.

While FIG. 27A shows refrigeration system 2700a with only one hydrogen getter, a person skilled in the art will appreciate that it is possible to use more than one hydrogen getter. One or more hydrogen getter can be coupled in parallel to hydrogen getter 2706 with by-pass lines (not shown in FIG. 27A). In this configuration it is possible to use another hydrogen getter to operate refrigeration system 2700a while hydrogen getter 2706 is bypassed. Alternatively, or in addition, one or more hydrogen getters 2706 may be coupled in series in helium circuit 2704.

Alternatively, or in addition to the embodiments described above, inn other implementations at least one hydrogen 2706 may be integrated with dilution refrigerator 2702 and operating at cryogenic temperatures.

FIG. 27B shows an exemplary refrigeration system 2700b comprising a dilution refrigerator 2702, a helium circuit 2704 and a hydrogen getter 2706. Hydrogen getter 2706 can be positioned on a secondary line, in series with tank 2708, as shown in FIG. 27B, and its use can be regulated via valves 2710a, 2710b, and 2710c. In some applications, hydrogen getter 2706 can be operated continuously with dilution refrigerator 2702 while in other applications hydrogen getter 2706 can be used only as part of a scheduled maintenance activity, an upgrade of a refrigeration system, or for diagnostic purposes. In the latter case, hydrogen getter 2706 can be run when needed, rather than run continuously and may have a set of valves 2710d-2710f that allow hydrogen getter 2706 to be bypassed. Similarly to refrigeration system 2700a, refrigeration system 2700b can be operated with hydrogen getter 2706 at a room temperature or at a cryogenic temperature.

Similarly to refrigeration system 2700a, refrigeration system 2700b can operated with more than one hydrogen getter. One or more hydrogen getter can be coupled in parallel to hydrogen getter 2706 with by-pass lines (not shown in FIG. 27B) or in series.

Alternatively, or in addition to the embodiments described above, in other implementations at least one hydrogen getter 2706 may be integrated into tank 2708.

Isolation of a Processor

IO lines for analog processors, for example quantum processors, should provide sufficient bandwidth for high-speed processor operation while minimizing coupling to the external environment. Careful engineering can eliminate or reduce many electrical noise sources; however, blackbody radiation is particularly difficult to reduce or eliminate because any dissipative source coupled to a processor IO line will emit photons which then propagate to the processor. This radiation can perturb a processor resulting in calculation errors. This phenomenon is particularly evident in cases where the processor is located at low or cryogenic temperatures.

In a low-temperature processor, the readout portion of an operation cycle can usually tolerate higher levels of noise than the calculating portion of the operation cycle. Where the processor is an analog processor, for example a quantum processor, during the readout cycle the energy barriers of the device are kept high and are therefore less susceptive to noise. Similarly, during the programming cycle the processor can tolerate higher noise levels than during the calculation cycle.

A common approach to reduce blackbody radiation is to employ passive elements such as filters, attenuator, current dividers and/or lossy transmission lines. However, these elements do not have the ability to change the isolation of the processor in a time-dependent fashion and are usually designed to provide the necessary isolation at all times. As mentioned above, the programming and readout portions of an operation cycle require a much greater dynamic range and bandwidth from the processor IO than the during the calculation portion, so that passive elements used for processor isolation necessarily dissipate a large amount of energy at low temperatures resulting in cryostat heating.

High-speed, low-loss switches located at cryogenic temperatures can provide isolation to the processor in a time-dependent fashion. During the programming and readout portions of the operating cycle of a processor where the processor is at low or cryogenic temperatures, such a switch may allow signals to access room temperature electronics. During the calculation portion of a processor the switch may be either closed or turned to a matched resistive load at low temperature to isolate the processor and, therefore, limit the noise from blackbody radiation.

Where the switch employed to isolate the processor exhibits fast switching time between closed and open state any impact on the processor operation cycle is minimized. Similarly, where the switch is low-loss cryostat heating from the electronic signals during programming and readout time is minimized.

An example of a switch that may be used for dynamic isolation of a processor, in particular a quantum processor, is a semiconductor GaAs switch or a switch fabricated with superconducting materials.

High-speed, low-loss switches may be employed on any or all IO lines used for readout and programming of a processor.

Figure 28:
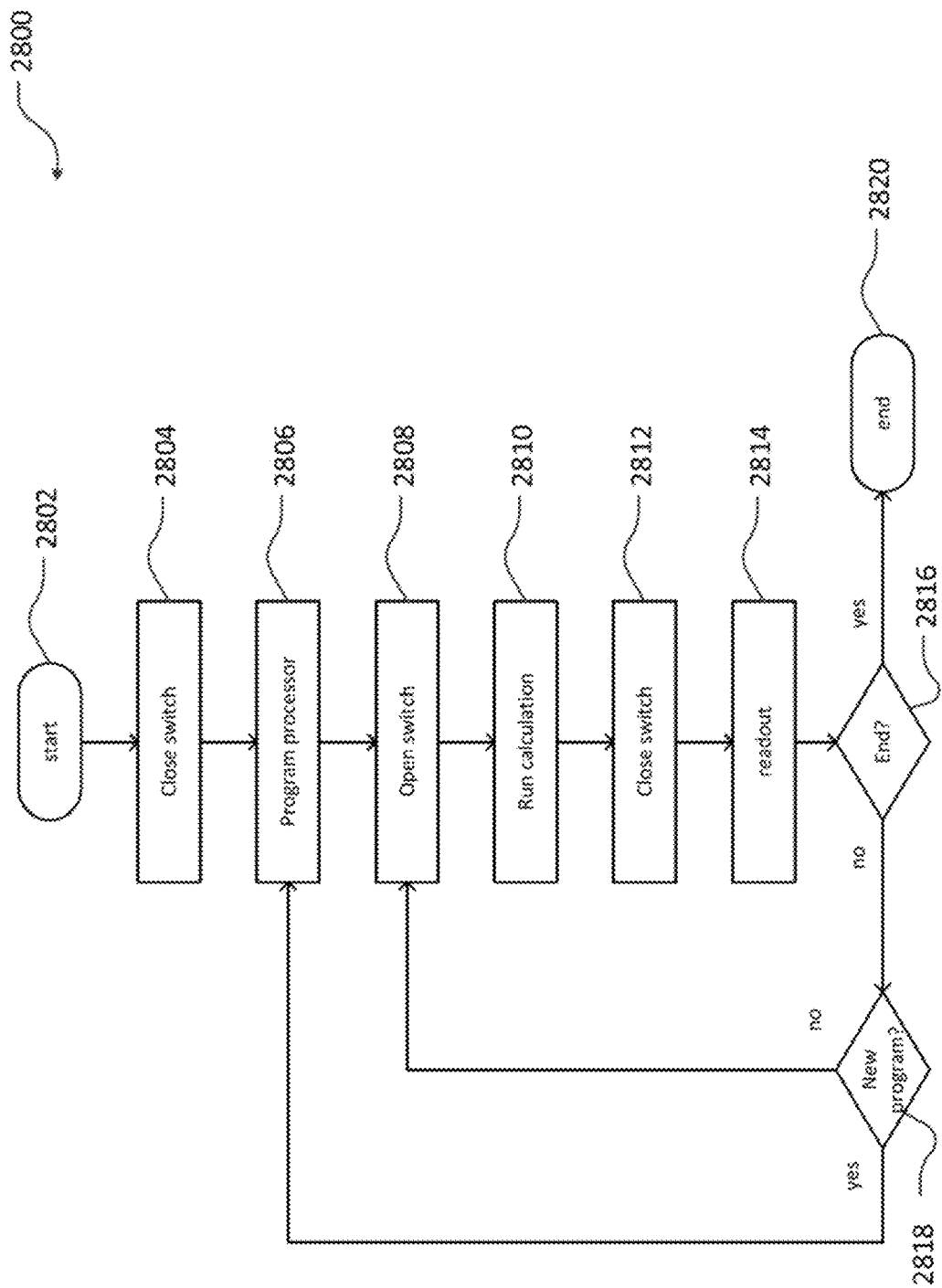
FIG. 28 is a flow chart of an example method for operating a processor using a dynamic isolating switch.

FIG. 28 is a flow chart of an example method 2800 for operating a processor, for example a quantum processor, using a dynamic isolating switch to isolate the processor. Method 2800 comprises acts 2802 through 2820; though those skilled in the art will appreciate that in alternative embodiments certain acts may be omitted and/or additional acts may be added. Those skilled in the art will appreciate that the order of the acts is shown for exemplary purposes only and may change in alternative embodiments.

Method 2800 start at 2802, for example in response to a call from another routine.

At 2804 the dynamic isolating switch will move in a position allowing electronics to access or pass signals to the processor. For example, the dynamic isolating switch may be in a closed position. The electronics may be at a higher temperature than the processor, for example room temperature. If the processor is not a programmable processor, act 2804 may be skipped.

At 2806 the processor is programmed. The dynamic isolating switch allows the propagation of electronic signals to the processor. If the processor is not a programmable processor, act 2806 is skipped.

At 2808 the dynamic isolating switch will move in a position to isolate the processor, so that no electronic signals may propagate to the processor. For example, the dynamic isolating switch may be in an open position.

At 2810 the processor will run the calculation according the programming operation at 2808. During 2810 the processor remains isolated from other electronic components.

At 2812 the dynamic isolating switch will move in a position allowing the electronics to access or pass signals to the processor. For example, the dynamic isolating switch may be in a closed position.

At 2814 the processor will send a result of the previous calculation, or readout, to the room temperature electronics.

At 2816 the processor will determine whether an exit condition has been met. An exit condition may be the completion of a predetermined number of calculations. If the exit condition has not been met, control passes to 2818, otherwise to 2820.

At 2818 the processor determines if a new program needs to be run. The processor may receive signals though the dynamic isolating switch indicating that a new program needs to be run. If a new program needs to be run, control passes to 2806 where the processor is programmed with a new program, otherwise control passes to 2808 where the dynamic isolating switch is opened to isolate the processor before running the same calculation again.

At 2820 method 2800 terminates, for example until it is invoked again.

Another source of noise to a processor is penetration of broad-band inference caused by direct (galvanic) electrical connection between room temperature electronics and a processor.

In some IO lines it is not necessary to have galvanic connections, for example in some readout and programming lines. An example of such readout and programming lines can be found in U.S. Pat. No. 8,854,074 and International (PCT) patent application No US2016/31885. In this case, noise may be reduced or eliminated using transformers to isolate a processor.

A transformer may isolate a processor by avoiding a galvanic connection between room-temperature electronics and a processor at low or cryogenic temperatures.

FIG. 29A through 29C are schematic diagrams of a noise insulating transformer for use to reduce or eliminate high frequency noise at non-galvanic connections between room-temperature electronics and processors operating at low or cryogenic temperature, where the noise insulating transformer is at low or cryogenic temperatures. For the purpose of this specification and the appended claims, high frequency is intended to represent frequencies in the GHz range. In one implementation, the room-temperature electronics may be in an environment with temperature at or higher than 15 degrees Celsius and the processor may be in an environment at or below 0 (zero) degrees Celsius.

FIG. 29A is a schematic diagram of a noise insulating transformer 2900a with a toroidal core 2902. In noise insulating transformer 2900a a primary coil 2904 is wound from one side of toroidal core 2902 and a secondary coil 2906 is wound from an opposite side of toroidal core 2902. Toroidal core 2902 may be a ferrite toroidal core or an amorphous metal core, so that there is no mutual inductance between primary coil 2904 and secondary coil 2906.

Noise insulating transformer 2900a may be small enough to be employed as part of a tubular filter structure, for example the tubular filter structure disclosed in U.S. Pat. No. 9,231,181.

To further reduce noise, a high conductive shielding wall may be placed between primary coil 2904 and secondary coil 2906. Alternatively, or in addition, the volume surrounding noise insulating transformer 2900a may be filled with a metal power-epoxy mixture and/or coated with an absorptive layer, for example a CuNi layer.

In any embodiments, one or more noise insulating transformer 2900a may be electrically coupled in series.

FIG. 29B is a schematic diagram of a noise insulating transformer 2900b with a toroidal core 2902. In noise insulating transformer 2900b, a primary coil 2904 is wound all around toroidal core 2902 and a secondary coil 2906 is wound all around toroidal core 2902 such that both primary and secondary coils have the same number of turns around toroidal core 2902. Toroidal core 2902 may be a ferrite toroidal core.

Noise insulating transformer 2900b may be small enough to be employed as part of a tubular filter structure, for example the tubular filter structure disclosed in U.S. Pat. No. 9,231,181.

To further reduce noise the volume surrounding noise insulating transformer 2900b may be filled with a metal power-epoxy mixture and/or coated with an absorptive layer, for example a CuNi layer.

In any embodiments, one or more noise insulating transformer 2900b may be electrically coupled in series.

While toroidal core 2902, may be more useful to suppress noise for frequency lines below 10 GHz approximately, at higher frequencies it may be more efficient to eliminate toroidal core 2902 and instead use air transmission.

FIG. 29C is a schematic diagram of a noise insulating transformer 2900c with an air core. Noise insulating transformer has a primary coil 2904 and a secondary coil 2906 separated from primary coil 2904 by air.

Similarly to noise insulating transformer 2900a and 2900b, noise insulating transformer may be small enough to be employed as part of a tubular filter structure, for example the tubular filter structure disclosed in U.S. Pat. No. 9,231,181.

To further reduce noise, a high conductive shielding wall may be placed between primary coil 2904 and secondary coil 2906. Alternatively, or in addition, the volume surrounding noise insulating transformer 2900c may be filled with a metal power-epoxy mixture and/or coated with an absorptive layer, for example a CuNi layer.

In any embodiments, one or more noise insulating transformer 2900c may be electrically coupled in series.

In apparatus where a superconducting devices need to be cooled below a critical temperature a thermal gradient may appear. This effect is particularly evident if the superconductive device contains or is surrounded by part made from high conductive metals, such as copper. Thermal gradients lead to thermal current and, therefore, thermal electromagnetic fields in the environment of the superconductive device. A thermal electromagnetic field may lead to undesired fluxon trapped into the superconductive device, which in turn may contribute to noise in the operation of the superconductive device. Where the superconductive device is a superconductive quantum processor, this noise may contribute to operational errors.

An approach for reducing the electromagnetic field in the environment of a superconductive device is to slow down the cooling rate of the superconductive device and the area surrounding it. For example, in one implementation where a superconducting device is comprised of more than one layer of superconducting materials having different critical temperatures, the cooling range is reduced from the highest critical temperature to the lowest critical temperature of the superconductive device. Where the superconductive device has a range of critical temperatures, the cooling rate is kept slow in all the range of critical temperatures.

However, this approach leads to increased cooling time for a superconductive device and a slow cooling speed may not be practical and/or accurate to measure.

An alternative approach to reduce thermal currents involves modifying the support of the superconductive device. Where the superconductive device is a processor, the support may be a sample holder.

FIG. 30A through 30F are schematic diagrams of example sample holders for use with a processor to reduce thermal current through cuts on the sample holders.

In all embodiments, cuts are placed under the area of a processor so that thermal currents forming on the surface of the sample holder will move around the area of the processor. This way, independent on the direction of the thermal currents, the influence of the thermal currents on the processor area is reduced.

FIG. 30A is a schematic diagram of an example sample holder 3000a with a cut 3002 (e.g., slot or slots, hole or holes, aperture or apertures) in the shape of a cross. The approximate shape of a processor 3004 is shown in a dashed line for illustration purposes only to show an approximate mounting area of the processor. Cut 3002 is positioned at the region where processor 3004 is placed and has size approximately equal to the size of processor 3004. In one implementation, cut 3002 extends over the size of the processor by more than 2 millimeters.

FIG. 30B is a schematic diagram of an example sample holder 3000b with a cut 3006 in the shape of a saltire cross. The approximate shape of a processor 3004 is shown in a dashed line for illustration purposes only to show an approximate mounting area of the processor. Cut 3006 is positioned at the region where processor 3004 is placed and has size approximately equal to the size of processor 3004.

FIG. 30C is a schematic diagram of an example sample holder 3000c with a cut 3008 in the shape of a Korsun cross. The approximate shape of a processor 3004 is shown in a dashed line for illustration purposes only to show an approximate mounting area of the processor. Cut 3008 is positioned at the region where processor 3004 is placed and has size approximately equal to the size of processor 3004. Cut 3008 further thermally isolates processor 3004 by channeling thermal currents farther away from the area of processor 3004 than cuts 3002 and/or 3006. In one implementation, cut 3008 covers over 90% of the perimeter of the mounting area.

FIG. 30D is a schematic diagram of an example sample holder 3000d with a cut 3010 in the shape of a Korsun cross rotated 45 degrees with respect of cut 3008 of FIG. 30C. The approximate shape of a processor 3004 is shown in a dashed line for illustration purposes only to show an approximate mounting area of the processor. Cut 3010 is positioned at the region where processor 3004 is placed and has size approximately equal to the size of processor 3004. Cut 3010 further thermally isolates processor 3004 by channeling thermal currents farther away from the area of processor 3004 than cuts 3002 and/or 3006.

FIG. 30E is a schematic diagram of an example sample holder 3000e with a cut 3012 in the shape of a double triangle. The approximate shape of processor 3004 is shown in a dashed line for illustration purposes only to show an approximate mounting area of the processor. Cut 3012 is positioned at the region where processor 3004 is placed and has size approximately equal to the size of processor 3004.

Figure 30F:
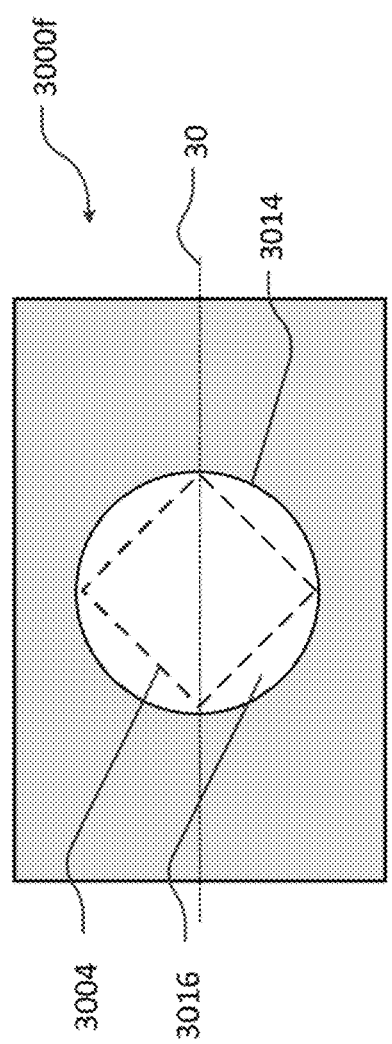
FIG. 30F is a schematic diagram of an example sample holder for use with a processor to reduce thermal current through a circle-shaped cut.

FIG. 30F is a schematic diagram of an example sample holder 3000f with a cut 3014 in the shape of a circle. The approximate shape of a processor 3004 is shown in a dashed line for illustration purposes only to show an approximate mounting area of the processor. Cut 3014 is positioned at the region where processor 3004 is placed and has size approximately equal to the size of processor 3004. Cut 3014 may be larger than processor 3004.

A wafer 3016 is placed on an underside of sample holder 3000*f* so that wafer 3016 is aligned with cut 3014 and processor 3004 will be in contact with wafer 3014.

Figure 30G:
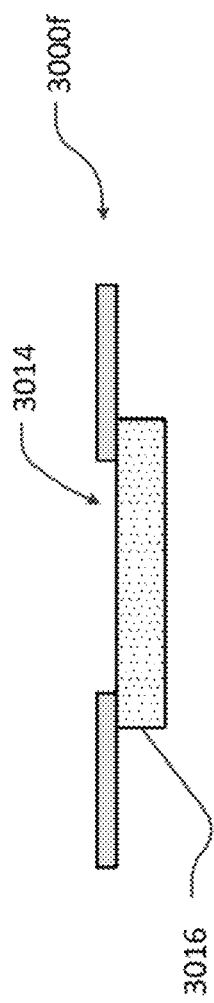
FIG. 30G is a cross-sectional view of the sample holder of FIG. 30F, showing the respective positions of a wafer under a circle-shaped cut.

FIG. 30G is cross-sectional view of sample holder 3000*f* of FIG. 30F along line 30, showing the respective positions of wafer 3016 and cut 3014. Wafer 3016 is larger than cut 3014 so that an upper side of wafer 3016 is in contact with an underside sample holder 3000*f* to provide thermalization.

Wafer 3016 may be a Silicon (Si) crystal or sapphire crystal. Wafer 3016 is comprised of a material that will provide good thermalization of processor 3004.

Additionally, or in alternative, a layer of Gold may be present on an underside of processor 3004 so that the gold layer is in thermal contact with wafer 3016.

Additionally, or in alternative, a layer of Tungsten (W) (not shown in FIG. 30E-30F) may be present between an underside of sample holder 3000*f* and wafer 3016 to provide additional thermalization capabilities.

FIGS. 31A and 31B are schematic diagrams of a sample holder 3100 for use in reducing thermal currents at a processor.

FIG. 31A shows an underside 3102 of sample holder 3100 while FIG. 31B shows an upper side 3108 of sample holder 3100 comprising processor 3110, side clamp 3112. The side clamp 3112 secures the processor 3110 to the sample holder 3100 via one or more fasteners (e.g., bolts, nuts, screws), for example via a first pair of fasteners 3104, 3106 and a second pair of fasteners 3114, 3116.

The fasteners 3104, 3106 of the first pair of fasteners diametrically opposed to one another across the mounting area, and the fasteners 3114, 3116 of the second pair of fasteners diametrically opposed to one another across the mounting area. A line that passes through the fasteners 3114, 3116 of the second pair of fasteners is perpendicular to a line that passes through the fasteners 3104, 3106 of the first pair of fasteners. Fasteners 3114 and 3116 hold a first and a second, opposite, side of side clamp 3112 firmly in place over sample holder 3100.

The side clamp 3112 includes a first pair of arms 3122*a*, 3122*c*, and a second pair of arms 3122*b*, 3122*d*, the arms 3122*a*, 3122*c* of the first pair of arms diametrically opposed to one another across the mounting area, and the arms 3122*b*, 3122*d* of the second pair of arms diametrically opposed to one another across the mounting area. The arms 3122*a*, 3122*c* of the first pair of arms are parallel to one another and the arms 3122*b*, 3122*d* of the second pair of arms are parallel to one another. Thus, the side clamp 3112 has two pairs of opposed arms 3122*a*-3122*d* and four vertices (where arms intersect) arranged in a parallelogram shape, and has four holes, a first pair of the holes which reside on a first line that extends between a first pair of the vertices, and a second pair of the holes which reside on a second line that extends between a second pair of the vertices, and each of the holes sized and dimensioned to receive a respective one of the fasteners.

The sample holder 3100 may include a substrate, for example a circuit board, and includes a first slot 3124*a* and a second slot 3124*b*, the first slot 3124*a* which follows a first crenulated path and the second slot 3124*b* which follows a second crenulated path. For example, the sample holder 3100 includes a first pair of overlapping portions which form the first slot 3124*a* and which each has a passage therein, and a second pair of overlapping portions which form the second slot 3124*b* which each has a passage therein, and wherein a first one of the fasteners passes through the passages of the first pair of overlapping portions, and a second one of the fasteners passes through the passages of the second pair of overlapping portions.

The sample holder 3100 includes a plurality of contacts positioned about the mounting area. A plurality of wire bonds can communicatively couple the processor chip to respective ones of the contacts of circuit board. The processor chip can, for example, take the form of a quantum processor.

Sample holder 3100 may be used to reduce the influence of thermal current over processor 3110 by causing the same thermal current to flow in a plane above processor 3110 as below processor 3110. When the same current flows in a plane below and above processor 3110, the resulting magnetic field at processor 3110 is canceled. This can be achieved by adjusting the thermal resistance on four branches of the thermal current path.

Figure 32:
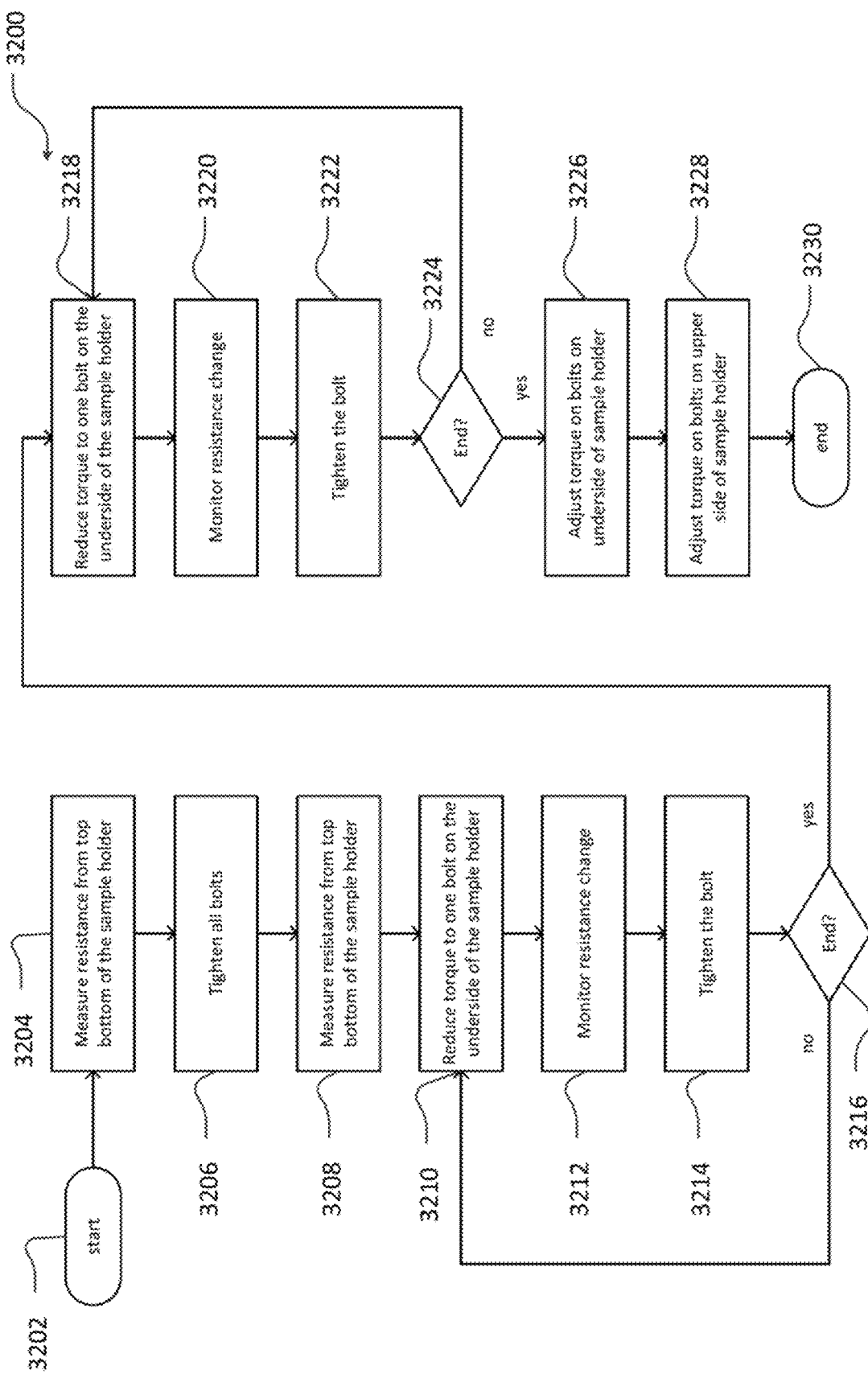
FIG. 32 is a flow chart of a method to reduce the influence of thermal current on a processor by measuring the thermal resistance on the plane above and below the processor and tightening bolts on the sample holder to balance the flow of thermal current.

FIG. 32 is a flow chart of a method 3200 to reduce the influence of thermal current on a processor by measuring the electrical resistance on the plane above and below the processor and tightening bolts on the sample holder to balance the flow of thermal current. Method 3200 may be routinely employed as part of an assembly or maintenance process where a processor needs to be cooled down to low or cryogenic temperatures.

Method 3200 includes acts 3202-3230, though those skilled in the art will appreciate that in alternative embodiments certain acts may be omitted and/or additional acts may be added. Those skilled in the art will appreciate that the order of the acts is shown for exemplary purposes only and may change in alternative embodiments. Method 3200 is described with reference to sample holder 3100 of FIGS. 31A and 31B.

Method 3200 starts at 3202, for example when assembling a system comprising a processor that needs to be cooled down at low or cryogenic temperatures.

At 3204 the electrical resistance from a first end of sample holder 3100 to an opposite end of sample holder 3100 is measured. For example, the electrical resistance may be measured from the top to the bottom of sample holder 3100 with reference to the plane of the page of FIG. 31B. A system of four-wires sensing can be used to accurately measure electrical resistance on sample holder 3100; however, other methods may be used.

At 3206 bolts 3104, 3106, 3114 and 3116 are tightened to achieve a preliminary torque. The preliminary torque may be determined based on the specification of sample holder 3100.

At 3208 the electrical resistance from the first to the second end of sample holder 3100 is measured.

Method 3200 then iterates over acts 3210 to 3216. At 3210 the torque on one of the bolts on underside 3102 of sample holder 3100 (e.g. bolt 3104) is reduced.

At 3212 the rate of change in electrical resistance with torque is monitored. The curve measured gives an estimate of the resistance at zero torque.

At 3214 the bolt (e.g. bolt 3104) is tightened again to the preliminary torque.

At 3216 an exit condition is assessed. The exit condition is the accurate measurement of rate of change in electrical resistance with torque for both bolts 3104 and 3106 on underside 3102 of sample holder 3100. If the rate of change has been measured for both bolts, control passes to 3218, otherwise to 3210 where the torque of the other bolt (e.g. bolt 3106) on underside 3102 of sample holder 3100 is reduced.

Method 3200 then iterates over acts 3218 to 3224. Act 3218 to 3224 are similar to acts 3210 to 3216 but refer to upper side 3108 of sample holder 3100. At 3218 the torque on one of the bolts on upper side 3108 of sample holder 3100 (e.g. bolt 3114) is reduced.

At 3220 the rate of change in electrical resistance with toque is monitored. The curve measured gives an estimate of the resistance at zero torque.

At 3222 the bolt (e.g. bolt 3114) is tightened again to the preliminary torque.

At 3224 an exit condition is assessed. The exit condition is the accurate measurement of rate of change in electrical resistance with torque for both bolts 3114 and 3116 on upper side 3108 of sample holder 3100. If the rate of change has been measured for both bots, control passes to 3226, otherwise to 3218 where the torque of the other bolt (e.g. bolt 3116) on upper side 3108 of sample holder 3100 is reduced.

At 3226 the torque on bolts 3104 and 3106 on underside 3102 of sample holder 3100 is adjusted so that reducing the torque on either bolt alone to zero torque would reduce the electrical conductance on sample holder 3100 by 20% to 30% of the fully torqued conductance. This balances the thermal current from the left direction versus the thermal current from the right direction with respect of the plane of the page of FIG. 31A.

At 3228 the torque on bolts 3114 and 3116 on upper side 3108 of sample holder 3100 is adjusted so that reducing the torque on either bolt alone to zero torque would reduce the electrical conductance on sample holder 3100 by 54% to 55% of the fully torqued conductance. This balances the thermal current on a plane above processor 3110 versus the thermal current on a plane below processor 3110.

Method 3200 terminates at 3230, until it is employed again for example as part of a maintenance schedule where processor 3110 is cooled down at low or cryogenic temperatures.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art.

The various embodiments described above can be combined to provide further embodiments. All of the U.S. patents, U.S. patent application publications, U.S. patent applications, International (PCT) patent applications referred to in this specification and/or listed in the Application Data Sheet including but not limited to U.S. Pat. Nos. 8,279,022; 8,441,329; U.S. patent application Ser. No. 14/086,697; U.S. patent application Ser. No. 14/284,138; U.S. Pat. Nos. 8,008,991; and 9,231,181 are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

I claim:

1. A method, comprising:
   causing a degaussing field to be applied to a first shield that provides a magnetic shielding to an environment;
   determining an initial measurement of a magnetic field in at least one location in the magnetically shielded environment by a control circuit, the initial measurement representative of the magnetic field in the at least one location in the magnetically shielded environment following application of the degaussing field to the first shield;
   after determining the initial measurement of the magnetic field in the at least one location in the magnetically shielded environment, iteratively from i=1 until at least one exit condition is reached,
      causing a direct current of an $i^{th}$ amperage to pass through at least one electrically conductive coil located about the first shield during an $i^{th}$ period of time, where the $i^{th}$ amperage is greater than a previous amperage, if any;
      after the direct current of the $i^{th}$ amperage passes through the at least one electrically conductive coil during the $i^{th}$ period of time, determining an $i^{th}$ measurement of the magnetic field in the at least one location in the magnetically shielded environment, the $i^{th}$ measurement representative of the magnetic field in the at least one location in the magnetically shielded environment following application of the direct current of the $i^{th}$ amperage and before application of the direct current of an $i^{th}+1$ amperage, if any; and
      determining whether the magnetic field in the at least one location in the magnetically shielded environment has reached a minimum, wherein the at least one exit condition corresponds to the determination that the magnetic field in the at least one location in the magnetically shielded environment has reached the minimum.

2. The method of claim 1 wherein determining whether the magnetic field in the at least one location in the magnetically shielded environment has reached the minimum includes determining whether a most current one of the measurements of the magnetic field in the at least one location in the magnetically shielded environment is larger than a previous one of the measurements of the magnetic field in the at least one location in the magnetically shielded environment.

3. The method of claim 1 wherein causing the direct current to pass through the at least one electrically conductive coil includes controlling operation of a current source.

4. The apparatus of method 1 wherein causing the direct current to pass through the at least one electrically conductive coil includes controlling a switch to electrically couple a current source to the at least one electrically conductive coil.

5. The method of claim 1 wherein causing theft degaussing field to be applied to the first shield that provides magnetic shielding to an environment includes causing the degaussing field to be applied to the first shield via the at least one electrically conductive coil.

6. The method of claim 1, further comprising:
   during each iteration, determining whether a maximum number of iterations has been reached, wherein the at least one exit condition corresponds to the determination that the maximum number of iterations has been reached.

* * * * *